US010876024B2

(12) United States Patent
Hung et al.

(10) Patent No.: US 10,876,024 B2
(45) Date of Patent: *Dec. 29, 2020

(54) HIGHLY THERMALLY CONDUCTIVE HEXAGONAL BORON NITRIDE/ALUMINA COMPOSITE MADE FROM COMMERCIAL HEXAGONAL BORON NITRIDE

(71) Applicant: United States of America as represented by the Administrator of NASA, Washington, DC (US)

(72) Inventors: Ching-Cheh Hung, Westlake, OH (US); Janet B. Hurst, Columbia Station, OH (US)

(73) Assignee: United States of America as Represented by the Administrator of National Aeronautics and Space Administration, Washington, DC (US)

( * ) Notice: Subject to any disclaimer, the term of this patent is extended or adjusted under 35 U.S.C. 154(b) by 409 days.

This patent is subject to a terminal disclaimer.

(21) Appl. No.: 15/724,849

(22) Filed: Oct. 4, 2017

(65) Prior Publication Data

US 2018/0094182 A1 Apr. 5, 2018
US 2019/0177592 A9 Jun. 13, 2019

Related U.S. Application Data

(63) Continuation-in-part of application No. 14/948,581, filed on Nov. 23, 2015, now Pat. No. 10,000,419, and
(Continued)

(51) Int. Cl.
*C09K 5/14* (2006.01)
*C04B 35/583* (2006.01)
(Continued)

(52) U.S. Cl.
CPC ............ *C09K 5/14* (2013.01); *C01B 21/0648* (2013.01); *C04B 35/583* (2013.01); *C04B 35/6264* (2013.01); *C04B 35/6281* (2013.01); *C04B 35/62675* (2013.01); *C04B 35/62805* (2013.01); *C04B 35/62807* (2013.01); *C04B 35/62813* (2013.01); *C04B 35/62818* (2013.01); *C04B 35/62821* (2013.01); *C04B 35/62823* (2013.01); *C04B 35/62826* (2013.01); *C04B 35/62852* (2013.01); *C04B 35/62897* (2013.01); *C04B 35/645* (2013.01); *H01L 37/025* (2013.01);
(Continued)

(58) Field of Classification Search
None
See application file for complete search history.

(56) References Cited

U.S. PATENT DOCUMENTS 5,694,343 A 12/1997 Nobutoki
5,998,528 A 12/1999 Tsipursky et al.
(Continued)

OTHER PUBLICATIONS

Kelly et al.; Highly Thermally Conductive Hexagonal Boron Nitride/Alumina Composite made from Commercial Hexagonal Boron Nitride; J. Am. Ceram. Soc.; 100, 515-519;2017).*

*Primary Examiner* — Guinever S Gregorio
(74) *Attorney, Agent, or Firm* — Robert H. Earp, III; Mark Wolfgang; Helen M. Galus

(57) ABSTRACT

A material that facilitates dissipation of heat is provided and includes hexagonal boron nitride and alumina.

14 Claims, 41 Drawing Sheets

Related U.S. Application Data a continuation-in-part of application No. 14/158,080, filed on Jan. 17, 2014, now Pat. No. 10,005,668.

(60) Provisional application No. 62/403,897, filed on Oct. 4, 2016, provisional application No. 61/754,079, filed on Jan. 18, 2013.

(51) Int. Cl.
| | |
|---|---|
| *C04B 35/628* | (2006.01) |
| *C04B 35/645* | (2006.01) |
| *H01L 37/02* | (2006.01) |
| *C01B 21/064* | (2006.01) |
| *C04B 35/626* | (2006.01) |
| *H01L 41/18* | (2006.01) |

(52) U.S. Cl.
CPC ........ *H01L 41/183* (2013.01); *C01P 2002/82* (2013.01); *C01P 2004/03* (2013.01); *C01P 2004/04* (2013.01); *C01P 2004/80* (2013.01); *C04B 2235/3215* (2013.01); *C04B 2235/3217* (2013.01); *C04B 2235/3236* (2013.01); *C04B 2235/3272* (2013.01); *C04B 2235/3409* (2013.01); *C04B 2235/36* (2013.01); *C04B 2235/386* (2013.01); *C04B 2235/444* (2013.01); *C04B 2235/445* (2013.01); *C04B 2235/5252* (2013.01); *C04B 2235/5284* (2013.01); *C04B 2235/656* (2013.01); *C04B 2235/6562* (2013.01); *C04B 2235/6565* (2013.01); *C04B 2235/6583* (2013.01); *C04B 2235/77* (2013.01); *C04B 2235/9607* (2013.01)

(56) References Cited

U.S. PATENT DOCUMENTS

| | | | |
|---|---|---|---|
| 6,981,671 | B1 | 1/2006 | Baron et al. |
| 7,451,122 | B2 | 11/2008 | Dietrich et al. |
| 7,499,050 | B2 | 3/2009 | Wu et al. |
| 7,537,682 | B2 | 5/2009 | Dailly et al. |
| 7,734,453 | B2 | 6/2010 | Kikuchi et al. |
| 8,065,022 | B2 | 11/2011 | Minto et al. |
| 8,303,922 | B2 | 11/2012 | Lin et al. |
| 8,612,186 | B2 | 12/2013 | Wu et al. |
| 8,903,995 | B1 | 12/2014 | Basak et al. |
| 10,000,419 | B1 * | 6/2018 | Hung .................... C04B 35/583 |
| 2004/0019469 | A1 | 1/2004 | Leary et al. |
| 2011/0057156 | A1 | 3/2011 | Schaumburg |
| 2011/0086965 | A1 | 4/2011 | Zhi et al. |
| 2011/0200787 | A1 | 8/2011 | Regan et al. |
| 2014/0358476 | A1 | 12/2014 | Backues et al. |
| 2015/0066450 | A1 | 3/2015 | Charlesworth et al. |
| 2016/0325994 | A1 * | 11/2016 | Qu ...................... C01B 21/0648 |

\* cited by examiner

Sample 1

Sample 2

HIGHLY THERMALLY CONDUCTIVE HEXAGONAL BORON NITRIDE/ALUMINA COMPOSITE MADE FROM COMMERCIAL HEXAGONAL BORON NITRIDE

CROSS-REFERENCE TO RELATED APPLICATIONS

This application claims the benefit of U.S. Provisional Patent Application Ser. No. 62/403,897 entitled "Highly Thermally Conductive Hexagonal Boron Nitride/Alumina Composite Made From Commercial Hexagonal Boron Nitride" filed on Oct. 4, 2016 and is a Continuation-in-Part of pending U.S. patent application Ser. No. 14/948,581 entitled "Compositions and Methods Associated with Intercalating and Exfoliating A Sample" filed on Nov. 23, 2015, which claims the benefit of U.S. Provisional Patent Application Ser. No. 62/082,815 entitled "Hexagonal Boron Nitride (hBN) Coated and/or Embedded with Metal Oxides, Polymer or Ceramic Matrix Composites Containing this hBN, and the Process to Make the Same," filed on Nov. 21, 2014 and which is a Continuation-in-Part of U.S. application Ser. No. 14/158,080 entitled "Methods for Intercalating and Exfoliating Hexagonal Boron Nitride," filed on Jan. 17, 2014, which claims the benefit of U.S. Provisional Patent Application Ser. No. 61/754,079 entitled "Methods for Intercalating and Exfoliating Hexagonal Boron Nitride," filed Jan. 18, 2013. The entirety of each of the above-noted applications is incorporated by reference herein.

ORIGIN OF THE INVENTION

The invention described herein was made by employees of the United States Government and may be manufactured and used by or for the Government for Government purposes without the payment of any royalties thereon or therefor.

BACKGROUND

The structural similarity between hexagonal boron nitride (hBN) and graphite is highlighted by the widespread use of term "white graphite" for boron nitride. This similarity has led to the efforts of using carbon chemistry and technology as guidance for research in boron nitride chemistry and technology. Such efforts resulted in the synthesis of cubic boron nitride (cBN) based on the structure of diamond, and boron nitride nanotubes (BNNT) based on the structure of carbon nanotubes.

On the other hand, the differences in chemical bonding between graphite and hBN lead to differences in the physical properties of the materials such as electrical conductivity and reactivity to air at high temperature. The ionic interlayer bonding in hBN is much stronger than the Van der Waal force between the graphite layers causing differences in the reactivity for intercalation. This also leads to differences in the efficiency of mass producing the respective exfoliated products for engineering purposes.

A layered material is "intercalated" when other chemicals are inserted into the layers, and a layered material is "exfoliated" when the layered structure is split into thinner layers. Graphite can easily be intercalated, and then exfoliated by driving intercalates out of the layers quickly and/or explosively. The process of intercalation-exfoliation of graphite has been used in many engineering applications, such as fabrication of flexible graphite, or grafoil. Recently there are reports that intercalation-exfoliation has been used to split graphite into graphene in large quantities.

The similarity between carbon and boron nitride suggests the possibility that boron nitride can be easily intercalated and exfoliated as well. However, this is not the case. Starting from hBN instead of graphite, the above process to produce large quantity of exfoliated hBN or "white graphene" has not been successful. Intercalation of hBN is difficult. Alkali metals (Li, Na, and K) and fluorosulfate ($S_2O_6F_2$) are among the few intercalates that have previously been successfully intercalated into h-BN. It involves highly reactive chemicals and reactions. The feasibility of using these chemicals for mass producing exfoliated hBN or "white graphene" was not studied or discussed in these reports. The less reactive intercalates for graphite, such as metal chloride, have been found unreactive to hBN. Most notably among them is ferric chloride ($FeCl_3$). It is generally believed that intercalation of hBN with $FeCl_3$ in particular or metal chloride in general is not likely. For producing exfoliated hBN, the less efficient method of functionalization, sonication and centrifuge is commonly used. For "white graphene," plasma etching or micromechanical cleavage techniques have been used for minute quantities.

In addition, thermal management is becoming an increasingly important topic as device sizes shrink and power and energy densities increase.

SUMMARY

The following presents a simplified summary of the innovation in order to provide a basic understanding of some aspects of the innovation. This summary is not an extensive overview of the innovation. It is not intended to identify key/critical elements of the innovation or to delineate the scope of the innovation. Its sole purpose is to present some concepts of the innovation in a simplified form as a prelude to the more detailed description that is presented later.

In one aspect, the innovation involves the modification of carbon intercalation-exfoliation to enable a process for hexagonal boron nitride (hBN) intercalation-exfoliation that leads to the production of nanophase hBN. This exfoliated hBN is less inert than its precursor hBN material may be formed into new materials and/or composites for a variety of applications such as thermal management, insulation, high temperature and others.

In one aspect, the innovation disclosed herein comprises a method of creating the hBN/alumina composite that includes preparing a mixture of hexagonal boron nitride (hBN) and aluminum chloride, heating the mixture in an inert environment at a first temperature, heating the temperature of the inert environment to a second temperature, which is higher than the first temperature, heating the temperature of the inert environment to a third temperature, which is higher than the second temperature; producing a first product of hexagonal boron nitride coated with a compound coating containing aluminum, chlorine, and oxygen, heating the first product in air to a fourth temperature, which is higher than the third temperature, producing a second product of hexagonal boron nitride coated with aluminum oxide; hot pressing the second product to a predetermined pressure, and producing an hBN-alumina composite.

In another aspect, the innovation disclosed herein comprises a method of creating the hBN/alumina composite that includes preparing a mixture of hexagonal boron nitride (hBN) and hydrated aluminum chloride, heating the mixture in an inert environment at a temperature between ambient and below a boiling point of water, heating the temperature of the inert environment to a temperature between the boiling point of water and a sublimation point of the aluminum chloride, heating the temperature of the inert environment to a temperature above the sublimation point of the aluminum chloride, producing a first product of hexagonal boron nitride coated with a compound coating containing aluminum, chlorine, and oxygen, heating the first product in air to a temperature at or above an oxidation temperature of the compound coating, producing a second product of hexagonal boron nitride coated with aluminum oxide, pressureless sintering or hot pressing the second product to a temperature above a consolidation temperature of the second product and, if necessary, to a predetermined pressure, and producing an hBN-alumina composite.

In one embodiment, the hBN may be mixed with a chloride. Suitable chlorides include an aluminum chloride, a silicon chloride, an iron chloride, a titanium chloride, copper chloride, zinc chloride, molybdenum chloride, zirconium chloride and hafnium chloride or any combination thereof. In addition, transition metal halides and post-transition metal halides may be used. In one embodiment, the hBN may be mixed with aluminum chloride and/or alumina.

In another embodiment, Si chloride may be used to develop composites with a Si based coating on hBN. The Si coated hBN can then be manipulated by subsequent heat treatments to hBN/$SiO_2$. In one embodiment the Si chloride may be combined with aluminum chloride either together or in subsequent steps, to develop hBN with an $SiO_2/Al_2O_3$ based coating. The resulting product may be heated to synthesize hBN within a matrix of mullite, mica or other materials of interest. Suitable materials include, but are not limited to chemicals in the form $nAl_2O_3 \cdot mSiO_2$ where n and m are integers.

In one embodiment, the hBN may be mixed with Ti chloride to synthesize hBN/$TiO_2$, hBN/Ti based composites.

In another aspect the innovation may include treating the first product discussed above following the first product development in a non-air environment to create a composite particle powder composed of hBN/AlN or hBN/Al. A processing gas which is either nitrogen or ammonia or combinations of N/$NH_3$ may be used to synthesize hBN/AlN composite powders which could be used in that form or further consolidated to hBN/ALN composites by processes (e.g., hot pressing) as discussed above.

Rather than processing the first product in nitrogen containing gases such as those containing ammonia, one could heat treat it in a reducing environment such as one containing Ar with 4% H2 to high temperature to reduce the Al, driving off the chlorine and oxygen to synthesize hBN/Al composite powder. This powder can be then consolidated or even melted if desired, at high temperature to create hBN/Al composites. Additional Al may be added to synthesize a material with a specific addition of hBN/Al to achieve materials which are lighter weight material and/or or higher thermal conductivity materials and other desirable properties In still another aspect, the innovation disclosed herein comprises a material that facilitates dissipation of heat that includes a composite including: hexagonal boron nitride and alumina, AlN, or Al.

According to an aspect, the innovation includes a method of creating a composite comprising preparing a mixture of hexagonal boron nitride (hBN) and a chloride or transition metal halide. The resulting mixture is then heated in an inert environment (e.g., nitrogen) to produce a first product comprising hexagonal boron nitride coated with a compound coating containing aluminum, chlorine, and oxygen. This first product is then heated in air to a temperature that is higher than the temperature at which the mixture is heated (e.g., at least about 150° C.) to produce a second product comprising a hexagonal boron nitride coated with aluminum oxide.

In one embodiment, the coating is an aluminum oxide coating having a thickness of about 5 nm to about 100 μm.

In one embodiment, the chloride is selected from aluminum chloride, a silicon chloride, an iron chloride, a titanium chloride, copper chloride, zinc chloride, molybdenum chloride, zirconium chloride and hafnium chloride or any combination thereof. In one embodiment the chloride is aluminum chloride and prior to preparing the mixture of hexagonal boron nitride (hBN) and the aluminum chloride, the method further comprising hydrating the aluminum chloride by exposing it to ambient air.

In one embodiment, the second product may be consolidated and hot pressed to produce an hBN-alumina composite. Hot pressing can take place at a temperature greater than about 1700° C. In one embodiment, hot pressing takes place under a pressure in a range of about 5-15 ksi.

According to an aspect, the innovation includes a method of creating a composite comprising preparing a mixture of hexagonal boron nitride (hBN) and hydrated aluminum chloride. The mixture may be heated in an inert environment (e.g., nitrogen) to produce a first product comprising hexagonal boron nitride coated with a compound coating containing aluminum, chlorine, and oxygen. The first product may then be heated in air to a temperature at or above an oxidation temperature of the compound coating to product a second product comprising hexagonal boron nitride coated with aluminum oxide. This second product may then be consolidated and hot pressed at a temperature above a sintering temperature of the second product to produce an hBN-alumina composite.

According to a aspect, the innovation includes a composition comprising at least about 50% by weight hexagonal boron nitride substantially coated with hydrated chloride, wherein the hydrated chloride comprising about 0.1 to 10% by weight water and the coating has a thickness of about 5 nm to about 100 μm. The composition may include a hydrated chloride is selected from aluminum chloride, a silicon chloride, an iron chloride, a titanium chloride, or a combination of two or more thereof. In one embodiment, the chloride is an aluminum chloride.

In one embodiment, the composition of claim 18, wherein the hexagonal boron nitride particles are coated with aluminum oxide and are consolidated into the composite during hot pressing to produce an hBN-alumina composite. In one embodiment, the hBN is intercalated and exfoliated.

These aspects are indicative, however, of but a few of the various ways in which the principles of the innovation can be employed and the subject innovation is intended to include all such aspects and their equivalents. Other advantages and novel features of the innovation will become apparent from the following detailed description of the innovation when considered in conjunction with the drawings.

DETAILED DESCRIPTION

Figure 1:
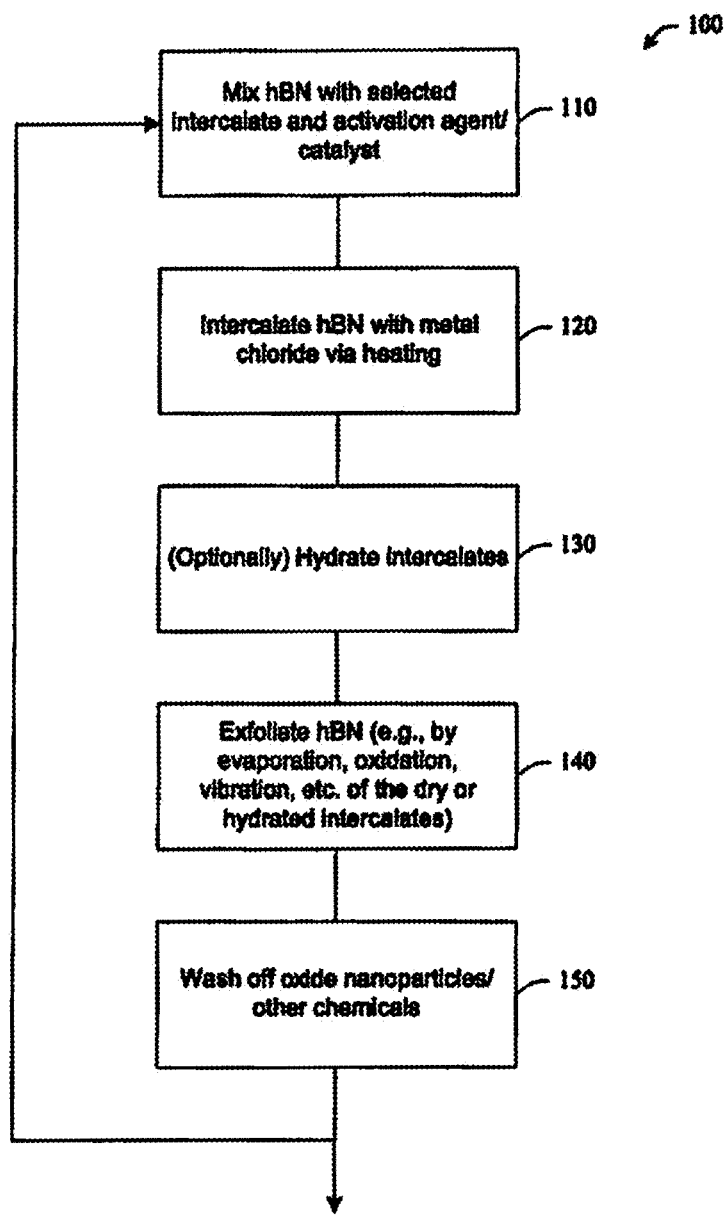
FIG. 1 illustrates a method that can facilitate intercalation and exfoliation of hexagonal boron nitride (hBN) in accordance with aspects of the subject innovation.

The innovation is now described with reference to the drawings, wherein like reference numerals are used to refer to like elements throughout the document. In the following description, for purposes of explanation, numerous specific details are set forth in order to provide a thorough understanding of the subject innovation. It may be evident, however, that the innovation can be practiced without these specific details. In other instances, well-known structures and devices are shown in block diagram form in order to facilitate describing the innovation.

As described above, the articles and method described herein relate to exfoliation of a sample of a starting reactant to create a layered structure comprised of sheets. Some of the examples herein describe the starting reactant to be hexagonal boron nitride (hBN). However, different starting reactants may be used. For example, the starting reactant may be boron nitride nanotubes (BNNT) instead of hBN. Therefore, while the embodiments discussed herein may refer to hBN, these embodiments may instead use an alternative starting reactant. As will be discussed, the starting reactant may be selected based on the desired physical properties of the layered structure.

Turning to FIG. 1, in various embodiments, the subject innovation can comprise a method 100 that can facilitate intercalation and exfoliation of hBN. While, for purposes of simplicity of explanation, the one or more methodologies shown herein, e.g., in the form of a flow chart, are shown and described as a series of acts, it is to be understood and appreciated that the subject innovation is not limited by the order of acts, as some acts may, in accordance with the innovation, occur in a different order and/or concurrently with other acts from that shown and described herein. For example, those skilled in the art will understand and appreciate that a methodology could alternatively be represented as a series of interrelated states or events, such as in a state diagram. Moreover, not all illustrated acts may be required to implement a methodology in accordance with the innovation.

Method 100 can begin at 110 by creating a mixture of hexagonal boron nitride (hBN) with a selected set of chemicals for intercalation (e.g., a metal chloride, etc.) and an activation agent/catalyst (e.g., NaF, S, etc.). At 120, the selected chemicals can be intercalated into the hBN, for example by heating them in an inert environment (e.g., an $O_2$ depleted environment such as pure $N_2$, etc.) for a first period of time according to a first heating pattern or histogram (example temperatures and heating times are provided in connection with experiments discussed below). At optional act 130, the intercalates can be hydrated, for example, by placing the intercalated product in a high humidity environment. At 140, the hBN intercalated with dry or hydrated chemicals can be exfoliated, for example by rapid heating in air for a second period of time according to a first heating pattern or histogram (again, examples are discussed below), or by sonication, or a combination thereof. In various embodiments, the subject innovation can comprise the material produced after any of 120, 130 or 140, or articles made thereof, such as ceramic composites made of the exfoliated hBN with metal oxide nanoparticles after act 140 (e.g., by hot pressing exfoliated hBN with metal oxide nanoparticles (e.g., $Al_2O_3$, etc.) at around 2000° C., etc.). Optionally, at 150, the oxide nanoparticles can be washed off of the exfoliated hBN (e.g., with HCl, etc.). The process can be repeated one or more times for additional exfoliation. In some embodiments, the subject innovation can comprise exfoliated hBN (e.g., as obtained via method 100, etc.).

Figure 2:
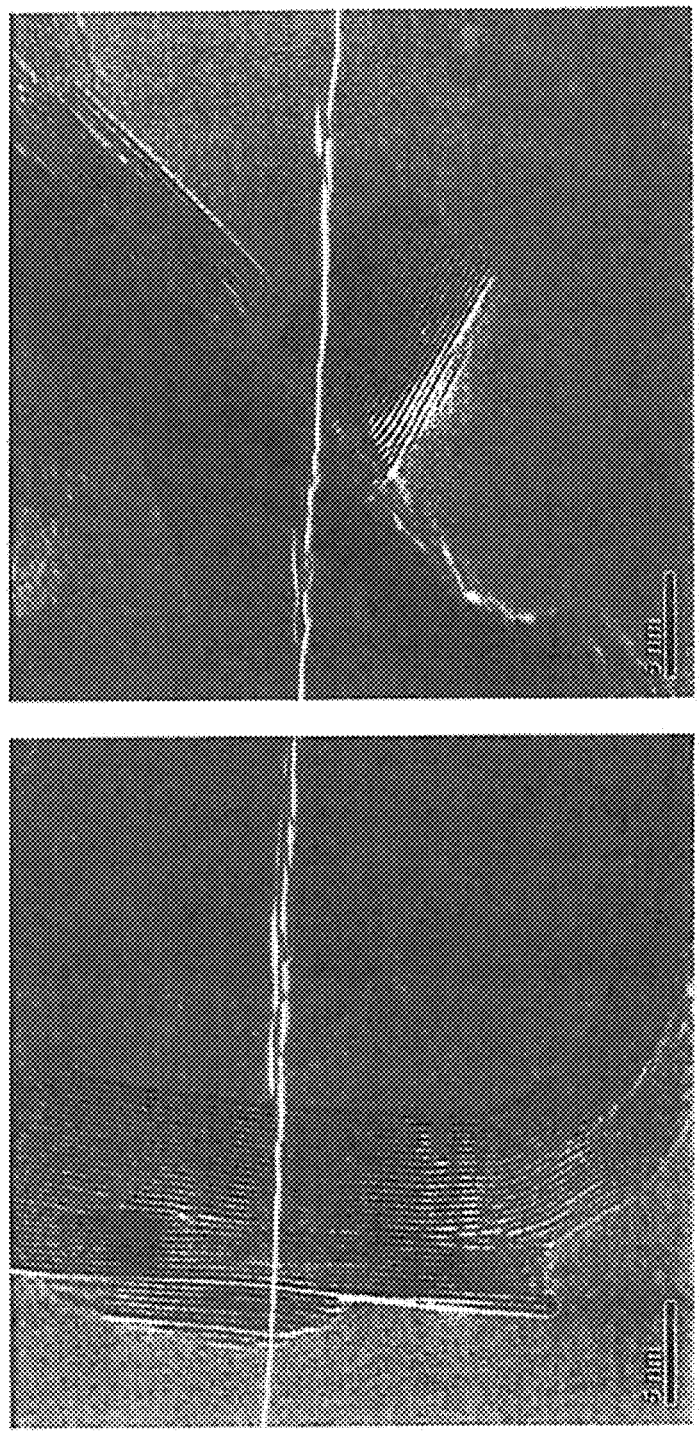
FIG. 2 shows a pair of transmission electron microscopy images of an exfoliated boron nitride nanotube (BNNT) that resulted from removing iron nanoparticles and other impurities from BNNT during purification.

While hexagonal boron nitride (hBN) exfoliation by way of intercalation with metal chloride has not been previously successful, the subject innovation builds upon recent efforts in boron nitride nanotechnology to accomplish exfoliation of hBN via intercalation of metal chlorides. FIG. 2 shows a pair of transmission electron microscopy images of an exfoliated boron nitride nanotube (BNNT) that resulted from removing iron nanoparticles and other impurities from BNNT during purification. Also, although BNNT cannot be intercalated by direct exposure to molten $FeCl_3$, the wetting and cleaning effects of BNNT by $FeCl_3$ have been observed. In addition, BNNT intercalated with potassium and then exfoliated by reacting to water has been successfully demonstrated. This led to a hypothesis leading in part to the subject innovation that, if hBN may be chemically activated similar to BNNT, intercalation of hBN with $FeCl_3$ and subsequent exfoliation may be possible. This hypothesis is in parallel with the experience in carbon intercalation: Some of the graphite intercalation reactions need to be "activated" in order to proceed. For example, iodine cannot be intercalated with graphite unless graphite is "activated" by bromine or HBr.

The subject innovation, in various embodiments, includes methods that can facilitate intercalation and exfoliation of hBN. In other embodiments, the subject innovation includes products and intermediate products that can be associated with such methods, or articles (e.g., ceramic, composite, etc.) comprising or derived from such products and/or intermediate products.

In one embodiment, confirmed through results discussed herein, sodium fluoride (NaF) can be used as a catalyst to successfully intercalate $FeCl_3$ into hexagonal boron nitride (hBN). This reaction, as discussed herein, caused the hBN mass to increase by about 100%, the lattice parameter c to decrease from 6.6585 to 6.6565-6.6569 Å, the x-ray diffraction (002) peak to widen from 0.01 to 0.05° full width half max (FWHM) value, the FT-IR's (Fourier transform infrared spectroscopy) broad band (peaked at 1277 $cm^{-1}$) to change shapes, and new FT-IR bands at 2700-3700 and 1600 $cm^{-1}$ to emerge. This indicates the hBN's structural and chemical properties are significantly changed. The intercalated product was hygroscopic. The moisture picked up from air interacted with intercalated $FeCl_3$, causing further structural and chemical property changes (XRD and FT-IR data). During a 24 hours hold at room temperature with 100% relative humidity air exposure, the mass increased another 141%. All of the above changes were nearly completely reversed after the product was placed in HCl to remove the intercalated $FeCl_3$, indicating the hBN layers were not significantly damaged during the process. The intercalated product, with or without hydration, was heated to 750° C. air to cause exfoliation. The extent of exfoliation was low after one cycle of intercalation-air heating, but became significant during the $2^{nd}$ cycle, after which 20 nm nanosheets were commonly found.

Methods of the subject innovation can involve reactions based on interactions between hBN and metal chlorides, such as the following examples involving iron chloride ($FeCl_3$):

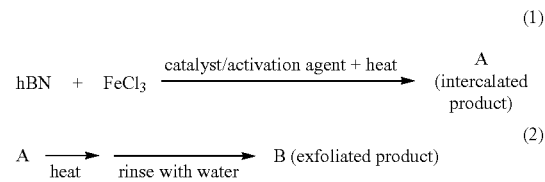

The chemical reaction experiments employed in the subject innovation for possible intercalation reactions has similarities to those described in previous reports, however, embodiments of the subject innovation can add a catalyst/activating agent such as sodium fluoride (NaF) to the original reactants. Sodium fluoride was considered as a possible catalyst/activating agent for intercalation because its aqueous solution with HCl has been previously observed to attack/activate BNNT. The products of these chemical reactions (A and B) were then further examined for the evidences of intercalation and exfoliation.

In various embodiments, the processes of intercalation and exfoliation described above (or similar processes, e.g., with other metal chlorides, catalysts, etc.) can be repeated in order to see if the additional effort would cause further exfoliation. That is,

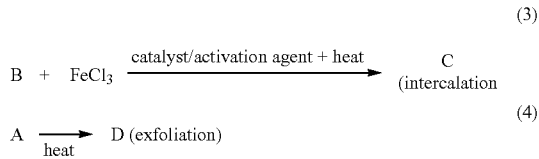

In various embodiments, the products "A" to "D" can be further treated chemically as follows:

(a) The intercalated and exfoliated products were rinsed with hydrochloric acid (HCl) at room temperature to remove impurities and intercalates:

(b) The intercalated products ("A" or "C") can be exposed to room temperature moist air for a period of time; during experiments such results were characterized several times during this period to study the water-adsorbing characteristics of the apparently hygroscopic intercalated product:

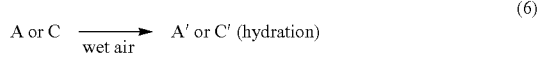

(c) The hydrated products can be placed into a high temperature furnace or otherwise exposed to rapid heating for the moisture to quickly boil, whereby the adsorbed moisture can provide additional driving force of exfoliation:

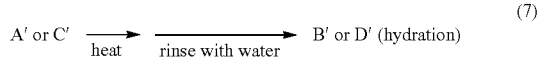

(d) In further results, the intercalated products "A" were stored in dry air for four months and characterized twice during this period to determine the stability of the intercalated product in dry air.

Two different kinds of commercially available hBN powder were used in experiments discussed herein. The larger ones were platelets mostly 20-80 μm wide and 5-10 μm thick. The smaller ones were mostly 200-800 nm wide 80-200 nm thick. Both of them are well crystallized, as indicated by their significant XRD (X-ray diffraction) peaks for hBN.

A first set of experiments involved intercalation with ferric chloride ($FeCl_3$). Ferric chloride ($FeCl_3$) (98%) and NaF (99.98%) used in the experiments were commercially purchased from Alfa Aesar. NaF was used as purchased. $FeCl_3$, on the other hand, was distilled once immediately before being used in intercalation reaction because it is highly hygroscopic. Its melting point and boiling point are 306° C. and 315° C., respectively. When it evaporates/sublimates, a fraction simultaneously decomposes into $FeCl_2$ and $Cl_2$. For distillation conducted in this research, it was sublimated/evaporated at about 260-330° C. and then condensed at about 30° C. lower. Based on the vapor pressure and decomposition equations for $FeCl_3$, the vapor pressure of for $Cl_2$ during distillation was 4.4 Torr at 260° C. and 72 Torr at 330° C. The $FeCl_3$ pressure was 51 Torr at 260° C. and 688 Torr at 330° C. under the system of 1 atmosphere total pressure.

The detailed experimental procedures were as follows: Pre-calculated quantities of hBN, distilled $FeCl_3$ and NaF were weighed and mixed into a 50 ml test tube. The test tube was sealed using PTFE (polytetrafluoroethylene) tape, and then placed into a 500 ml reactor kettle, which is then sealed air-tight. Pure nitrogen was then allowed to flow through valves into and out of the kettle to purge air and keep the system in an inert environment during the entire reaction period. The sample at the bottom of the test tube was heated to a temperature slightly below the melting point of $FeCl_3$ (306° C.) for intercalation, and eventually to a temperature slightly above the boiling point of $FeCl_3$ (315° C.) for letting the excess $FeCl_3$ boil and leave the product from the bottom of the test tube and then condense at the top of the tube where the temperature is lower due to the lighter thermal insulation. After the reaction and the system cooled, the product was removed from the test tube and stored in dry environment. Results of the procedure described in this paragraph were products "A" or "C" described above.

Samples of the product "A" were then placed in a quartz watch glass, weighed and placed into a furnace heated to 600-750° C. for a period ranged from 2 to 4 hours using a pre-programmed temperature histogram. After heating, the product was removed from the furnace, cooled and rinsed with water. The result was product "B" described above. This product was then further treated for intercalation according to the procedure described above to have product "C". In this research, some but not all of the products "C" was exposed to moist air, either at ambient humidity or at 100% relative humidity. In all cases, it was then placed in a quartz watch glass, weighed and put into a furnace heated to 600-750° C. for a period ranging from 2 to 4 hours using a pre-programmed temperature histogram, to result in "D".

Concentrated (35 wt %) HCl was used to remove intercalates. Detailed reactant and product mass data and temperature histogram of the experimental runs used for this report are described in Table 1 below, which is a summary of the intercalation of the as-purchased commercial hBN with $FeCl_3$.

TABLE 1

| Type of hBN | Reactants * | | Reaction | | | | Products ** | |
|---|---|---|---|---|---|---|---|---|
| | Mass ratio | | temperature during 2 or 3 steps of sequential heating in nitrogen Temperature (° C.)/duration (hr) | | | | hBN mass content (%) | Label ## |
| | NaF To hBN | # FeCl₃ to hBN | | | | | | |
| L | 0.120 | 2.7 | 315/12 | 340/2 | — | | 55 | A1 |
| L | 0.141 | 2.8 | 320/23 | 340/19 | — | | 45 | A2 |
| L | 0.115 | 2.3 | 290/14 | 320/30 | 355/16 | | 54 | A3 |
| L | 0.190 | 1.7 | 240/25 | 285/22 | 330/21 | | 42 | A4 |
| S | 0.14 | 2.7 | 290/3 | 330/38 | — | | 45 | A5 |

\* The reactants were hBN, NaF and excess amount of ferric chloride. hBN type: L: large 20-80 μm wide 5-10 μm thick. S: small 200-800 nm wide 80-200 nm thick
\*\* The intercalated products were not washed. They included hBN, the intercalated chemicals, FeOCl and NaCl. The presence of NaCl and the absence of NaF or fluorine atoms were confirmed by XRD and EDS data.
\# Boiling point of FeCl₃ is 315° C. At this temperature, the iron chloride vapor is in the dimer form and is partially decomposed to gaseous Cl₂ and solid FeCl₂. At one atmosphere under this condition, the equilibrium partial pressure for Fe₂Cl₆ and Cl₂ are 718 mmHg and 42 mmHg, respectively.
\#\# The labels used to identify the products described herein.

For hydration (reaction (6), above), the products A or C were placed on a glass slide and exposed to ambient air with known humidity, or to an enclosed container containing liquid water for 100% relative humidity.

The samples were characterized using Fourier transform infrared spectroscopy (FT-IR), x-ray diffraction (XRD) and field emission scanning electron microscopy (FeSEM).

An Agilent Cary 660 FT-IR with attenuated total reflectance (ATR) accessory was used to characterize IR bands near 1380 and 755 cm$^{-1}$ for boron nitride in the products.

A Bruker D8 Advance X-Ray Diffractometer was used to find x-ray diffraction peaks for hBN and identify the impurities in the products. The samples were normally scanned at 0.02° (2θ value) per step unless otherwise stated when extra precision was required (0.005° per step in that case). The full width at half maximum (FWHM) values as the peak width for hBN's (002) were calculated using the split-Pearson VII empirical fitting function. The (004), (006), and in some cases (008) peaks for hBN were used to accurately calculate the "c" lattice parameter using the fundamental parameters approach and the Pawley fitting method as implemented in the Bruker TOPAS software program. It is therefore a sensitive method to evaluate the state of intercalation. Non-hygroscopic samples, typically 10 mg in mass, were mounted as a thin layer on a flat "zero" background holder (ZBH), which consisted of a polished silicon wafer cut on a non-diffracting, high-index plane. Hygroscopic intercalated samples were mounted in a 0.5 mm-deep well ZBH holder. The iron and chlorine concentrations for those samples were such that their x-ray penetration depths (95% contribution to the diffracted beam) were typically near 60 μm. Under these conditions, the FWHM values were not affected by the thickness of the samples being scanned.

A Hitachi S-470011 field emission scanning electron microscope (FeSEM) was used to study the morphology throughout the reactions studied in experiments discussed herein. Energy dispersive spectrum (EDS) was used to identify the chemical elements in the products.

The large hBN platelets (mostly 20-80 μm wide 5-10 μm thick) were highly crystalline as seen by sharp and intense XRD peaks. Once intercalated, their layered lattice structure change, with their XRD peaks becoming lower and wider, and their lattice parameters, especially the c parameter which is a measure of the interlayer spacing, will also change. Observation of lattice structure changes at hBN's interior some distance away from the surface, at the reaction temperature of 240-360° C., signals that the chemicals surrounding the platelets may have entered to the interior (i.e., intercalated).

Figure 3:
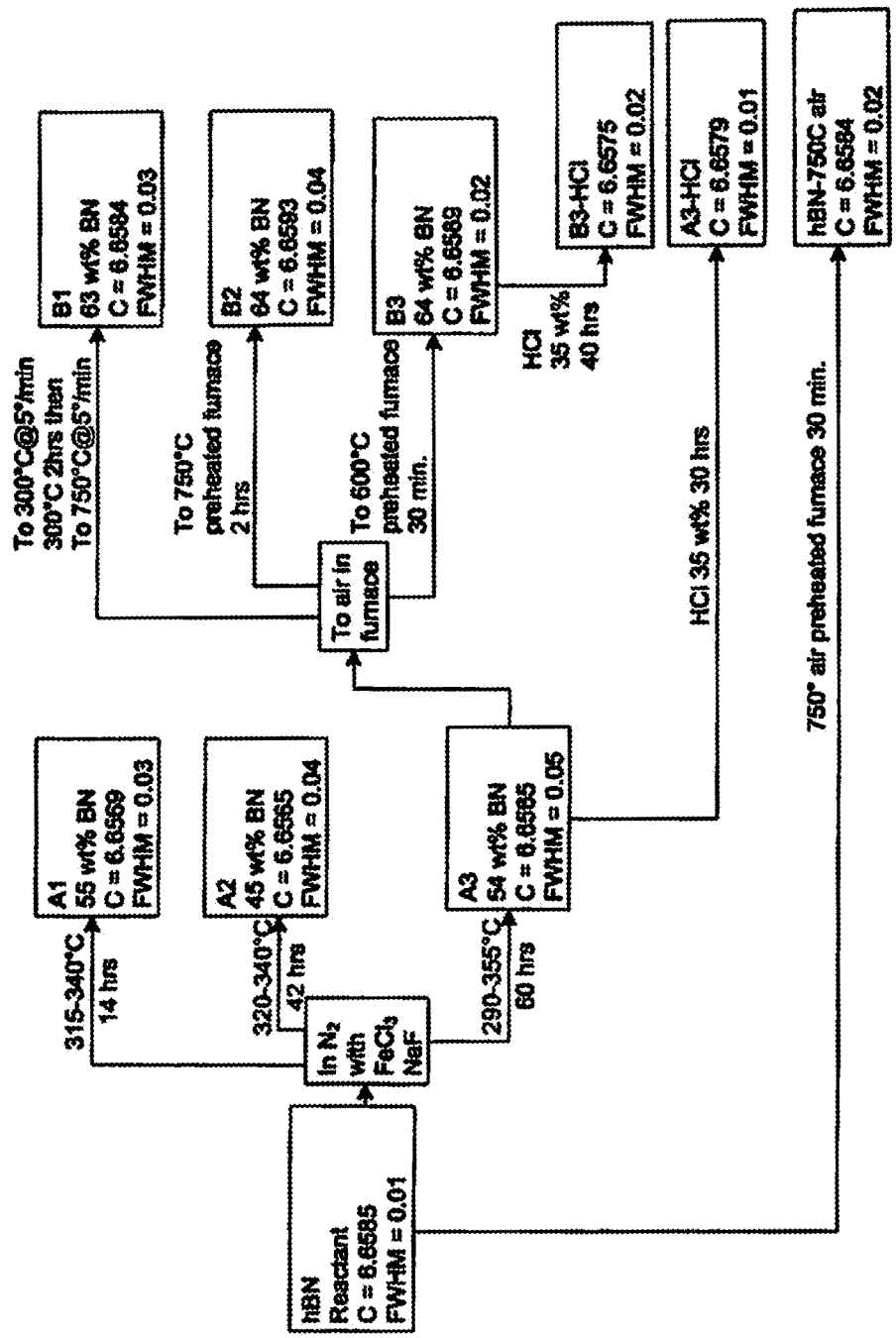
FIG. 3 illustrates examples of intercalation and exfoliation reactions involving $FeCl_3$ that were examined in experiments described herein.

FIG. 3 shows examples of intercalation and exfoliation reactions involving FeCl₃ that were examined in experiments described herein. Changes of hBN's (002) peak width)(° and the c parameters (Å) during the reactions suggest the intercalates were in the layers of hBN. The chart in FIG. 3 the experiments conducted in connection with the FeCl₃ results where large hBN platelets were intercalated and exfoliated for the first time. The hBN's (002) peak width (FWHM) and the c parameters for the hBN reactant and all products are also included. The precision of the FWHM was estimated to be in the range of ±0.01° based on observation of sample repetitions. This is compared to the 0.01-0.05° of the FWHM values and 0.02° scanning step value during data collection. The lattice parameter data was based on analysis of (004) and (006) peaks. The accuracy and precision was estimated to be in the range of ±0.0005 Å based on observation of sample repetitions and comparison to results with an internal standard. Even though the analysis program generates estimated standard deviations for the lattice parameter results, it is well known that the estimated standard deviation can be over an order of magnitude smaller than the true error. Therefore, the above estimation of error, which is more conservative, is included. After reacting to FeCl₃ and NaF, changes in hBN's lattice structures were observed. These changes, however, were mostly restored after the final rinse by 35 wt % HCl to result in pure, exfoliated hBN. According to the reasoning described above, this result indicates that the hBN was most likely intercalated, and mostly if not completely deintercalated to become a thinner product having lattice structure similar to the original reactant, as HCl removed all intercalates.

The (002) peak width, as expected, became wider because intercalation introduced disorder into the lattice. Potential explanations of the changes of c parameter (and therefore the interplanar spacings between the BN layers) were not investigated. It was slightly decreased during intercalation, then increased to a value slightly larger than the original hBN reactant during exfoliation in 750° C. air, and eventually returned to the original hBN value after HCl treatment.

FeCl₃ intercalation also causes interplanar spacings between graphite layers to change. The changes, however, are small and only between graphite layers adjacent to the intercalate layer.

The similarity between the hBN reactant and its intercalated-then-deintercalated product (B3-HCl in FIG. 3) observed here indicates that most if not all intercalates in the hBN layers were removed. This phenomenon is very different from graphite. Completely removing intercalate from graphite layers it is very difficult. The "residue compound" left after the incomplete deintercalation of graphite exhibits XRD peak widths and c parameters generally larger than their precursor. Another difference between graphite and hBN intercalation is the lack of staging phenomenon for hBN. In graphite, there are a certain number (n) of carbon layers between two intercalate layers. The regular insertion of intercalate layers into graphite results in a "stage n intercalated product" and new intercalation peaks for XRD. In hBN, the intercalate insertion seems to be random, as no new XRD peaks can be accounted for as "intercalation peaks."

Figure 4:
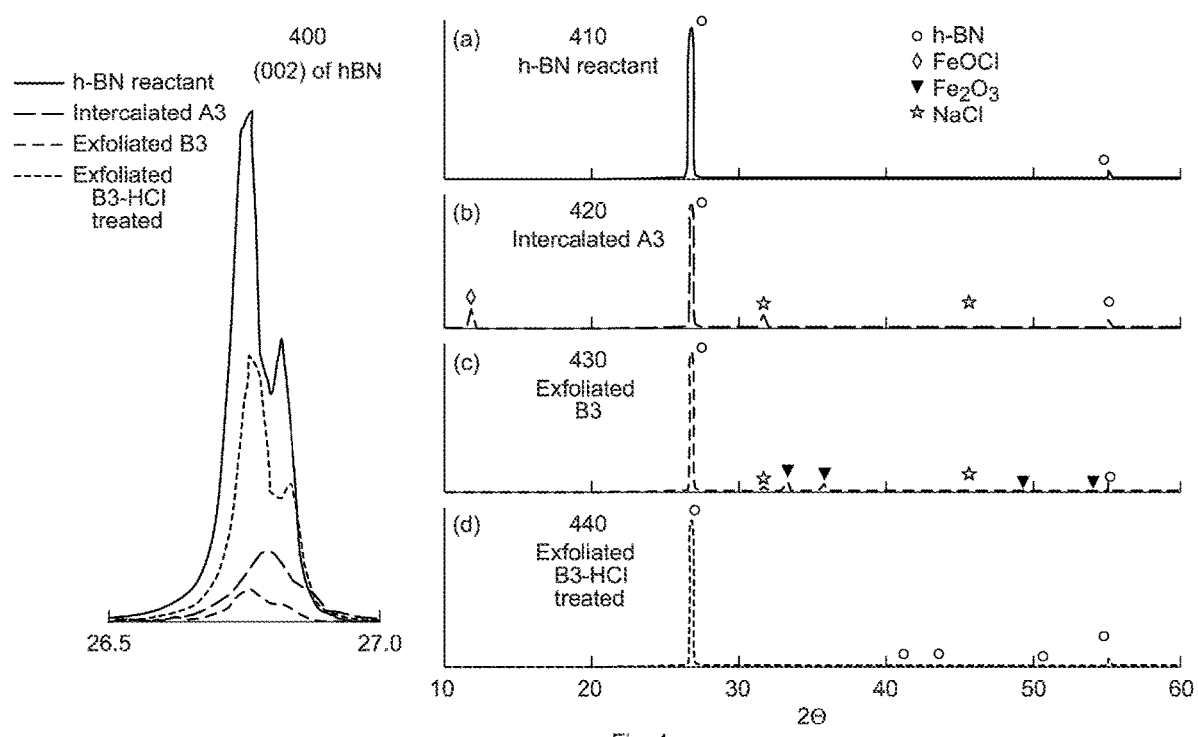
FIG. 4 illustrates X-ray diffraction (XRD) scans of hBN reactant, and products described in FIG. 3.

FIG. 4 illustrates XRD scans of hBN reactant, and A3, B3, and B3-HCl (as described in FIG. 3). Even though the very large (002) peaks were obtained, analyzing the implications of this XRD peak heights (or its total integrated intensity) is complicated because measured peak values are affected by many parameters, some of which are either not well known or difficult to control, such as chemical composition and preferred orientation of the samples being measured. Consequently, the XRD peak height were not closely examined other than the general observations that hBN's (002) peak heights were reduced during intercalation, and were mostly restored after the subsequent exfoliation reactions by 750° C. air and cleaning by HCl. This is illustrated in 400, which shows the relative heights of (002) peaks from thin samples of hBN reactant, A3, B3 and B3-HCl described in FIG. 3. The full XRD scans of these four samples are shown in 410, 420, 430, and 440. In these figures, no chemicals other than hBN were detected in the original hBN and the final product after HCl cleaning (B3-HCl in FIG. 3). In the intercalated sample (410), the major intercalate (iron chlorides) are not visible and are believed to be amorphous, but small impurity peaks of FeOCl and NaCl were detected. After the intercalated samples were heated in 750° C. air, $Fe_2O_3$ (major intercalate) and NaCl were detected in 420. The presence of NaCl in A3 and B3 is believed to be the result of reactions of NaF and $FeCl_3$ at the environment of the intercalation reaction. The presence of FeOCl in A3 is caused by a trace of oxygen in the reaction system. The oxygen may come from water that remained in the once-distilled $FeCl_3$. It may also come from the reaction between NaF and the glass container. The presence of $Fe_2O_3$ is believed to be the oxidation product from $FeCl_3$ and FeOCl.

Hexagonal boron nitride is much less reactive than the intercalates which are generally more chemically reactive. By inserting reactive chemicals into the hBN layers, the atoms/molecules of the intercalated will be brought to the proximity of individual hBN layers, and the chemical properties of hBN may be affected. The possible changes of hBN's chemical properties can be probed by examining the FT-IR data.

Figure 5:
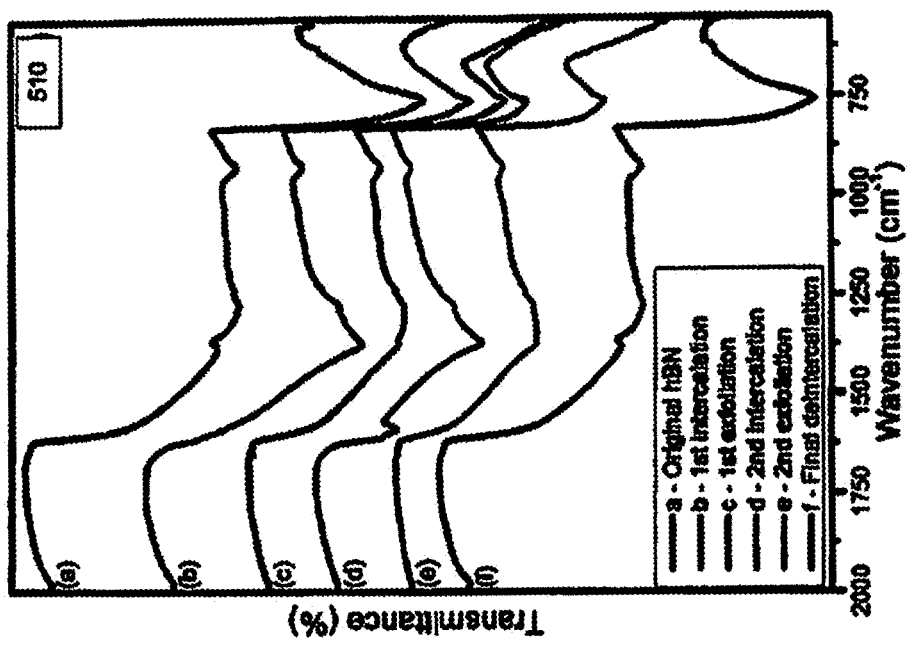
FIG. 5 illustrates changes of the Fourier transform infrared spectroscopy (FTIR) peaks from hBN to intercalation, exfoliation, and deintercalation.
Figure 5:
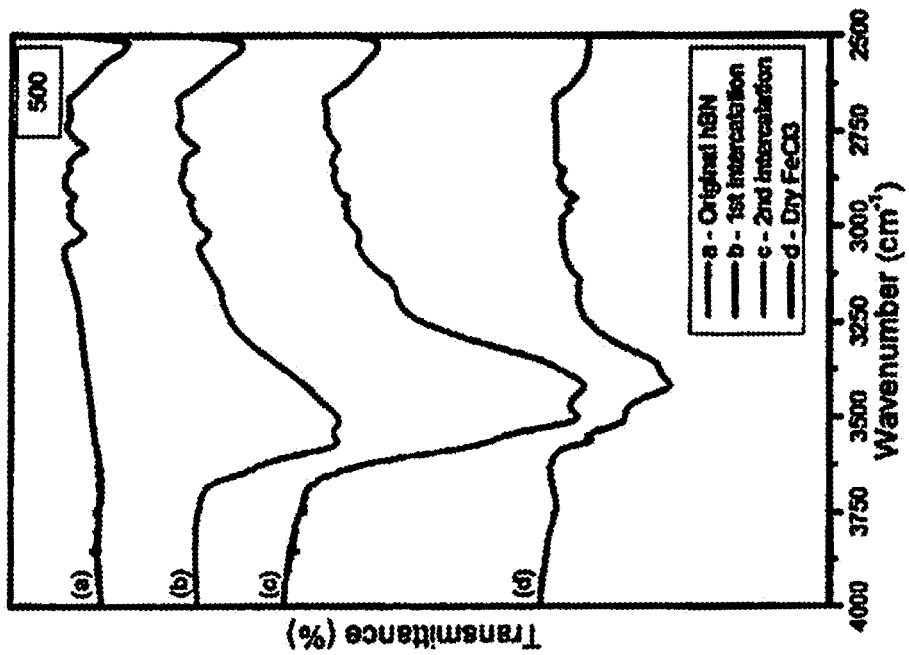

FIG. 5 illustrates changes of the FTIR peaks from hBN to intercalation, exfoliation, and deintercalation. For h-BN, there are two characteristic peaks: a relatively broad band 1700-900 $cm^{-1}$, and a relatively narrow band 850-700 $cm^{-1}$, which are associated with the in-plane B—N bond stretching vibration and the out-of-plane B—N—B bending vibration, respectively. The hBN FTIR results used in these experiments and discussed herein are consistent with this data, as seen in the curve at 500. After reacting with $FeCl_3$, the product has large and new broad FT-IR bands at 3050 to 3700 $cm^{-1}$ range which includes double bands at 3480 and 3555 $cm^{-1}$.

Graph 500 compares FT-IR of the original hBN (curve a), intercalated hBN containing $FeCl_3$ (curve b) and the pure $FeCl_3$ (curve c) at the broad bands wavenumber range (3000-3800 $cm^{-1}$). The original hBN does not have a band in this range, but the other two do. The broad band from the intercalated product is therefore thought to be the band from $FeCl_3$. However, these bands (curve b) positions and shapes were different from the pure $FeCl_3$ (curve c). The FT-IR differences between pure $FeCl_3$ and intercalated $FeCl_3$ indicate the intercalated $FeCl_3$ is affected by hBN. In other words, there are interactions between hBN and $FeCl_3$.

Graph 510 is the FT-IR data in 500-2000 $cm^{-1}$ region. It shows the shape changes of the broad hBN bands during the entire process. That is, from the original hBN reactant (curve a) it was sequentially treated by heating in a $FeCl_3$—NaF mixture for intercalation (curve b), heating in 750° C. air for exfoliation followed by rinsing in deionized water for removing NaCl (curve c), heating in $FeCl_3$—NaF mixture again for intercalation the $2^{nd}$ time (curve d), heating in 750° C. air for exfoliation followed by deionized water rinse for removing NaCl the $2^{nd}$ time (curve e), and finally placing in 35 wt % HCl to remove the intercalates (curve f).

For the broad 1700-900 $cm^{-1}$ band, its shapes changed during the intercalation-oxidation-deintercalation process. Peak position of this band shifted from 1277 to 1383 $cm^{-1}$ during the process (510, curve b, c, d and e), but returned to the original 1277 $cm^{-1}$ after all intercalates are removed (510, curve f). Changes of the 850-700 $cm^{-1}$ band, on the other hand, remained in the narrow 755 to 760 $cm^{-1}$ range. This suggests a change of the B—N stretching vibration, but not much change of the B—N—B bending vibration.

In addition to the above-described bands, new FT-IR peaks at about 1600 $cm^{-1}$ are observed in the intercalated samples (510, curves b and d). A close look shows they are double-peaks. One of the peaks was from the intercalate ($FeCl_3$), described in more detail below. The other peak is believed to be due to stretching in the direction comparable to BNNT's tangential stretching vibration. It is noted that such a peak does not show up in regular hBN, but is evident in BNNT because the tube curvature induces a strain on the hBN network. The observation of this band in the hBN sample here suggests strain on the hBN, which is possibility due to intercalates present in the hBN network. The band near 500 $cm^{-1}$ was believed to be from $Fe_2O_3$, which resulted from oxidation of $FeCl_3$.

Similar to the XRD data, all the changes of the FT-IR data during the process were almost completely reversed, and the peaks returned to its original shape after the final HCl treatment in which the intercalates and other impurities were removed.

The overall changes of the hBN's vibration modes during the entire process indicates interactions between hBN and intercalate (hBN-$FeCl_3$ or hBN-$Fe_2O_3$) result in changes of hBN's chemical properties, and such changes can be reversed by removing the intercalates.

The mass ratio of the original reactant mixture was hBN:$FeCl_3$:NaF≈1:2:0.2. After heating the mixture of hBN (large platelets), $FeCl_3$ and NaF and then boiling off excess $FeCl_3$, the as-synthesized products were brown in color and had a mass gain over the original hBN by about 100%. Energy dispersive spectrum (EDS) obtained from SEM operated at 15 kV indicated that the overall mole ratio of Fe:Cl:Na for this as-synthesized product was about 1:2.8:0.45. It was noted that EDS cannot detect fluorine, which was in the original reactant in the form of NaF.

The significance of NaF in the reaction was observed when comparing the above mass data to those in preliminary experiments where the same heating and boiling process was conducted without the presence of NaF. In those cases, the as-made products were white in color and had mass gain over the original hBN by less than 10%.

Figure 6A:
FIGS. 6A-B illustrate field emission scanning electron microscope (FESEM) images of hBN platelets with ferric chloride intercalate.
Figure 6B:

FIG. 6A shows an FeSEM photo of the as-synthesized product. FIG. 6 shows the same image of hBN platelets, except the SEM detected backscattered electrons, which highlights heavy element (iron) as bright areas. When comparing these two pictures, it is seen that iron is more concentrated at the sides and edges of the disk-shaped particles. This data suggest that the mass increases during the reactions resulted from $FeCl_3$ entering the layered structures of the hBN from the side.

Figure 7A:
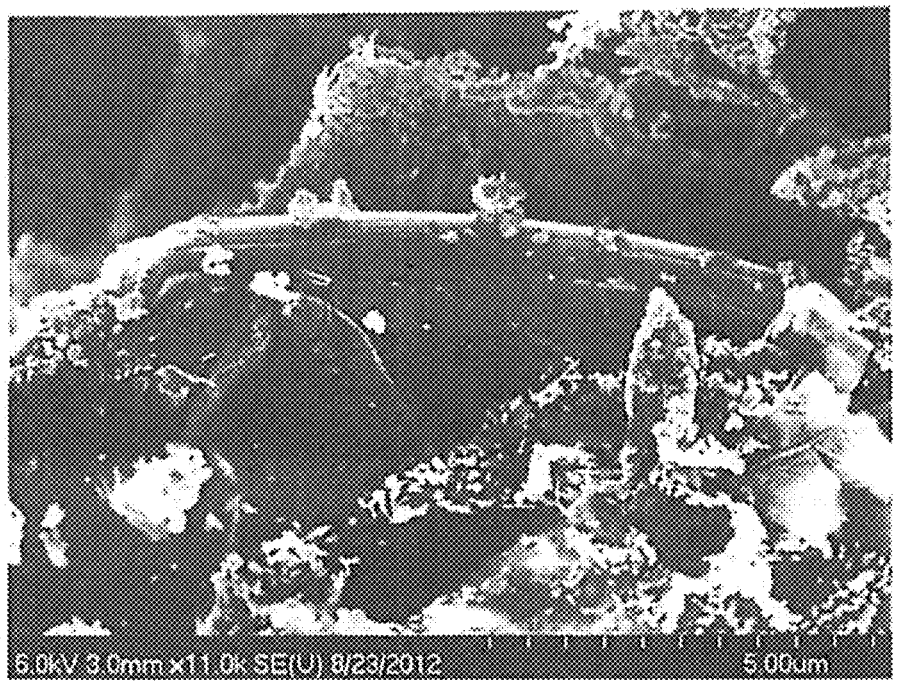
FIGS. 7A-B illustrate SEM pictures of an intercalated sample after it was slowly oxidized by oxygen in air at high temperature to become $Fe_2O_3$ nanoparticles.
Figure 7B:
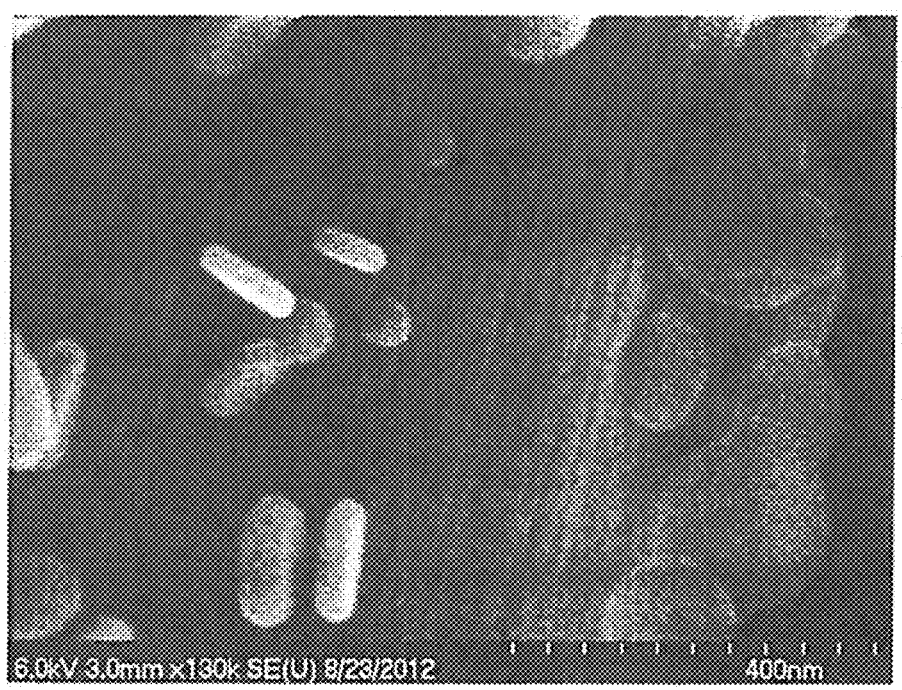

FIGS. 7A-7B are SEM pictures of the above intercalated sample after it was slowly oxidized by oxygen in air at high temperature to become $Fe_2O_3$ nanoparticles (e.g., B1 in FIG. 3). The heating rate was 5° C. per minute from room temperature to 750° C. with a holding time of 2 hours at 300°

C. It was sufficiently slow so that the iron chloride intercalate were in solid phase and did not change location when they became $Fe_2O_3$. The presence of $Fe_2O_3$ in the sample was confirmed by XRD. FIG. 7A shows top view of alternating layers of hBN and $Fe_2O_3$ nanoparticles. FIG. 7B is the side view of a relatively thick hBN layer about 1 μm thick. It can be seen that this layer is split into numerous thin layers about 20-30 nm thick. Both pictures suggest that hBN was intercalated with the nanoparticle's precursor (i.e., iron chloride).

Figure 8A:
FIGS. 8A-B illustrate SEM pictures of an intercalated sample after it was quickly oxidized by oxygen in air at high temperature.
Figure 8B:

FIG. 8A is SEM photo from a sample similar to FIGS. 7A-7B, except this intercalated sample was quickly oxidized by placing it into the preheated 750° C. furnace (e.g., B2 in FIG. 3). The fewer but much larger, micron-sized $Fe_2O_3$ particles are believed to be the result that some $FeCl_3$ intercalates melt, coagulated, moved out of the lattice, and then oxidized. This sample also shows intercalation and a limited degree of exfoliation. FIG. 8B is a picture of exfoliated hBN in this sample.

The above pictures show signs that, using NaF as catalyst/activating agent, hBN was indeed intercalated with $FeCl_3$. Furthermore, subsequent heating of this intercalated product in air at 750° C. appeared to result in some degree of exfoliation. However, the exfoliation shown in both FIG. 6B and FIG. 7B was the minority among a large number of platelets in the samples. Although 20 nm exfoliation thicknesses were found, some platelets were not exfoliated, and the thicknesses of most of the exfoliated hBN platelets were in 0.5 to 2 μm range. Nevertheless, the resulting platelets were overall thinner than the original hBN reactant platelets (mostly more than 5 μm thick), but far from the goal of fabricating "white graphene." For the purpose of generating further exfoliation, reactions (3) to (7) described earlier in this report were carried out via two different techniques.

Figure 9A:
FIGS. 9A-B illustrate SEM images of exfoliated hBN nanosheets.

In the first technique, the intercalated and then air-heated product (hBN containing micron-sized $Fe_2O_3$ particles described in connection with FIGS. 8A-8B) was rinsed with water to remove its sodium content (EDS data), intercalated (mixed with $FeCl_3$ and NaF and heated) and exfoliated (heated in 750° C. air) for the second time, and then cleaned (placed in 35 wt % HCl). The result showed more complete and much more pronounced exfoliation where 20 nm nanosheets of pure hBN and pores can commonly be seen, as shown in FIG. 9A. This result also demonstrates that, with additional cycles of intercalation and exfoliation, more extensive exfoliation into even thinner nanosheets is possible.

In the second technique, the hBN was intercalated and exfoliated for the second time in a way similar to the first technique, except the intermediate intercalated product was placed in ambient air for 50 hours before it was exfoliated for the second time in 750° C. preheated furnace, and the sample was covered by a quartz lid during the subsequent 750° C. heating to exfoliate the sample for the second time.

Figure 9B:

Ambient air (about 30% relative humidity) exposure caused the hygroscopic intercalated hBN to adsorb water of around 10% of its own mass. The subsequent 750° C. heating caused the water and then $FeCl_3$ to quickly boil, resulting in exfoliation and producing steam that carried away some exfoliated BN layers. These BN layers were then deposited on the quartz lid and, after the system was cooled to room temperature, picked up by a piece of carbon tape for SEM examination. SEM pictures show they were piles of nanosheets, about 10-20 nm thick and separated by a space of about 10-60 nm, such as that seen in FIG. 9B.

Exfoliation of hBN, as observed in experiments discussed herein, suggests that the original hBN was intercalated; additional exfoliation after repeating the same process further supports this suggestion.

The apparent enhancement of exfoliation after the hygroscopic intercalated compound picked up moisture in air called for additional study on the reactions between the intercalated compound and water. In a preliminary test, an intercalated sample A3, described in Table 1, was exposed to the ambient environment (24° C., 59-63% relative humidity) overnight after it was stored in dry air for 23 days. This resulted in 20% mass increase. The XRD data indicates that its c lattice parameter and hBN (002) peak width (FWHM) changed from 6.6584 Å and 0.059° to 6.6569 Å and 0.056°, respectively, during the overnight ambient air exposure.

A more detailed study of the effects of moisture in air on the same intercalated hBN was conducted after it was stored in dry air for 4-5 months. In this study, the samples were exposed to room temperature air with different relative humidities and analyzed using 3 different methods (mass, FT-IR and XRD).

Figure 10:
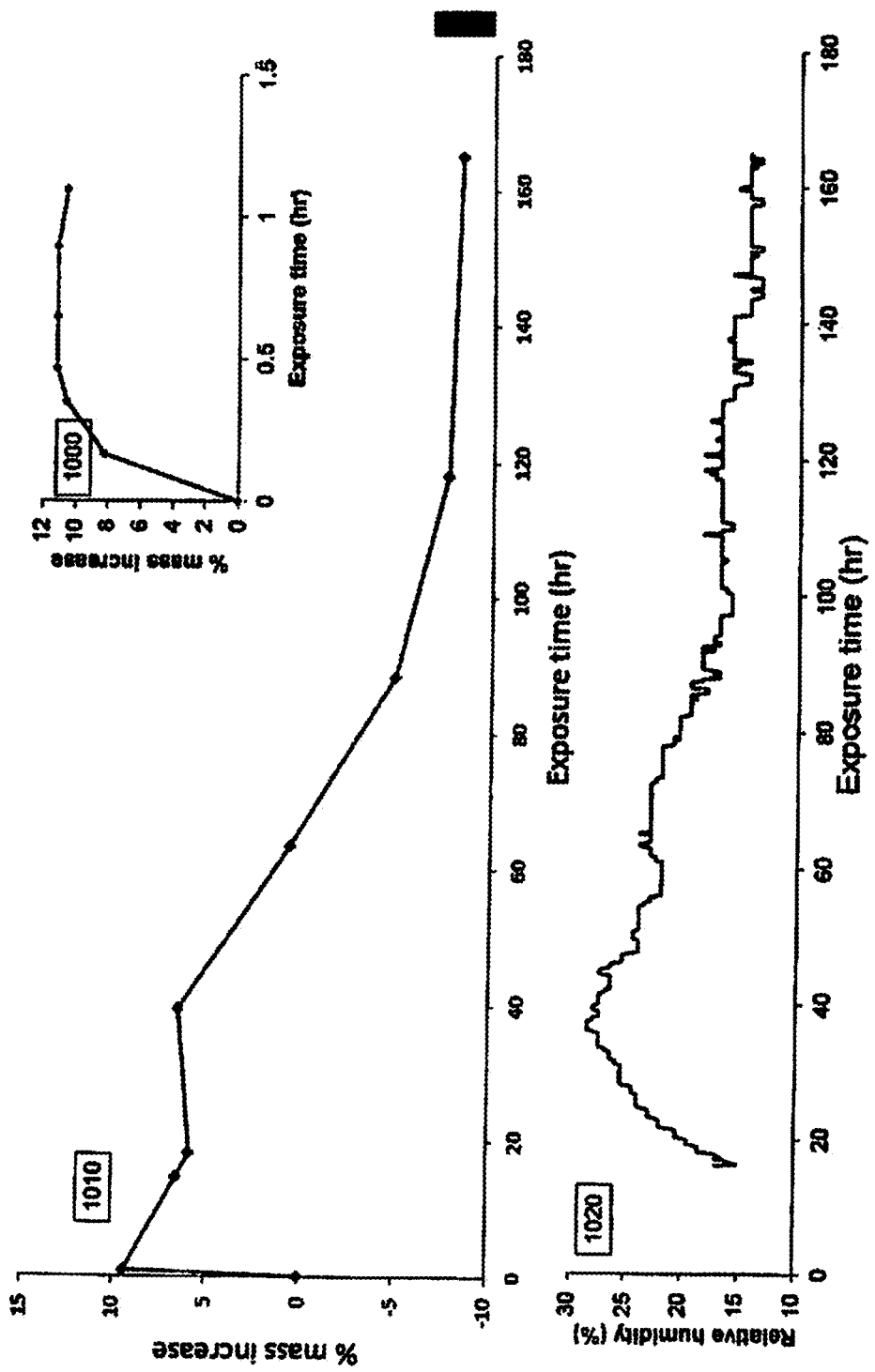
FIG. 10 shows the percent mass increase of two intercalated samples during the ambient air exposure.

FIG. 10 shows the percent mass increase of two intercalated samples during the ambient air exposure. One of them was weighed several times during an exposure time of 66 minutes (1000). The relative humidity was 26-27% during the time of this experiment. The result shows the sample mass increased rapidly during the first 20 minutes and reached a peak in 30-40 minutes of exposure time, to 11% mass gain. The other sample was tested similarly, but during a long exposure time of 165 hours (1010). The relative humidity histogram was also shown (1020). It was in the 15-28% range. It can be seen that after the mass reached a peak value within an hour, it began to decrease continuously for days during the ambient air exposure. Despite the initial mass increase, the overall mass during this ambient air exposure experiment actually decreased. The data suggests that the samples picked up moisture from air quickly. The moisture then reacted with intercalates, resulting in gas products, possibly HCl or $Cl_2$ during the conversion of $FeCl_3$ to $Fe_2O_3$.

For XRD analysis, a sample of the same product (A3 in Table 1) was mounted and filled in a 0.5 mm-deep well ZBH holder and scanned for XRD 12 times during an 85 hours period of ambient air exposure. All of the 12 datasets were obtained from a 10°-90° scan followed by high resolution scans of the (002), (004), (006), and (008) peaks. The sample surface turned dark, but remained intact during data acquisition.

Table 2 shows the 12 datasets of lattice parameter "c", the (002) width (FWHM), and the relative (002) peak height acquired during the course of the 85 hours of ambient air exposure. These values were obtained from the XRD data scanned at 0.005° per step. The "c" lattice parameter and the FWHM relative accuracy were estimated to be, respectively, 0.0002 Å and 0.002° with these scans which were longer in duration and to higher angles than data previously discussed. It can be seen that both the height and the width of the (002) peak continue to decrease throughout the process, indicating a decrease of the crystalline content in the sample. It appears that water absorbed by (and possibly intercalated into) the sample, causing some crystallites to become amorphous, and the reaction would continue for several days or more.

TABLE 2 c parameter, (002) peak width and (002) peak height of an intercalated hBN A3 (Table 1 and FIG. 2) in 85 hrs during which a sample was exposed to the ambient air. The humidity histogram of the air is included. The sample had been stored in dry air for 123 days at the beginning of this experiment. Error is estimated to be ±0.0002 Å for lattice parameters and ±0.002 for FWHM values.

| XRD scanning dataset | Total ambient exposure time at the beginning and the end of the scanning (hr) | | relative humidity at the beginning and the end of the scanning (%) | | Lattice Parameter from the scanning dataset c (Å) | FWHM from the scanning dataset (deg) | Relative (002) peak height |
|---|---|---|---|---|---|---|---|
| | beginning | end | beginning | end | | | |
| Pure hBN reactant | — | — | — | — | 6.6585 | 0.014 | — |
| 1 | 0.03 | 2.2 | 15 | 16 | 6.6585 | 0.064 | 1.00 |
| 2 | 2.2 | 4.3 | 16 | 17 | 6.6581 | 0.066 | 0.90 |
| 3 | 4.3 | 6.4 | 17 | 18.5 | 6.6580 | 0.066 | 0.89 |
| 4 | 6.4 | 8.6 | 18.5 | 20.5 | 6.6579 | 0.066 | 0.88 |
| 5 | 13.6 | 19.4 | 25.5 | 17.5 | 6.6579 | 0.065 | 0.88 |
| 6 | 24.4 | 30.2 | 14.5 | 14.5 | 6.6579 | 0.062 | 0.84 |
| 7 | 35.2 | 41.1 | 13.5 | 13.5 | 6.6578 | 0.058 | 0.80 |
| 8 | 46.0 | 51.9 | 11 | 13.5 | 6.6582 | 0.053 | 0.74 |
| 9 | 56.9 | 62.7 | 11.5 | 12.5 | 6.6579 | 0.05 | 0.67 |
| 10 | 67.7 | 73.5 | 11 | 13.5 | 6.6579 | 0.047 | 0.61 |
| 11 | 73.6 | 79.4 | 13.5 | 22.5 | 6.6582 | 0.047 | 0.59 |
| 12 | 79.4 | 85.3 | 22.5 | 31 | 6.6582 | 0.048 | 0.58 |

At the beginning, the c parameter was in a decreasing trend. This trend appeared to be leveled at about 40 hrs of ambient air exposure. This suggests that, among the crystallites in the sample, the hBN crystallites that did not became amorphous during this process of humid air exposure are those with smaller c parameter (and therefore smaller interplanar spacing).

Figure 11:
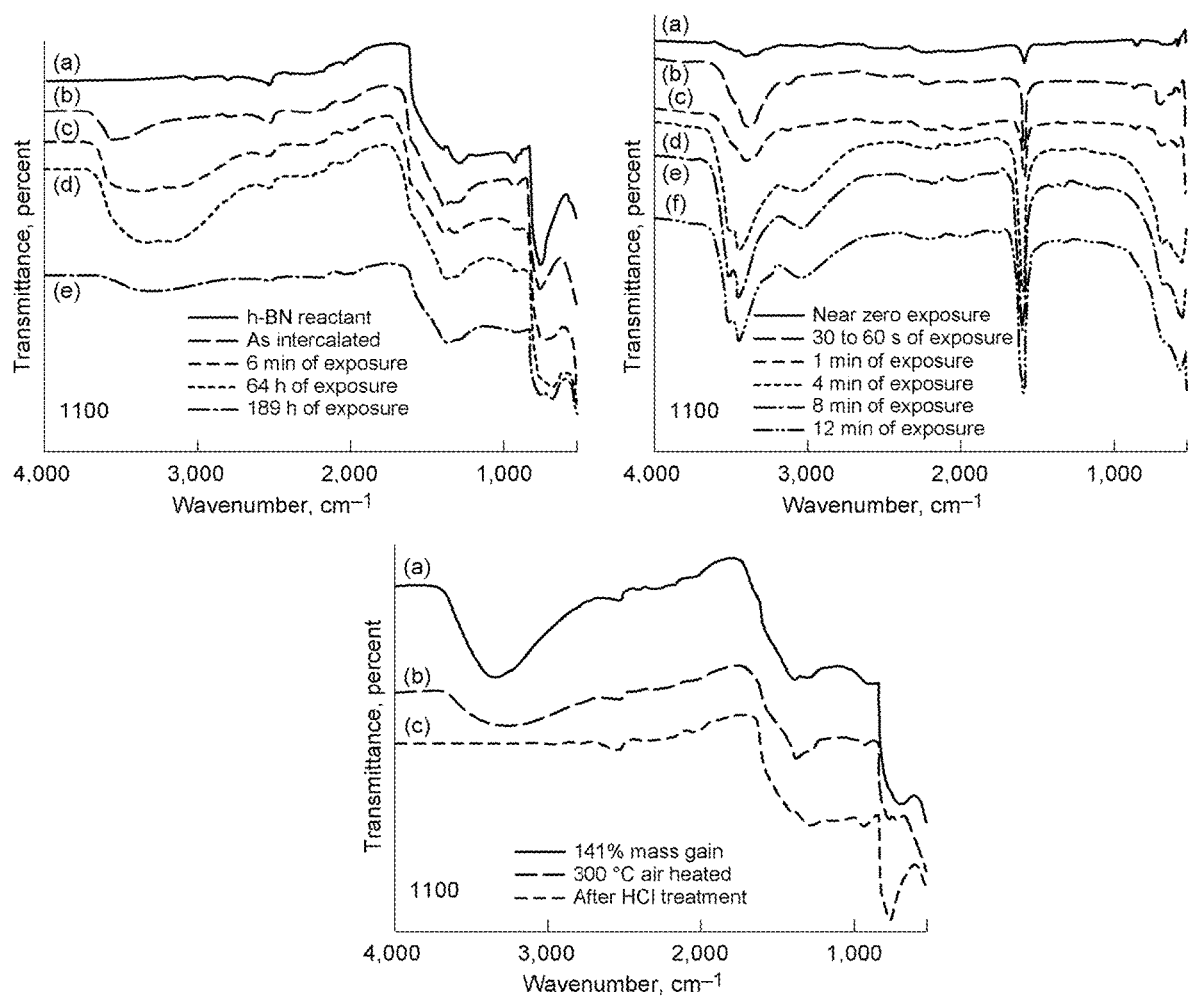
FIG. 11 shows FT-IR of an intercalated product, exposed to ambient air at 15-30% relative humidity for 6 minutes, 64 hrs. and 189 hrs (top left); FTIR of distilled $FeCl_3$ during 12 minutes of air exposure at 44% humidity (top right); and $FeCl_3$ intercalated hBN after sequential treatment of 24 hours air exposure at 100% humidity (141% mass gain), 2 hrs 300° C. air, and 24 hrs room temperature 35 wt % HCl (bottom).

FIG. 11 shows the FT-IR of the same intercalated product (A3 in Table 1), exposed to ambient air at 15-30% relative humidity for 6 minutes, 64 hrs. and 189 hrs., respectively, at 1100. For comparison, the FT-IR of the original hBN reactant and the intercalated product before the ambient air exposure are also included in 1100, and FT-IR of dry (distilled) and wet (ambient-air-exposed) $FeCl_3$ are shown in 1110.

1100 shows the intercalated hBN has 5 prominent FT-IR bands: 750, 1250, 1370, 1600 $cm^{-1}$ bands and a broad 2700-3700 $cm^{-1}$ band. The 1250 and 1370 $cm^{-1}$ bands do not seem to be affected by moisture absorption when exposed to ambient air. The other three bands, on the other hand, have changes in shape/position/size as the intercalated hBN absorb moisture during ambient air exposure. Comparing to these five bands, 1110 shows pure $FeCl_3$ hBN has three prominent FT-IR bands, all of them changes during moisture absorption, and all of them are near the wavenumbers of the three bands in 1100 that changes during moisture absorption. It is therefore believed that the FT-IR changes for the intercalated hBN resulted from moisture absorption, as seen in 1100, are due to the interaction between water and the intercalated $FeCl_3$.

Furthermore, it is observed that the shape/position/size of the three bands in 1100 that changes during moisture absorption have noticeable differences from the three prominent bands in 1110. Their change patterns during moisture absorption were also different. This indicates intercalated $FeCl_3$ is not the same as pure $FeCl_3$, and suggests the possibility that there are interactions between hBN and $FeCl_3$, and their interactions change during moisture absorption.

The double-band near 1600 $cm^{-1}$ (described earlier as the peaks for strained hBN layers and $FeCl_3$, respectively) was again observed in the FT-IR of the intercalated hBN without hydration (curve b of 1100). The fact that this double-band became single after the sample begin to pick up moisture suggests water causes the intercalated $FeCl_3$ to re-arrange during hydration, and hence reduces the internal stress/strain.

After 189 hours of ambient air exposure, both hydration-related bands (2700-3700 $cm^{-1}$ and 757 $cm^{-1}$) were reduced, but the 1280-1380 $cm^{-1}$ band, which were not affected by hydration, did not change much. It appears that water caused some reactions and consequently was consumed. However, no new compounds were detected by FT-IR or XRD during this period.

To further study the effects of water, a new intercalated product (A4 in Table 1) was exposed to 100% relative humidity, room temperature air for 24 hours to gain as much water as possible. The fully hydrated product gained 141% mass and became viscous, paste-like. It was further treated in 300° C. air for 3 hours, and eventually in 35 wt % HCl for 24 hours to remove all intercalates. 1120 shows its FT-IR data and FTIR data of the products obtained during this process. The large quantity of water mass increase was reflected by the complete overlap of the hBN's 760 $cm^{-1}$ band and the hydrated $FeCl_3$'s 679 $cm^{-1}$ band. The water was tightly bounded to the product, as the large and broad water-related 2700-3700 $cm^{-1}$ band could not be completely removed during the subsequent 300° C. air heating. On the other hand, both the intercalation effects and the hydration effects were completely reversed to the states of the original reactant after the final HCl treatment to remove all intercalate.

In summary, upon exposing the hBN intercalated with ferric chloride to ambient air, it adsorbed moisture in air quickly between one or two hours. The moisture in the sample is in the form of iron chloride hydrate (FT-IR data) and is likely to be in the hBN layers (XRD data). The amount of moisture adsorbed depends on the humidity of the air. Data in this research showed 11% mass gain at room temperature and 26-27% relative humidity. Upon continuous ambient air exposure, water in the sample is believed to cause some reactions and consequently was consumed. If the ambient air is close to 100% humidity, the changes are similar in trend, but are extreme. In that case, the adsorbed water was measured to be 141% of the dry mass. During ambient air exposure, the lattice structures change, but are not irreversibly destroyed, as the original hBN's FTIR data can be largely restored by treating this product in 35 wt % HCl.

A sample of an intercalated product (A3 in Table 1) was scanned for XRD immediately after it was synthesized. Two samples of the same product were stored in dry air for 23 days and 185 days, respectively, and then scanned. Table 3 shows the lattice c parameter and the peak width resulted from these three scans. It appears that the intercalated hBN underwent a slow change in dry air. The mass data, however, shows the changes in the chemical compositions during this period were within the experimental error.

TABLE 3

Table 3: c parameter and (002) peak width of an intercalated hBN A3 (Table 1 and FIG. 2) measure at three different storage times during which the samples were in dry air. The samples were prepared in ambient air for about 5 minutes before XRD scanning. Error estimated to be ±0.0005 Å for lattice parameters and ±0.01° for FWHM values.

| XRD scanning dataset | Storage time (days) | Lattice Parameter from the scanning dataset c (Å) | FWHM from the scanning dataset (deg) |
|---|---|---|---|
| Pure hBN reactant | — | 6.6585 | 0.01 |
| 1 | 0 | 6.6565 | 0.05 |
| 2 | 23 | 6.6584 | 0.06 |
| 3 | 123 | 6.6585 | 0.06 |

Figure 12:
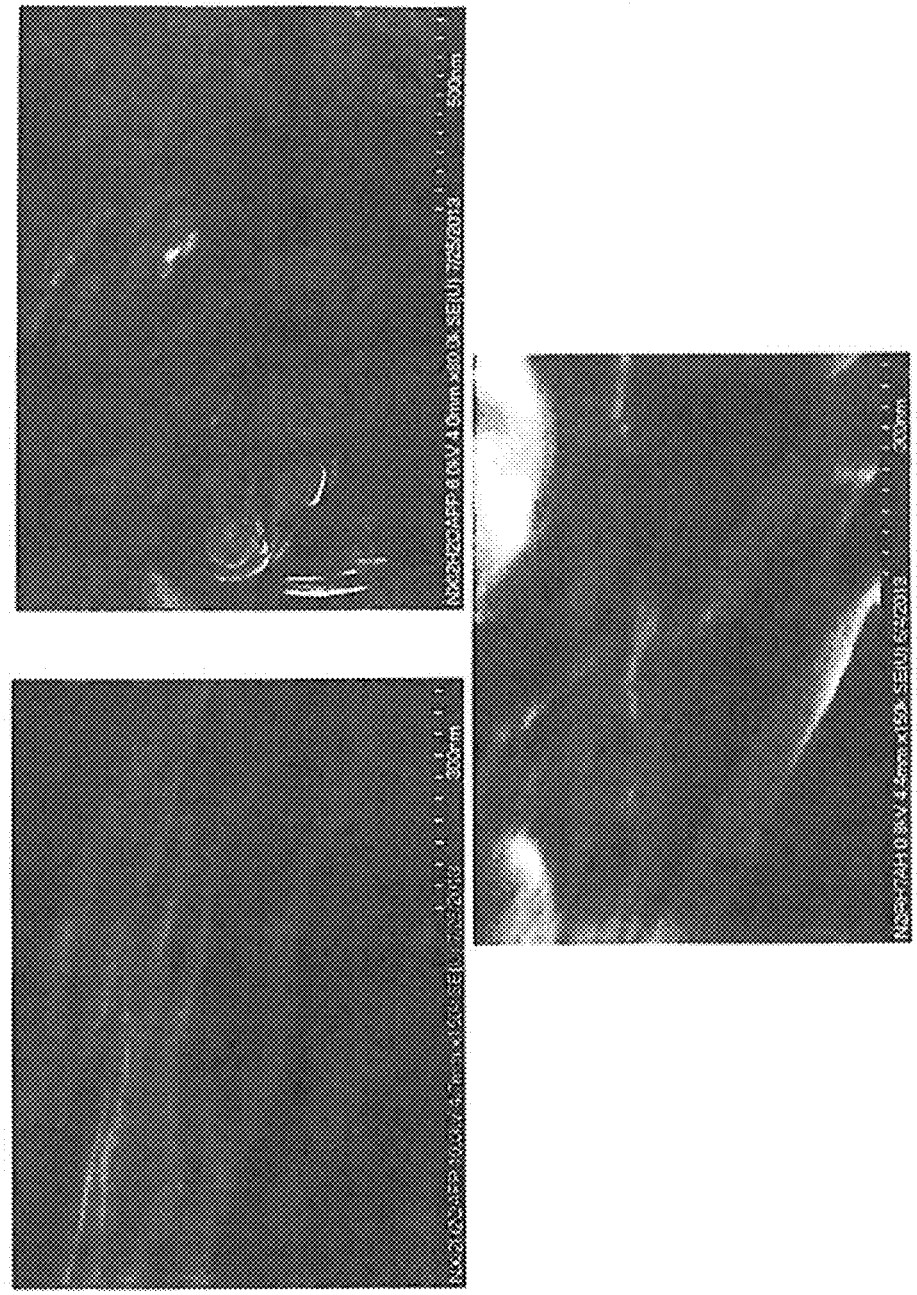
FIG. 12 illustrates an exfoliated sample resulting from small hBN platelets intercalated and then hydrated in 100% relative humidity.

For additional exfoliation, more water can be added into the intercalated products, the intercalated-hydrated product can be heated to higher temperature at higher rate, and more cycles of intercalation-hydration-heating can be conducted for exfoliation. In addition, smaller platelets, with fewer layers and less area to split, may exfoliate more extensively than the larger ones. To test these suggestions, the intercalated small platelet hBN (A5 in Table 1) was exfoliated, rinsed, intercalated again, hydrated, exfoliated again, and then rinsed with HCl according to reactions (2), (3), (6), (7) and (5). For high heating rate, the exfoliation was conducted by heating the sample at 750° C. where both the furnace and the sample holder were preheated. For high degree of hydration, the sample was placed in 100% relative humidity environment for 7.5 hours, resulting in 36.4% mass gain. The final product, seen in the three images of FIG. 12, was the most extensively exfoliated so far in this research. Observing from the FeSEM operated at 6 KV, all hBN platelets that can be examined for exfoliation show that the exfoliated layers are about 20 nm thick or less.

Figure 13:
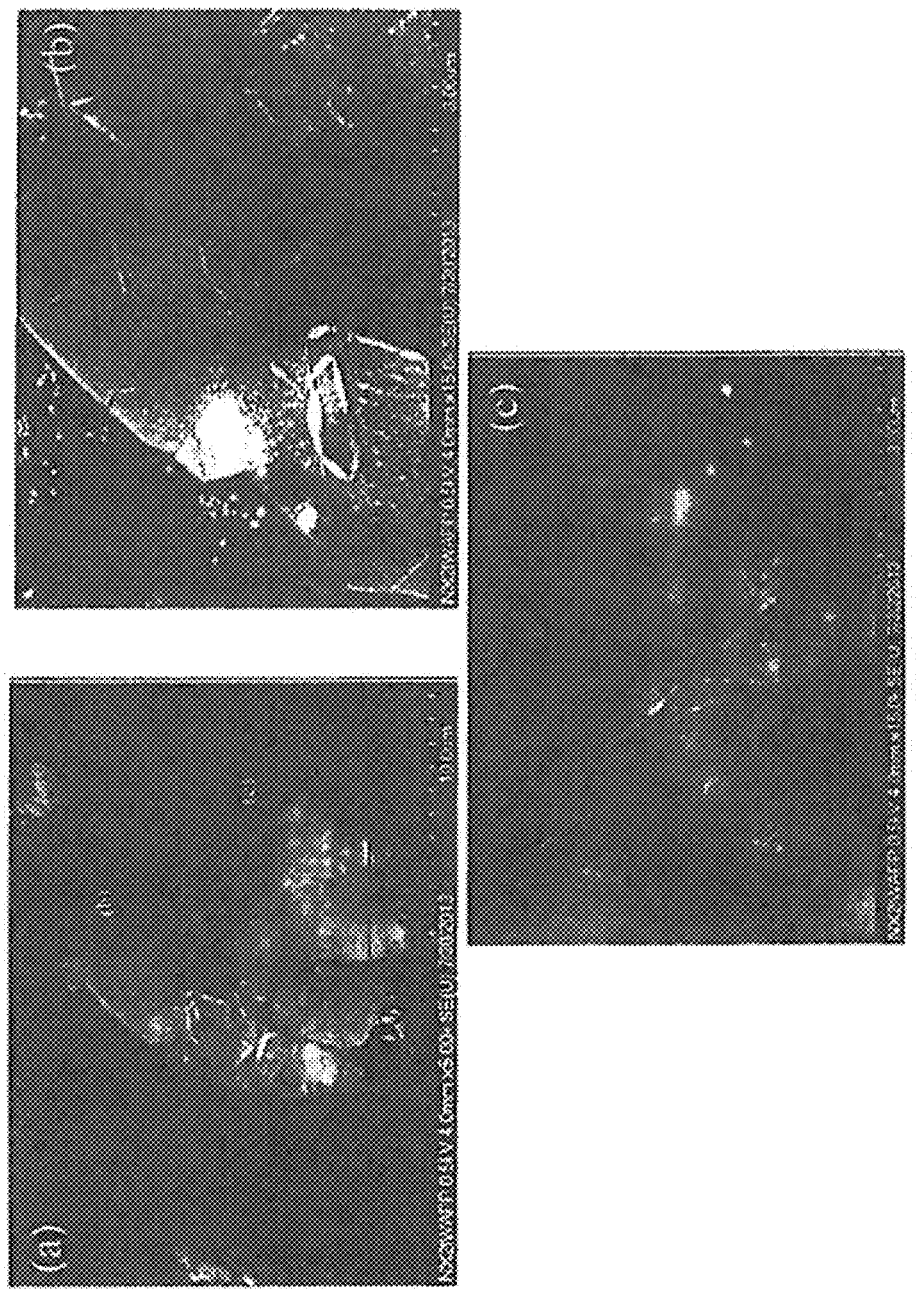
FIG. 13 illustrates a top view of an image of an exfoliated platelet, obtained by SEM operated at 0.5 KV, showing semi-transparent layers of hBN.

Using carbon adhesive tape, a sample was peeled and examined under FeSEM at 0.5 KV. The top view of an exfoliated platelet, seen in FIG. 13, showed multiple semi-transparent layers. Based on the Kanaya-Okayama penetration depth formula, the total thickness of the multiple semi-transparent layers need to be less than 5.5 nm in order to let the 0.5 KV electrons give them a semi-transparent appearance (Let the average atomic weight (A) be 12.5, atomic number (Z) be 6, and density ($\rho$) be 2 gm/cm$^3$ in the formula H=0.0276 A V$^{1.67}$/(Z$^{0.89}$$\rho$), for the hBN, where H and V are penetration depth in μm and voltage in KV, respectively. The electron need to travel through the layers, hit the subject underneath, and travel through the layers back to be detected in order to give the layers a semi-transparent appearance in SEM photo.).

Producing even thinner exfoliated layers or nanosheets can be achieved with additional cycles of intercalation/exfoliation.

In summary, the first experiment involved treating a mixture of hBN, FeCl$_3$ and NaF at 290-355° C. in nitrogen environment, and examining the resulting product. The changes of the lattice parameter, the widening of the hBN (002) peak in XRD, the shape/size changes of hBN's peak in FT-IR at 1383 cm$^{-1}$ and 1277 cm$^{-1}$, the appearing of new FT-IR peaks at 2700-3700 and 1600 cm$^{-1}$, the mass increase data, the observed iron distribution in pictures and EDS of SEM, and the fact that the hBN can be exfoliated to 20 nm after treating this product to 750° C. heating, collectively make a strong case that FeCl$_3$ was located between the hBN layers in this product. In other word, the hBN was likely intercalated with FeCl$_3$. The fact that these changes were extended, and exfoliation was enhanced after the product adsorb moisture from air suggest the adsorbed water was also intercalated into the hBN layers.

The shape changes of hBN's broad FT-IR band (peaked at 1277 cm$^{-1}$) and the appearing of the new band at 1600 cm$^{-1}$ were observed. The new FT-IR band at 2700-3700 is similar to pure FeCl$_3$'s FT-IR band at the same wavenumber range. However, some of their differences suggest the intercalated FeCl$_3$ is different from the pure one, and there are hBN-FeCl$_3$ interactions in the intercalated product. Overall, the FT-IR data suggests a change in hBN's chemical properties. In various embodiments of the subject innovation, these new chemical properties can be employed to make products such as composites with special electrical, thermal and mechanical properties.

In various embodiments, intercalates other than FeCl$_3$ can be used. This can include AlCl$_3$, CuCl$_2$, MoCl$_5$, SnCl$_4$ (and other metal chlorides), and many others that either are known intercalates for carbon or can be wetted by hBN at their molten states. It is to be appreciated that the examples provided herein are for purposes of illustration, and not to limit the scope of the innovation. In various embodiments, selected chemicals for intercalation can include most any of those discussed herein.

Variations and combinations of the reactions (1) to (7) can result in a large number of different products. An example of the "variations and combinations" of the chemicals and chemical reactions is described in connection with a second set of experiments, where exfoliated hBN containing aluminum oxide was produced. Some of the nanosized aluminum oxide particles were seen to be between the exfoliated BN layers.

Although one example (reactions (8) through (16)) is provided below, multiple variations can result in aluminum oxide dispersed in exfoliated boron nitride. Additionally, hot pressing of this product of aluminum oxide dispersed in exfoliated boron nitride at 1500-2000 C can result in a ceramic composite that is a highly thermally conductive electrical insulator. In accordance with various aspects, the subject innovation can comprise aluminum oxide intercalated in boron nitride, dispersed in exfoliated boron nitride, or a ceramic composite formed from the same.

Below are example series of reactions (8)-(16) used in connection with the second experiment that can produce aluminum oxide dispersed in exfoliated boron nitride in accordance with aspects of the subject innovation:

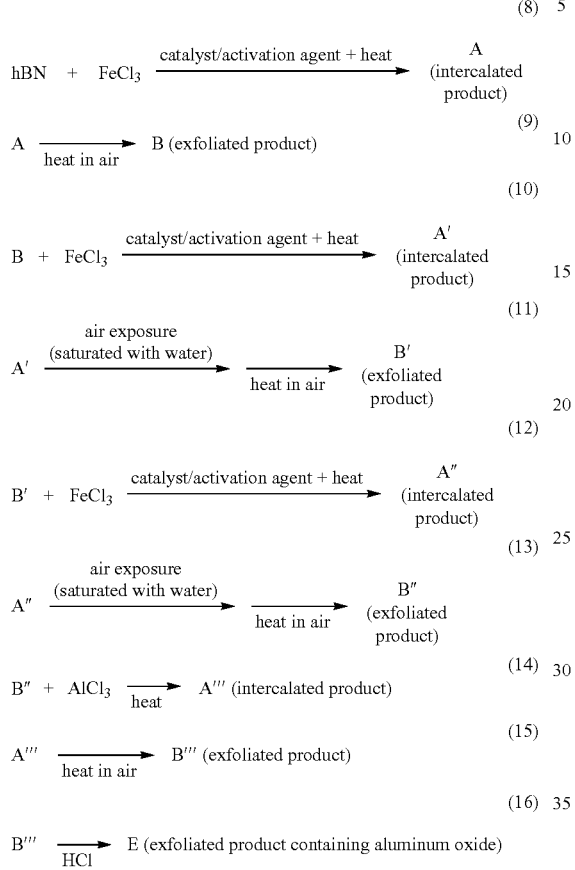

Figure 14:
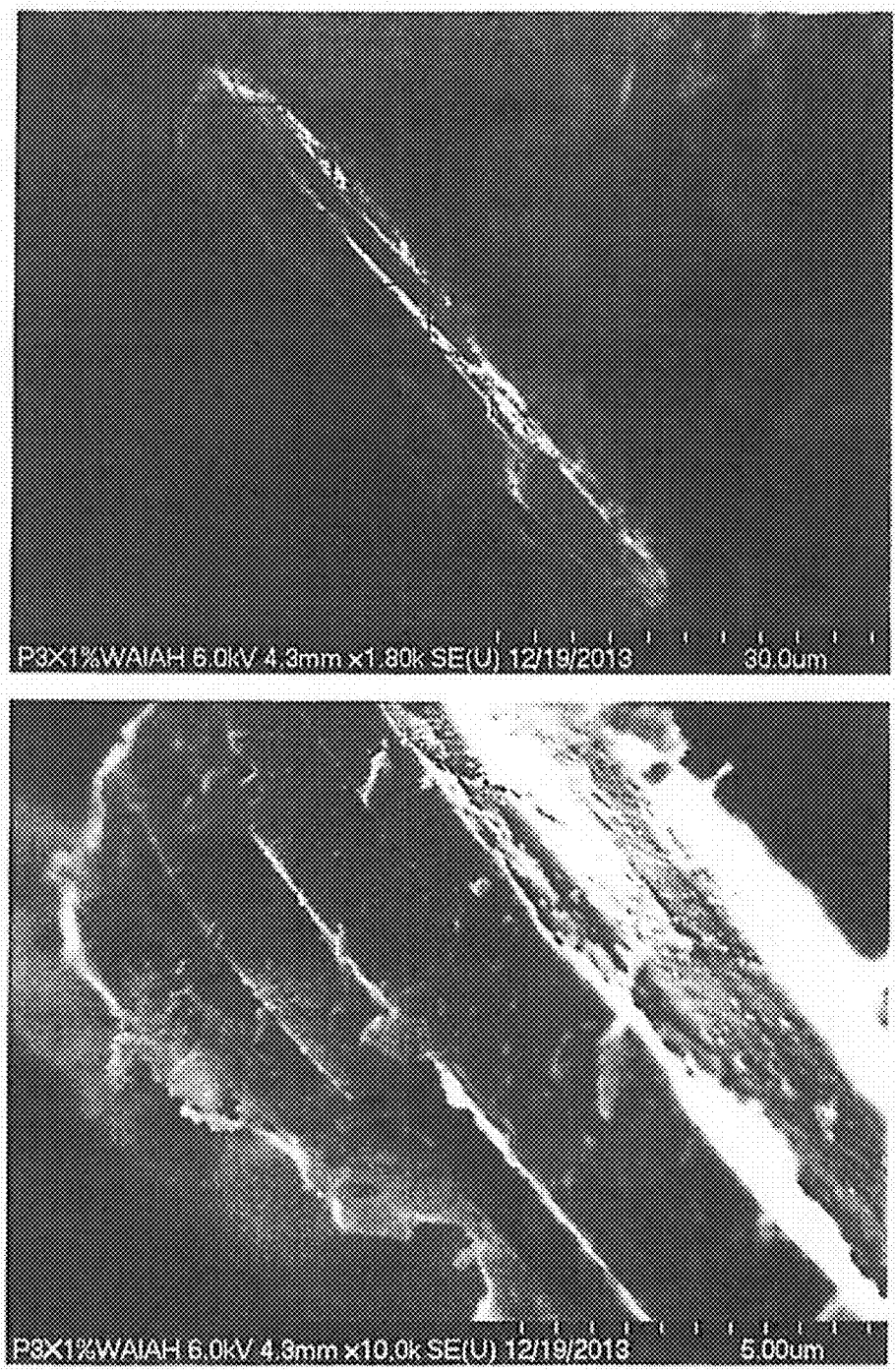
FIG. 14 illustrates SEM images of an exfoliated product containing aluminum oxide.
Figure 15:
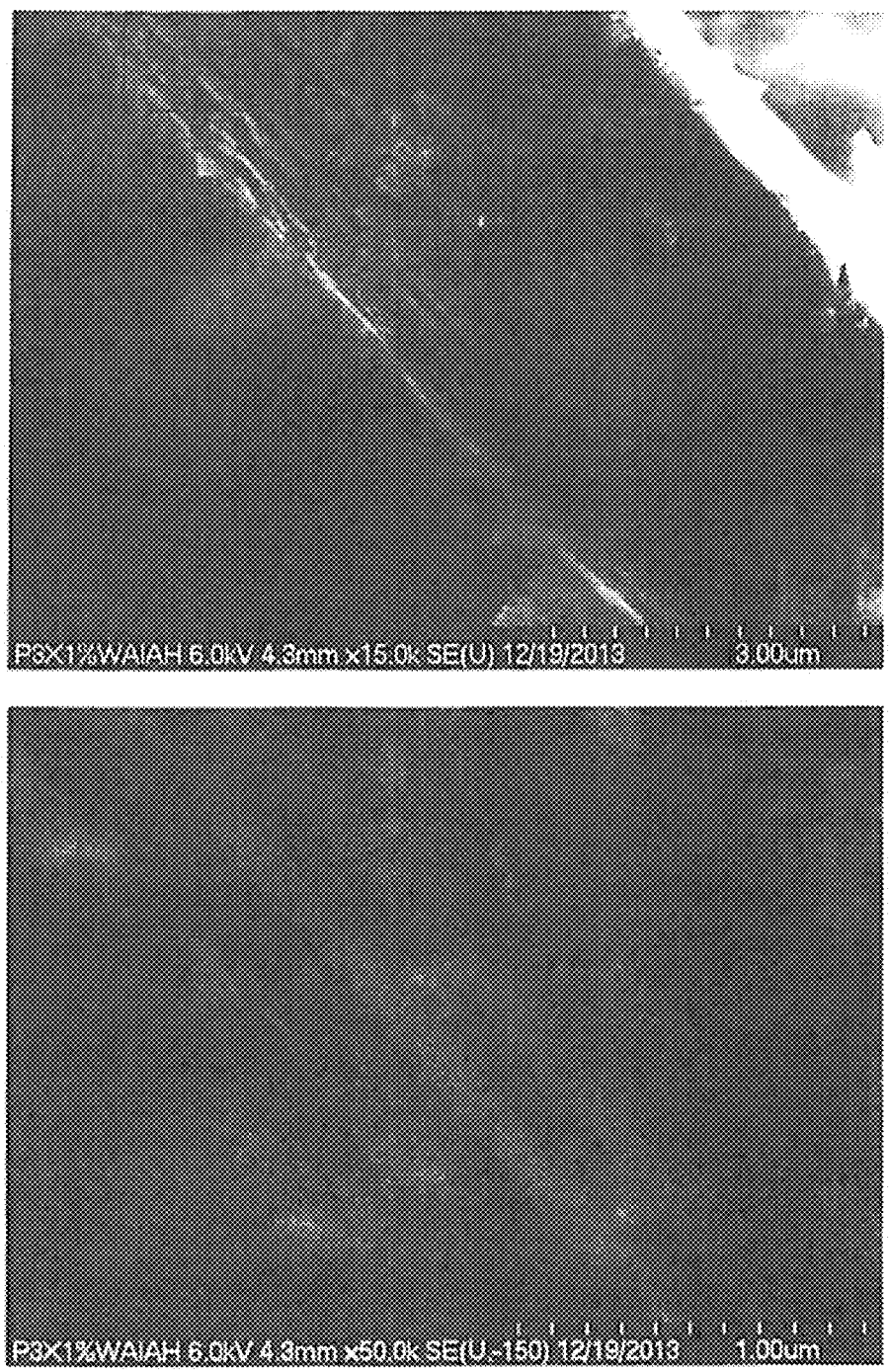
FIG. 15 illustrates additional SEM images of an exfoliated product containing aluminum oxide.

In the example experiments conducted in connection with reactions (8) through (16), the catalyst was NaF. The heat during intercalation with FeCl₃ was in nitrogen at 250-400° C. range, and the heat during intercalation with AlCl₃ was in nitrogen at 130-240° C. range. The heat in air during exfoliation was done by placing samples (with sample holder at room temperature) in a furnace that was preheated to 750° C. Air exposure with saturated water vapor was done at room temperature, where samples were in a closed container containing some liquid water. B, B' and B" above were BN containing iron oxide, and B'" was BN containing aluminum oxide and iron oxide. Because HCl dissolves iron oxide, but not aluminum oxide, the iron oxide was removed during (16), but the aluminum oxide remained. FIG. 14 shows two SEM images of the final product E, with the second image corresponding to the boxed region 1410 in the upper image; FIG. 15 shows two additional images of the final product, with the upper image corresponding to the boxed region 1420 of FIG. 14, and the lower image corresponding to the boxed region 1510. The lower image of FIG. 15 is a backscattered picture that shows aluminum as bright and BN as dark, and also shows the BN's exfoliate layers that cannot be seen in the top image of FIG. 14. The dispersed aluminum oxide within the BN layer can be clearly seen in the lower image of FIG. 15.

In another portion of the second set of experiments, the following reactions were used to create hBN with an aluminum oxide coating:

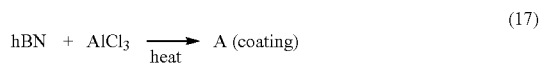

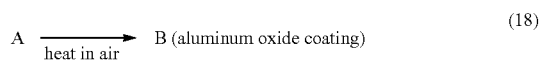

The heat with AlCl₃ was in nitrogen at 130-240° C. range, and the heat in air during exfoliation was done by placing samples (with sample holder at room temperature) in a furnace that was preheated to 750° C. The AlCl₃ contained water (0-5% mass) in the experiment that gave the product (BN with aluminum oxide coating).

Figure 16:
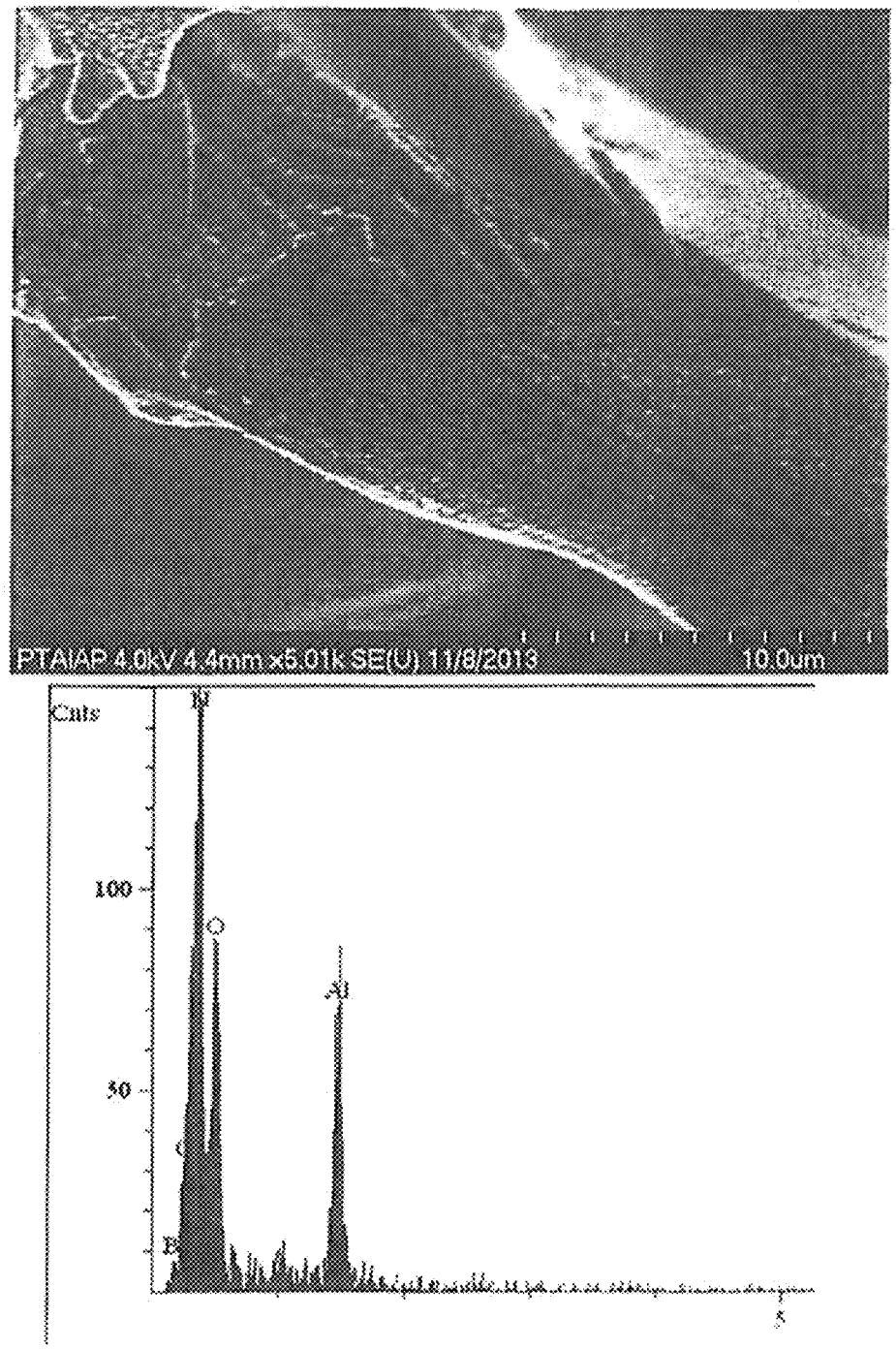
FIG. 16 shows an SEM of nanosized aluminum oxide coating on hBN, top, and an EDS (Energy-dispersive X-ray spectroscopy) graph showing the coating is aluminum oxide.
Figure 17:
FIG. 17 shows two additional SEM images of the nanosized aluminum oxide coating on hBN.

FIG. 16 shows an SEM of nanosized aluminum oxide coating on hBN, top, and an EDS (Energy-dispersive X-ray spectroscopy) graph showing the coating is aluminum oxide. FIG. 17 shows two additional SEM images of the nanosized aluminum oxide coating on hBN, a top view (above) and a side view (below).

In a third set of experiments, intercalation and exfoliation of MoCl₅ in hBN was explored, partly to test and demonstrate the range of intercalates that can be used with hBN, and partly to produce material useable to create boron nitride-molybdenum-oxygen nanocomposite articles. The following reactions were used in these experiments:

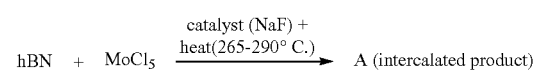

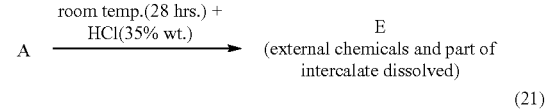

Figure 18:
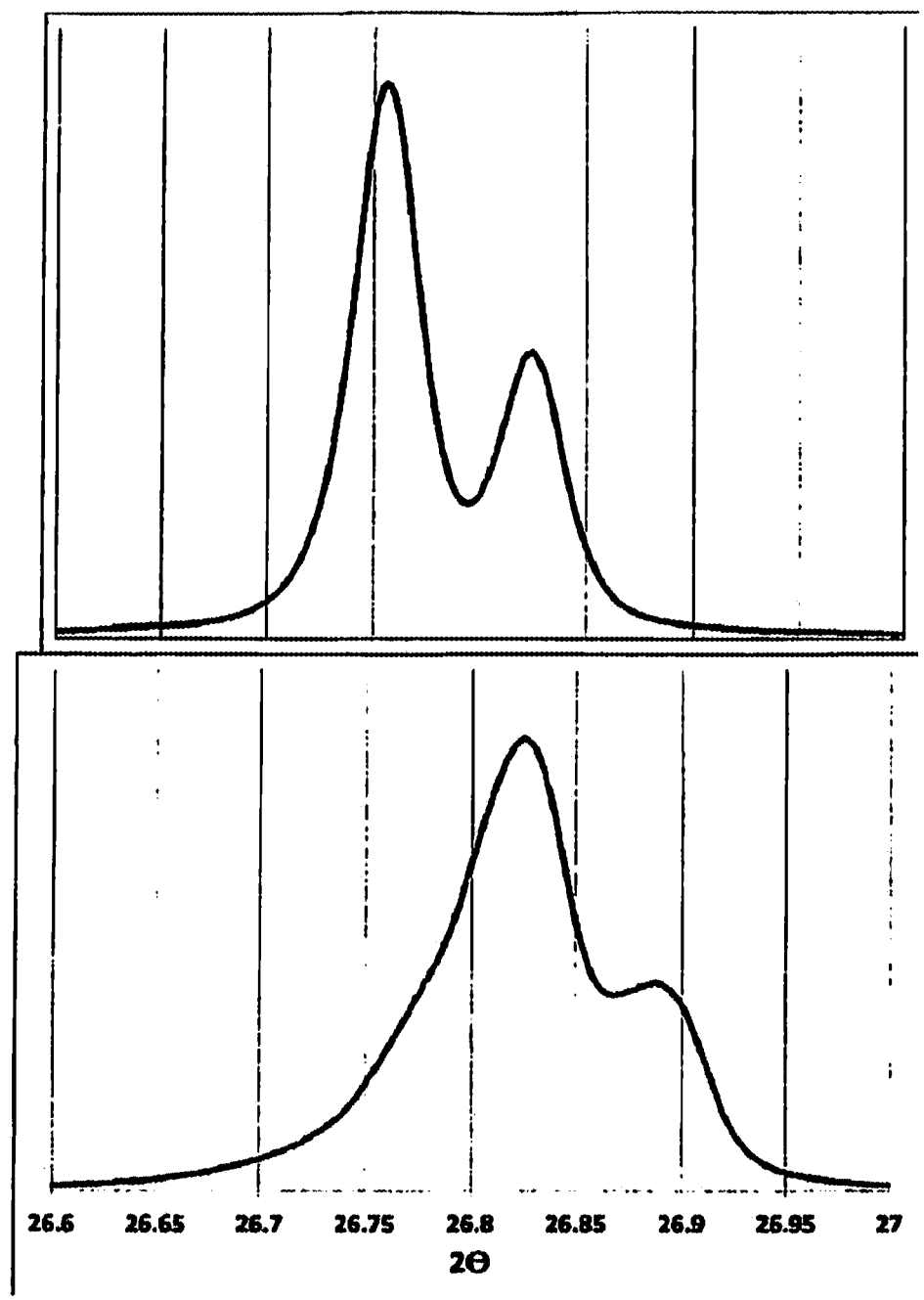
FIG. 18 shows XRD graphs of an original sample of hBN and molybdenum pentoxide intercalated hBN.

Starting from a sample of large hBN particles (20-80 μm wide and 5-10 μm thick platelets), the molecular structure of the product A (in reactions (19)-(21)) changed so significantly that the x-ray diffraction (XRD) (002) peak position shift and peak width increase can be visually observed in FIG. 18, showing the original hBN in the upper graph, and the product A in the lower graph. Exfoliation of a platelet (in product E in the above formula) can be observed in the SEM images in FIG. 19. The upper image shows the MoCl₅ intercalated hBN after HCl treatment, showing some layer split even before normal exfoliation treatment. Backscattered electrons were used for this image; the brighter regions contain more molybdenum and less boron nitride and the darker regions contains contain less molybdenum and more boron nitride.

Figure 19:
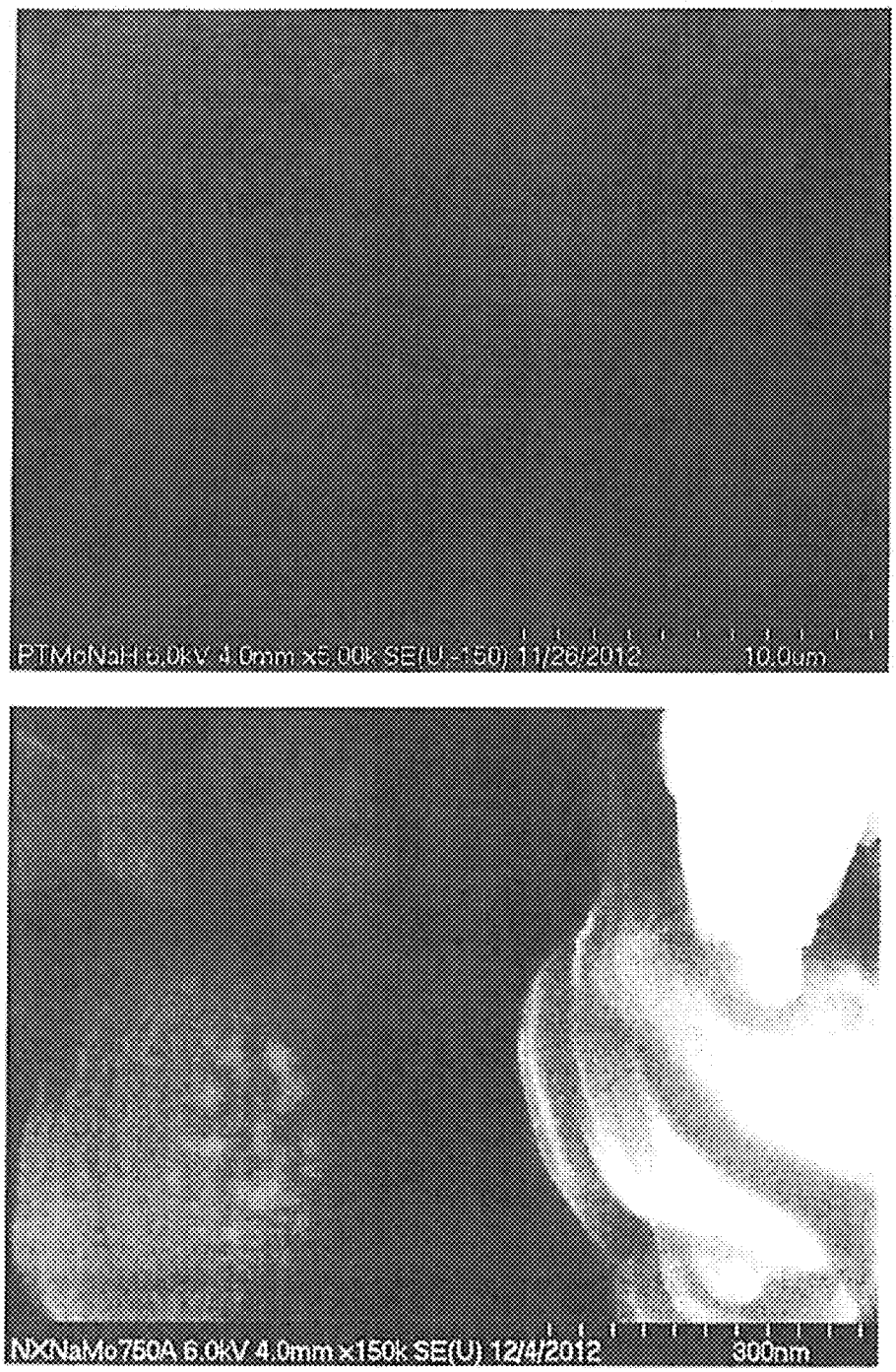
FIG. 19 shows SEM images of an exfoliated platelet made by molybdenum pentoxide intercalation and heating molybdenum pentoxide intercalated hBN in air.

Starting from a sample of small hBN particles (200-800 nm wide 80-200 nm thick platelets), the lower SEM image in FIG. 19 shows the product B (in the above formula) was exfoliated to 10 nm or less. It is noted that this product ("B" in reaction (21)) was nearly pure by energy dispersive spectrum (EDS). Apparently, rapid heating at 750° C. air caused almost all of the molybdenum chloride to be evaporated before it could be oxidized. This is unlike iron chloride or aluminum chloride, both of which were mostly oxidized under the same condition before they could be evaporated.

Figure 20:
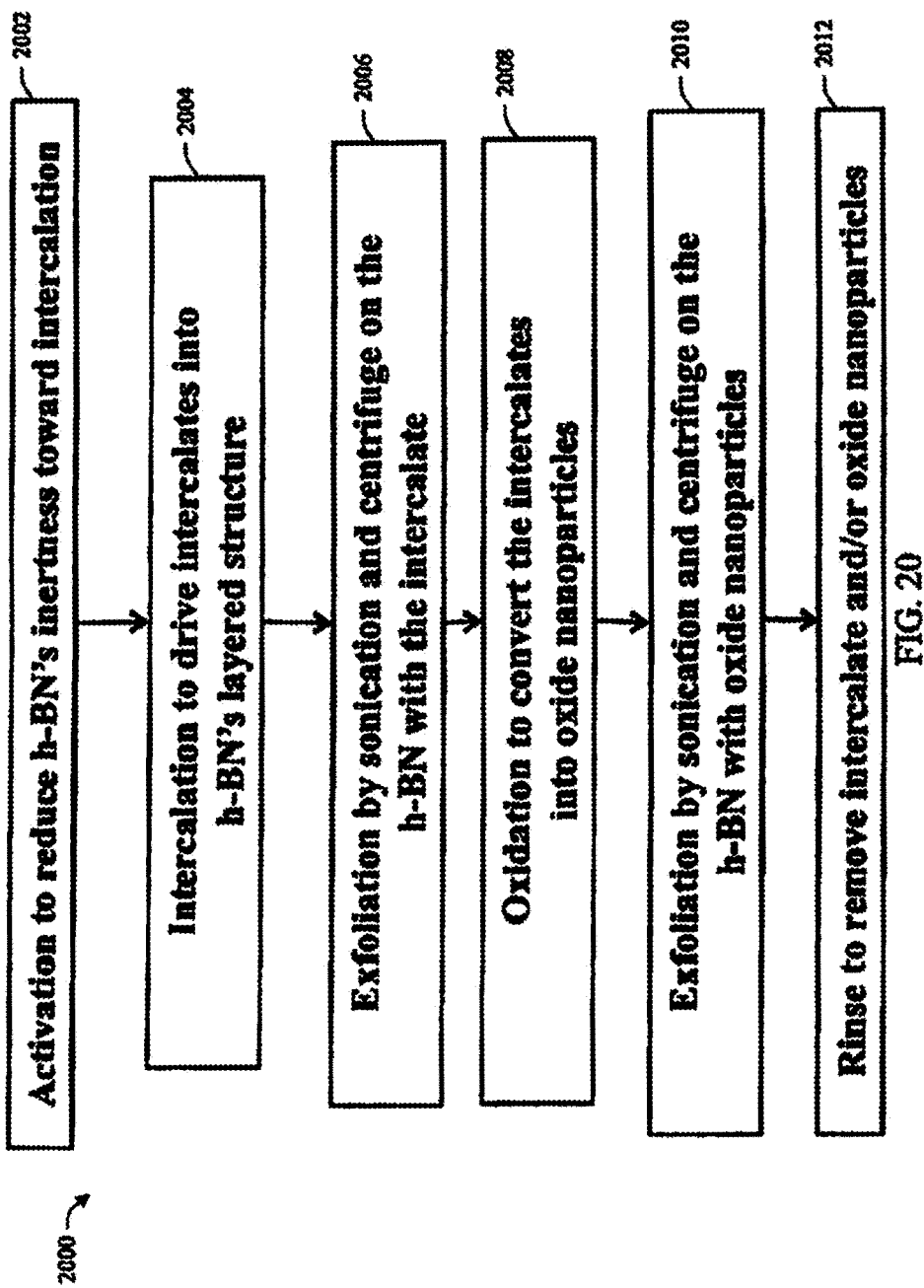
FIG. 20 illustrates a method of intercalation and exfoliation of hBN employed in connection with a set of experiments discussed herein.
Figure 21:
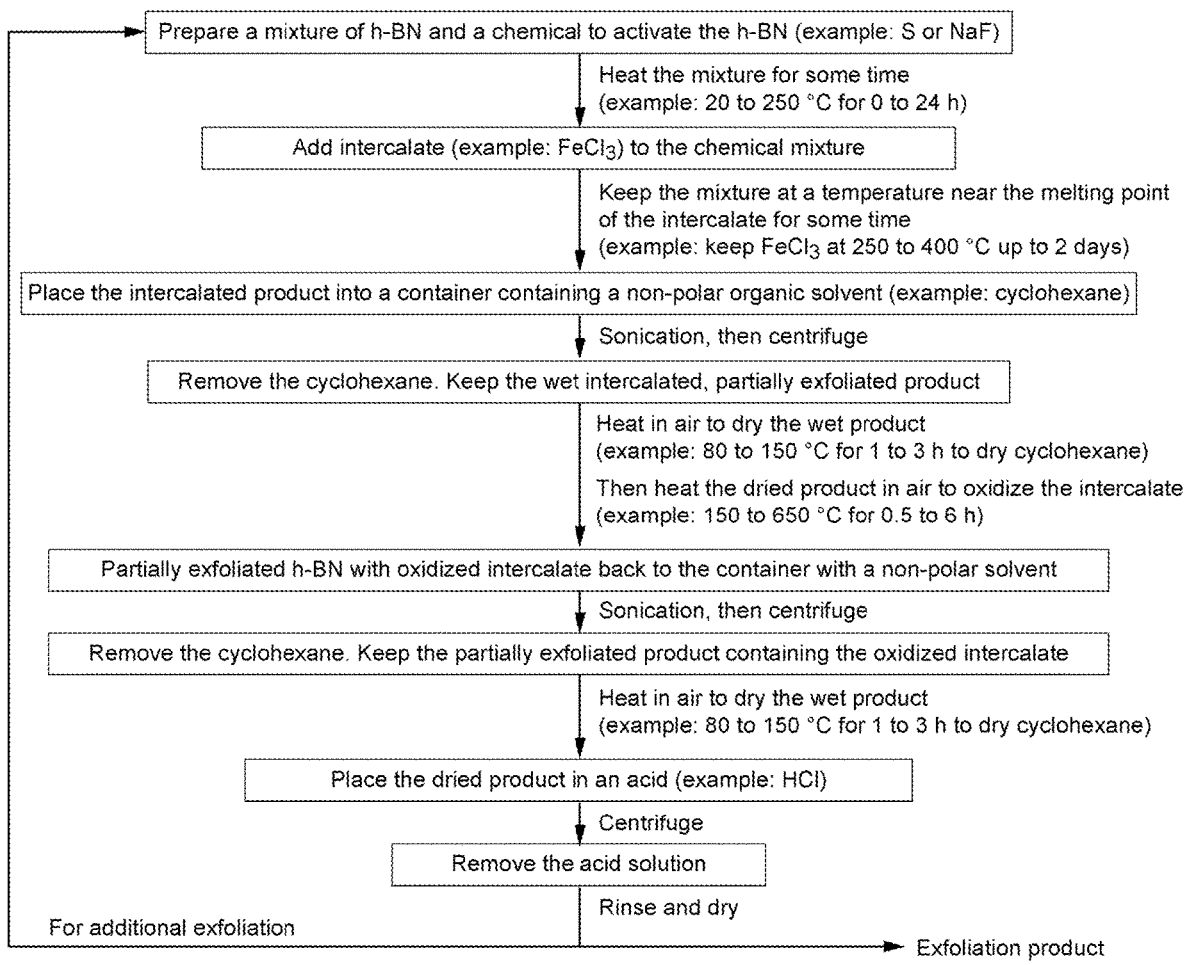
FIG. 21 illustrates another method employed for intercalation and exfoliation in connection with experiments discussed herein.

FIG. 20 illustrates a method 2000 of intercalation and exfoliation of hBN employed in connection with a fourth set of experiments. The method can begin at 2002 with activating a sample of hBN (e.g., with NaF, S, etc.) to reduce its inertness toward intercalation. At 2004, the method can continue with intercalating the hBN with one or more intercalates, such as the metal chlorides discussed herein (e.g., iron, aluminum, molybdenum, etc.), for example, by heating the hBN, activating agent, and material selected for intercalation for a first period of time (e.g., at a temperature and for a time that can depend at least on the material selected for intercalation, as described above). Next, at 2006, the intercalated hBN can be exfoliated, such as by rapid heating, sonication, etc. At 2008, the intercalates can be oxidized to convert them to oxide nanoparticles, and at 2010, further exfoliation can be employed (e.g., as described herein, etc.), followed at 2012 by rinsing the exfoliated material to remove intercalate and oxide nanoparticles. FIG. 21 illustrates another method 2100 that was employed for intercalation and exfoliation in connection with experiments discussed below.

In the fourth set of experiments, hBN was intercalated with $FeCl_3$, and then exfoliated via sonication. Although sonication was used in this set of experiments, and heating used in those listed above, in various embodiments, heating, sonication, etc., or any combination thereof can be employed. A mixture of highly crystallized commercial hBN (about 20-80 μm in diameter and 5-20 μm thick), NaF and $FeCl_3$ was placed in a tube. The mass ratio of these three chemicals was 1:0.12:2.7, respectively. The mixture was heated to 315° C. for about 12 hours and then 340° C. for 2 hours. Since the boiling point of $FeCl_3$ is 315° C., the excess $FeCl_3$ was evaporated from the sample. The product was approximately 180% of the original boron nitride mass, and was brownish yellow in color.

Figure 22:
FIG. 22 illustrates an SEM picture of a final product of this process, in which exfoliation of hBN can be seen.
Figure 23:
FIG. 23 illustrates an SEM image at 1 kV showing some BN layers that were semi-transparent or almost invisible.

The intercalated product (A1 in Table 1) was sequentially treated for the purpose of exfoliation (i.e., split the boron nitride layers) by removing the inserted chemicals (i.e., deintercalation, where intercalates exit the boron nitride layers). This was done as follows: (1) sonicated in $C_6H_{12}$ for 6 hours, then centrifuged at an acceleration of 2250 times that of gravity (i.e., 2250G); (2) dried and heated in 150° C. air; (3) sonicated in $C_6H_{12}$ again for 6 hours, centrifuged under the acceleration of 2250G, dried; (4) heated in 450° C. air for 5.5 hours; (5) sonicated in $C_6H_{12}$ for a third time for 6 hours, centrifuged under the acceleration of 2250G, dried; and (6) rinsed in HCl and water. After this series of treatment, the sample became white in color. EDS data from SEM's energy dispersive spectrum showed it contained only boron and nitrogen, indicating complete removal of the inserted chemicals. The XRD for samples at different stages of this series of treatments showed that the overall XRD changes during the entire series of treatments was narrower peaks for (002) and (100), larger peaks for (002) with the changes of (001) peak heights complicated but not obvious. Overall, this indicated changes of boron nitride lattice structure during the removal of the non-boron nitride chemicals. FIG. 22 shows an SEM picture of a final product of this process, in which exfoliation of hBN can be seen. FIG. 23 shows an SEM image at 1 kV showing some BN layers that were semi-transparent or almost invisible. These exfoliated layers were made according to the intercalation-sonication-rinse process described above, but from a different kind of commercial hBN as the starting reactant (about 10-20 μm diameter and >2 μm thick). For BN exfoliated layers to be semi-transparent to electrons at this voltage, their thickness needs to be about 20 nm.

In a fifth set of experiments, intercalation and exfoliation of hBN by $FeCl_3$ activated by fluoride agent other than NaF was explored. This is to test and demonstrate the range of activating agent that can be used with hBN for intercalation and exfoliation. Three reactant mixtures were placed side by side and treated for intercalation and exfoliation simultaneously. For all 3 mixtures, the mass ratio of $FeCl_3$ to hBN are about 4.5 to 1. Their hBN to activating agent (LiF, NaF or KF) mass ratio in the reactant mixture were adjusted such that their molar ratios were the same, about 1.1 to 1. The products were examined by XRD (x-ray diffraction). Based on SEM pictures as well as changes of hBN's XRD peak heights, widths and positions resulted from intercalation reactions, it is concluded that all of them (LiF, NaF and KF) have the activating effects on intercalation of hBN by $FeCl_3$, and KF has more activating power than NaF, which has more activating power than LiF.

Figure 24A:
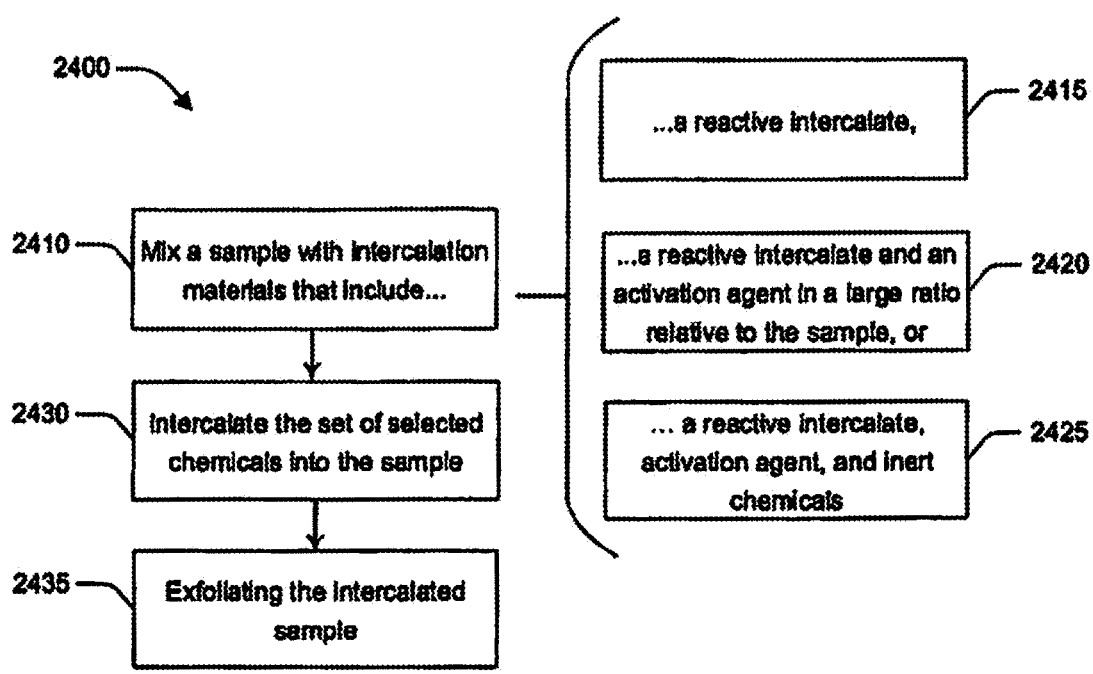
FIG. 24A illustrates one embodiment of a method that can facilitate intercalation and exfoliation of a starting reactant in accordance with aspects of the subject innovation.

FIG. 24A illustrates a method that can facilitate intercalation and exfoliation of a starting reactant in accordance with aspects of the subject innovation. At 2410, a sample of a starting reactant is mixed with intercalation materials. The starting reactant is selected based on the desired properties of the layered structure that results from the sample being subjected to the intercalation-exfoliation process. For example, hBN may be selected as the starting reactant if white graphene is the desired result. Alternatively, boron nitride nanotubes may be used as the starting reactant if the desired result is a layered structure having nanoribbons. Again alternatively, hBN intercalated with $FeCl_3$ and then exfoliated at high temperature air, such as B" in Reactions (13) and (14) described earlier, may be used as the starting reactant if the desired result is a layered structure where individual layers (i.e., boron nitride nanosheets) separated by alumina and $Fe_2O_3$ particles (B''' in reaction 15)

The starting reactant is mixed with intercalation materials. The intercalation materials include a selected set of chemicals for intercalation, such as a reactive intercalate, an activation agent, and or inert chemicals. The selection of the selected set of chemicals for intercalation, the activation agent, and the inert chemicals, as well as the ratios of the intercalation materials are provided in will change the physical properties of the resulting layered structure. Accordingly, the selections of the intercalation materials and ratios are based on the application of the layered structure.

For example, at 2415 the intercalation materials include a reactive intercalate. A reactive intercalate can be selected such that an activation agent does not need to be added to the mixture. For example, the reactive intercalate may be wet aluminum chloride, $AlCl_3$ containing moisture picked up from air, making an activation agent unnecessary. Using a reactive intercalate without an activation agent changes the intercalation process (e.g., limit intercalation at the surface of the starting reactant, add wait time for intercalation, operate at a different temperatures, etc.).

In the example, in which the reactive intercalate is aluminum chloride containing water about 0.3 to 3% of the aluminum chloride mass. Too much water may stop the process of intercalation, and result in separate phases of aluminum oxide and hBN platelets of the sample without coating (i.e., intercalation at hBN surface only). Too little water may result in the aluminum chloride evaporating instead of the hBN platelets being coated.

The selection of intercalation materials may also affect how the intercalation materials are mixed with sample. For example, using a reactive intercalate may change the temperature at which the intercalation materials are mixed with the sample. Mixing the sample with aluminum chloride containing 0.3-3% water may involve mixing well and keeping the mixture at a temperature below 100° C. for some time before heating. For example, the mixture may be mixed well and kept at near room temperature overnight before heating to 130° C. and higher. This was done earlier (reactions (17)) without the detailed process description shown here (above 4 paragraph). After subsequent heating at 750° C. in air, (reaction (18)), SEM pictures of the product thus obtained (FIGS. 16 and 17) show this process produced most complete alumina coating on the sample.

At 2420, the intercalation materials includes a reactive intercalate and activation agent in a large amount relative to the amount of the starting reactant. In Table 1, the mass ratio of the activation agent, NaF, to the sample, hBN, is shown to be in a range 0.1 to 0.2. However, that ratio can be increased tenfold causing the nanosheets of the layered structure to be more separated and visualized more clearly. This can be seen by comparing the SEM picture in FIG. 25 (NaF/hBN mass ratio 1.5) to that in FIG. 8A (NaF/hBN mass ratio 0.15).

At 2425, the intercalation materials includes a reactive intercalate, an activation agent, and inert chemicals. The inert material is included in the mixture so that the layered structure will have specific physical properties. After the intercalation-exfoliation process, the inert material is present between the individual sheets of sample material in the layered structure. Accordingly, the layered structure is imbued with the physical properties of the inert materials. For example, the inert substance may be titanium dioxide, which has a high dielectric constant. Accordingly, the resulting layer structure would have a high dielectric constant.

Figure 26:
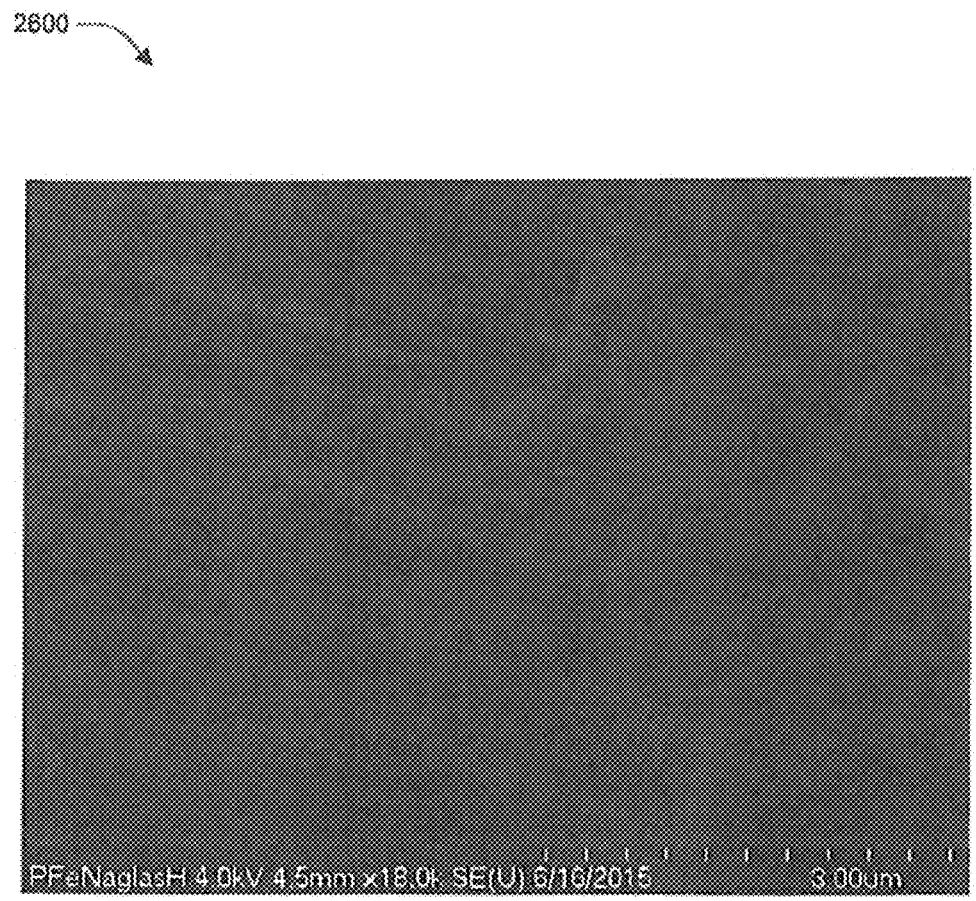
FIG. 26 is an SEM picture that illustrates one embodiment of parallel sheets of a sample separated by glass particles.

In another embodiment, inert chemicals may be used to make the layered structure porous. For example, a sample of hBN may be mixed with FeCl3 and inert chemicals, including glass particles. During the intercalation, FeCl3 move into hBN layers and carries the glass particles with it. After intercalation, FeCl3 (or Fe2O3 if oxidized) is removed from hBN layers by HCl, leaving the inert glass particles behind. These glass particles occupy part of the spaces between the hBN layers and keep the layers separated. Without the inert glass particles, the separated hBN layers would stack back together when the FeCl3 is removed. The space which was occupied by FeCl3 before being removed becomes empty space between the separated hBN layers. A porous hBN sample is thus synthesized where sheets of thin hBN layers are kept from stacking together by the inert chemicals. FIG. 26 is a SEM picture showing such separated hBN nanosheets.

The pores can be filled with other chemicals to become new materials with new physical properties. For example, the pores can be filled with BaTiO3 and then subjected to a hot press in 1000-2000° C. to become a new material with high dielectric constant and high dielectric strength. Due to the presence of the inert chemicals between the separated sheets of the layered structure, the 2D alignment of the sheets will be disturbed during hot press at 1000-2000° C. on the porous hBN. The disturbance may cause some sheets to become "fin" from the original hBN's 2D plane due to the compression force of the sheets and the inert chemicals between them. The result is increased thermal conductivity in the direction perpendicular to the direction of the original hBN reactant's 2D plane.

Steps 2415, 2420, and 2425 are example of how the intercalation materials can be varied. These are three of the examples of how the intercalation materials can be used. In addition to the examples given, variations of the intercalation materials may also be mixed. For example, a sample of hBN may be mixed with more than one kind of reactive intercalate, inert chemicals, including glass particles, as well as an activation agent. Other combination of the intercalation materials may also be used.

At 2430, the intercalation materials are intercalated into the sample. As discussed above with respect to FIG. 1, the intercalation may be caused by the mixture of the sample and the intercalateion materials being heated in an inert environment. Additionally, the intercalation may include hydrating the intercalated mixture in a high humidity environment.

At 2435, the incalated mixture is exfoliated. As discussed above with respect to FIG. 1, exfoliation may include a rapid heating in air for a second period of time according to a first heating pattern or histogram, or by sonication, or a combination thereof. Product from 2430 is exfoliated hBN where metal oxide nanoparticles are in the spaces between the exfoliated layers. It is a stable product in ambient air, but not as inert as the reactant hBN. Therefore, it can be reactive to other chemicals and converted to other forms (i.e., new products).

Figure 24B:
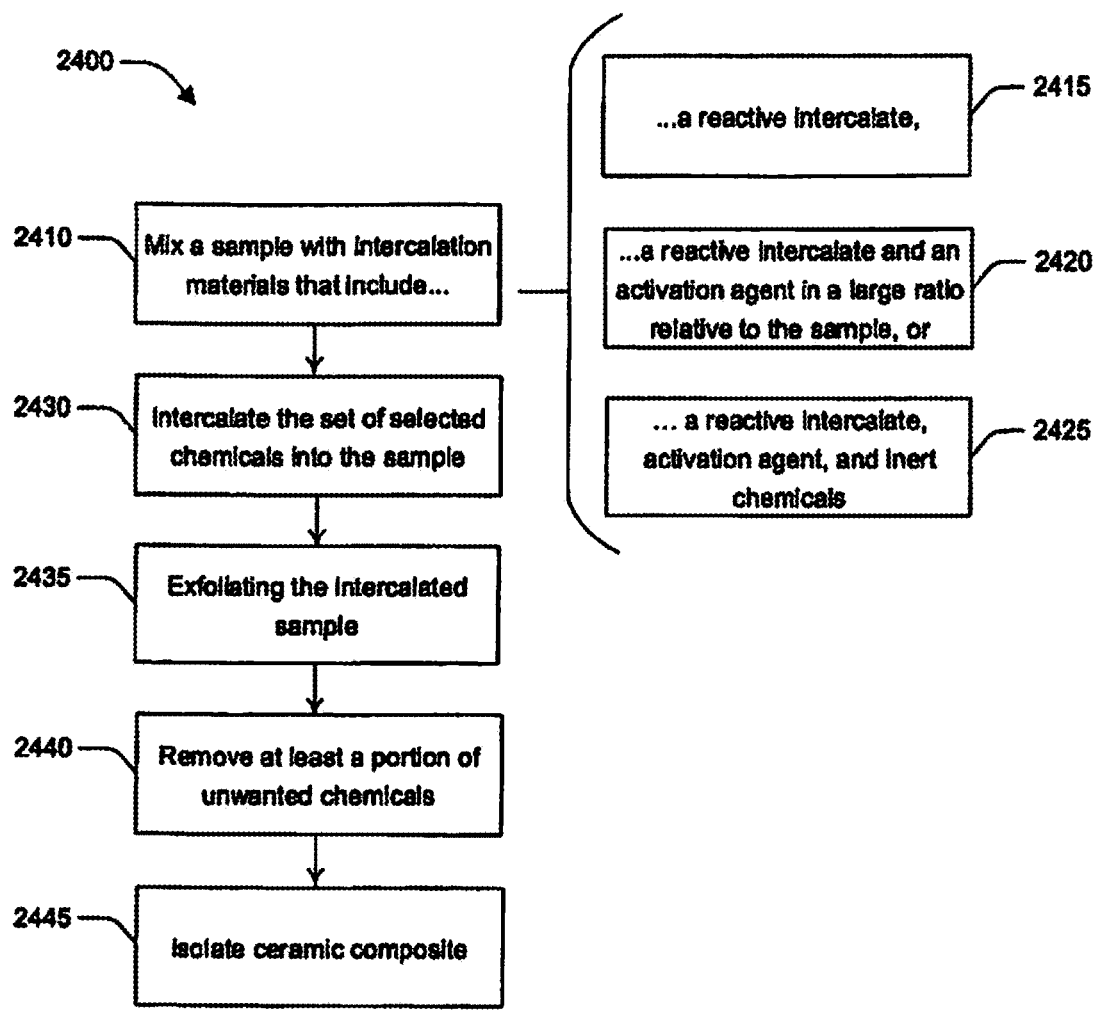
FIG. 24B illustrates another embodiment of a method that can facilitate intercalation and exfoliation of a starting reactant in accordance with aspects of the subject innovation.

FIG. 24B illustrates another embodiment of a method that can facilitate intercalation and exfoliation of a starting reactant in accordance with aspects of the subject innovation. Specifically, FIG. 24B illustrates a method for fabrication of an hBN-alumina ceramic composite. The steps 2410, 2430, and 2435 are performed in a similar manner as described above with respect to FIG. 24A. Likewise, the intercalation materials described above in elements 2415, 2420, and 2425 also pertain to step 2410.

Following the exfoliation at 2435, at 2440, a portion of unwanted chemicals may be removed from the exfoliated intercalated sample. For example, in the layered structure where individual layers (i.e., boron nitride nanosheets) are separated by alumina and $Fe_2O_3$ particles (B''' in reaction 15), iron oxide may be removed from the exfoliated sample, leaving alumina particles in the exfoliated layers (pictures in FIGS. 14 and 15). At 2445, a ceramic composite is isolated. For example the ceramic composite may be isolated by hot pressing the exfoliated hBN containing alumina at 2000° C. and 10 Ksi resulted in an hBN-alumina composite (60% hBN and 40% alumina). This sample has a high in-plane thermal conductivity of about 85 w/m ° K. Isolating this specific ceramic composite, is one example of a product that may be formed from the method described with respect to FIG. 24B.

In another example, following earlier description on 2415, by skipping 2440 as there is no unwanted chemicals in the sample, hot pressing the hBN coated with alumina (product of 2435, product of reaction (18) in this example, SEM picture in FIGS. 16 and 17) at 2000° C. and 10 Ksi resulted in an hBN-alumina ceramic composite (2445, 90% hBN and 10% alumina). This composite has a very high in-plane thermal conductivity, about 150 w/m ° K.

Figure 24C:
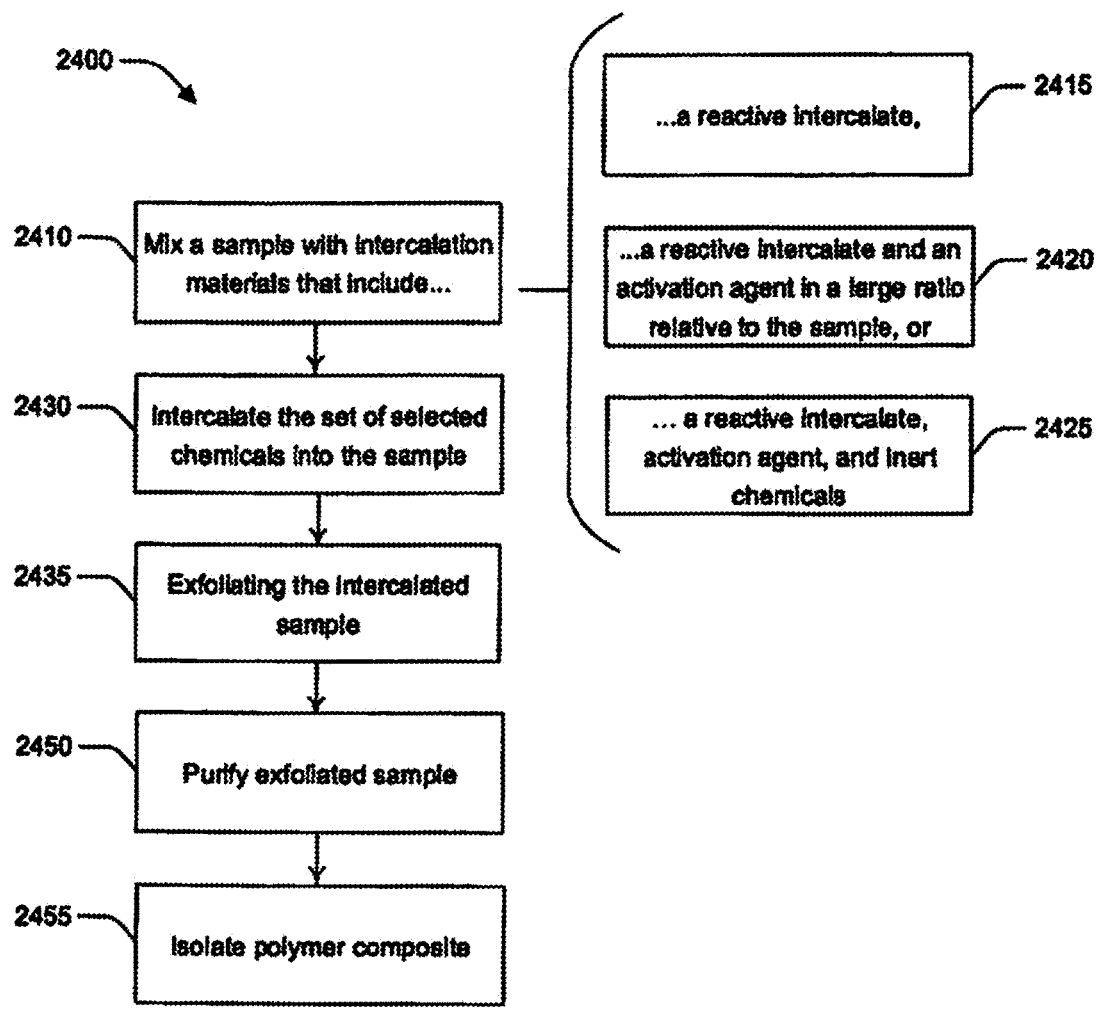
FIG. 24C illustrates another embodiment of method that can facilitate intercalation and exfoliation of a starting reactant in accordance with aspects of the subject innovation.

FIG. 24C illustrates another embodiment of a method that can facilitate intercalation and exfoliation of a starting reactant in accordance with aspects of the subject innovation. Specifically, the purified exfoliated hBN has applications as fillers in composites such as polymer nanocomposites with enhanced properties as energy conversion systems. The steps 2410, 2430, and 2435 are performed in a similar manner as described above with respect to FIG. 24A. Likewise, the intercalation materials described above in elements 2415, 2420, and 2425 also pertain to step 2410.

At 2450, the exfoliated sample is purified. Accordingly, unwanted materials can be totally or partially removed from the exfoliated samples. The materials to be removed may be identified based on the desired properties of the product. The product is isolated at 2455.

In one embodiment, the hBN filled composite has a piezoelectric or pyroelectric matrix. Piezoelectric and pyroelectric materials have the ability of generating a charge as a result of a mechanical stress (piezo-) or thermal changes (pyro-). For instance, polyvinylidene fluoride (PVDF) is a lightweight ferroelectric material with very good piezoelectric and pyroelectric properties. The intercalate-exfoliated hBN fillers in a PVDF/hBN nanocomposite can utilize vibrations and/or thermal changes caused by various aerospace propulsion systems. A PVDF/hBN can be fabricate to make a lightweight self-charging and/or self-generating nanocomposites for energy conversion.

Figure 25:
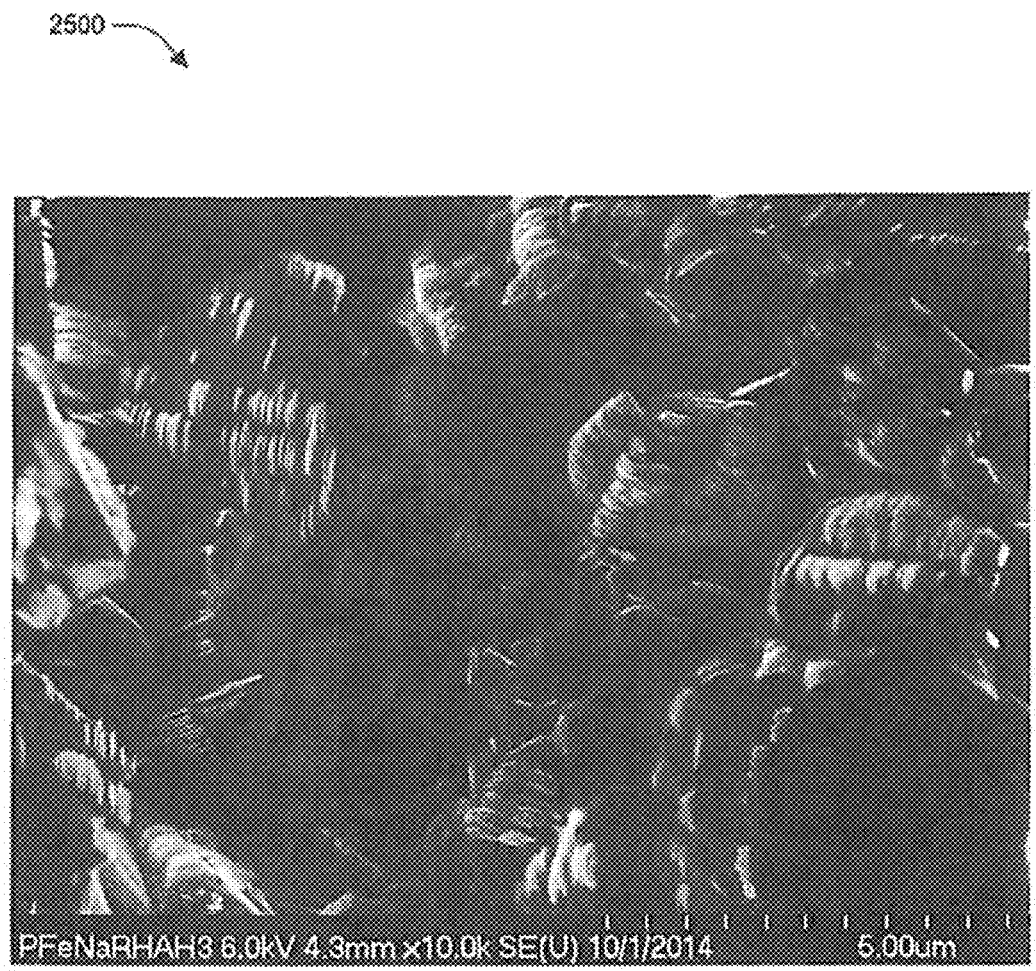
FIG. 25 is an SEM picture that illustrates one embodiment of exfoliated boron nitride nanosheets embedded in iron oxide.

FIG. 25 is the SEM picture showing exfoliated boron nitride nanosheets embedded in $Fe_2O_3$ made from a reactant mixture that contained excess amount of $FeCl_3$ and a large amount of activation agent NaF. The mass ratio of the activation agent, NaF, to the sample, hBN, is 1.5. Comparing to FIG. 8A (NaF/hBN mass ratio 0.15), the nanosheets of the layered structure is more separated and visualized more clearly.

FIG. 26 shows parallel sheets of hBN separated by glass particles. A porous hBN sample is synthesized where sheets of thin hBN layers are kept from stacking together by the inert chemicals (i.e., glass).

Figure 27:
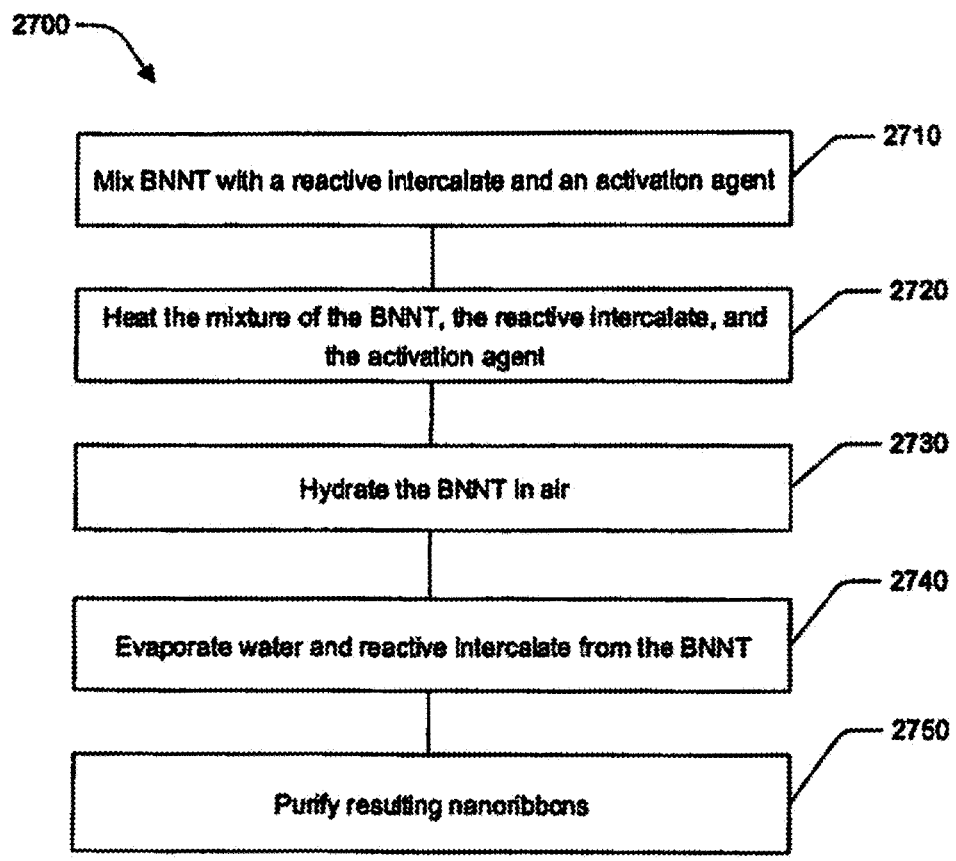
FIG. 27 illustrates one embodiment of a method that can facilitate intercalation and exfoliation of a starting reactant of BNNT.

FIG. 27 illustrates a method that can facilitate intercalation and exfoliation of a starting reactant of BNNT in accordance with aspects of the subject innovation. As discussed above with respect to FIG. 2, the starting reactant may be BNNT. At 2710, a sample of the BNNT is mixed with intercalation materials. The BNNT may be used as the starting reactant if the desired result is a layered structure having nanoribbons.

At 2720, the mixture of BNNT and the intercalation materials is heated. The heating allows the intercalation materials to enter the sample of BNNT. At 2730, the sample is exposed to moist air to hydrate the sample. At 2740, the water in the sample is then evaporated causing at the least a portion of the intercalation materials to be oxidized causing the sample to be exfoliated, thus creating boron nitride nanoribbons from the sample of the BNNT. At 2750, the nanoribbons may be purified.

Figure 28A:
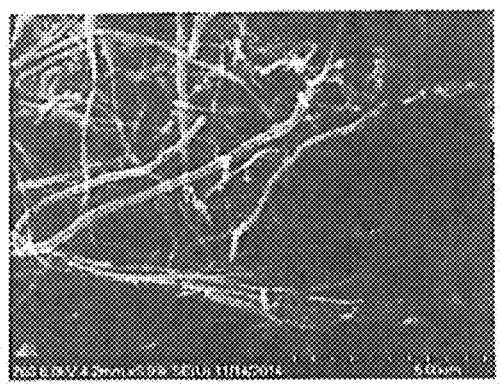
FIG. 28A is an SEM picture that illustrates a starting reactant of BNNT to be exfoliated in a method like that of FIG. 27.
Figure 28B:
FIG. 28B is a TEM picture that illustrates one embodiment of a nanotube wall that has been exfoliated into nanoribbons.

FIG. 28A illustrates a SEM of BNNT, the reactant BN. The nanoribbons resulting from the intercalation-exfoliation process of BNNT are too small to be examined by SEM. It, however, is observed by TEM (FIG. 28B. Thus, similar to the hBN-alumina composite previously described, boron nitride nanoribbon-alumina composite can be made from BNNT. The exfoliated mass of nanoribbons can be coated with alumina and hot pressed (to 2000° C. and 10 ksi) to form a BN-alumina composite.

The subject innovation, in various embodiments, includes methods that can facilitate intercalation and exfoliation of hBN. In other embodiments, the subject innovation includes products that can be associated with such methods, or articles (e.g., ceramic, composite, etc.) comprising or derived from such products.

FIGS. 29-41 illustrate other uses of hexagonal BN (hBN) in accordance with an aspect of the innovation. As disclosed herein, hBN is an unusual material in that it is both highly thermally conductive as well as an electrical insulator. In addition, hBN is thermally stable in air. This unusual combination of properties makes hBN of significant interest for thermal management. Thus, the innovation disclosed herein and illustrated in FIGS. 29-41 utilize hBN to dissipate heat from high-voltage, high-power electrical devices.

According to an aspect of the innovation, the process of coating individual platelets of hBN may include mixing hBN with a chloride or a metal oxide. Suitable chlorides include, but are not limited to aluminum chloride (including alumina), silicon chloride, titanium chloride, copper chloride, zinc chloride, molybdenum chloride, zirconium chloride, hafnium chloride or a combination of two or more thereof. Suitable metal oxides include aluminum oxides, copper oxides, titanium oxides, zinc oxides, cobalt oxides, manganese oxides, iron oxides, nickel oxides, vanadium oxides, tin oxides, indium oxides, barium oxides, zirconium oxide, hafnium oxide, glass, or combinations of two or more thereof. The resulting coated hBN (i.e., the second product) can then be heat treated (e.g., hot pressed) to form a composite.

In an embodiment, an innovative process to coat individual platelets of an hBN powder with a layer of a amorphous aluminum oxide and hot pressing the coated hBN to form a highly thermally conductive substrate is disclosed. As will be described in more detail below, the process to coat hBN platelets with a metal oxide (e.g. aluminum oxide) is accomplished by mixing hBN with aluminum chloride ($AlCl_3$) containing some water and evaporating excess $AlCl_3$ to form an Al, Cl, and O layer on hBN. The coated hBN is heated in air to convert the surface layer into aluminum oxide and then hot pressed to approximately 1950° C. and 10 ksi. The resulting consolidated composite has thru-plane and in-plane thermal conductivity of approximately 14 and 157 W/m·K, respectively, at room temperature.

Hexagonal BN is a two-dimensional (2D) material that is highly thermally conductive. Its in-plane and through-plane thermal conductivities (i.e., thermal conductivity along and across its basal plane, respectively) at room temperature are about 400 and 30 W/m·K, respectively. In comparison, room temperature thermal conductivity of copper, alumina, and epoxy are about 400, 30 and 0.1 W/m·K, respectively. As mentioned above, hBN's high thermal conductivity and high thermal stability in air, together with its property of high electrical resistivity ($10^{13}$ Ω-cm at room temperature) lead to a potential application in the area of thermal management of high-power, high-voltage electrical systems. Heat generated by such systems reduces their durability, performance, and reliability. This issue will become increasingly problematic with the continuing trend of smaller and more powerful devices.

In order to overcome and alleviate thermal issues in electronic and electrical devices, and in electrical systems, an innovative insulating composite and method of making the composite using hBN is disclosed with a very high thermal conductivity that dissipates heat generated by the electrical system without interfering with its performance. This configuration provides flexibility for thermal management design. For example, it could be incorporated into high-power devices such as motors, generators, computer servers, or lithium-ion batteries to dissipate heat and alleviate overheating. Thus, the innovation utilizes a highly ordered and highly crystalline (thus, highly thermally conductive) hBN to fabricate a very high thermally conductive composite (e.g., a hBN/alumina composite) for thermal management.

Consolidation of pure hBN powder into a substrate can be difficult. hBN is not expected to sinter at low residual oxygen content. The hBN used during testing (Momentive PT110, oxygen content 0.156%) was not successfully consolidated into a substrate by hot pressing at 2000° C. and 10 Ksi for 1 hr. Hot pressing hBN powder containing 2.4% boric oxide was found to produce a low strength substrate with in-plane and through plane thermal conductivity of, respectively, 15 and 29 w/mK at 300° C. Thus, at a minimum, a second phase is required to produce a composite with acceptable mechanical properties and a thermal conductivity similar to pure hBN. The innovation described herein uses a novel method to fabricate hBN composites. In one embodiment, the hBN composite contains a minimal amount of aluminum oxide-boron oxide solution as the second phase to achieve high thermal conductivity.

Figure 29:
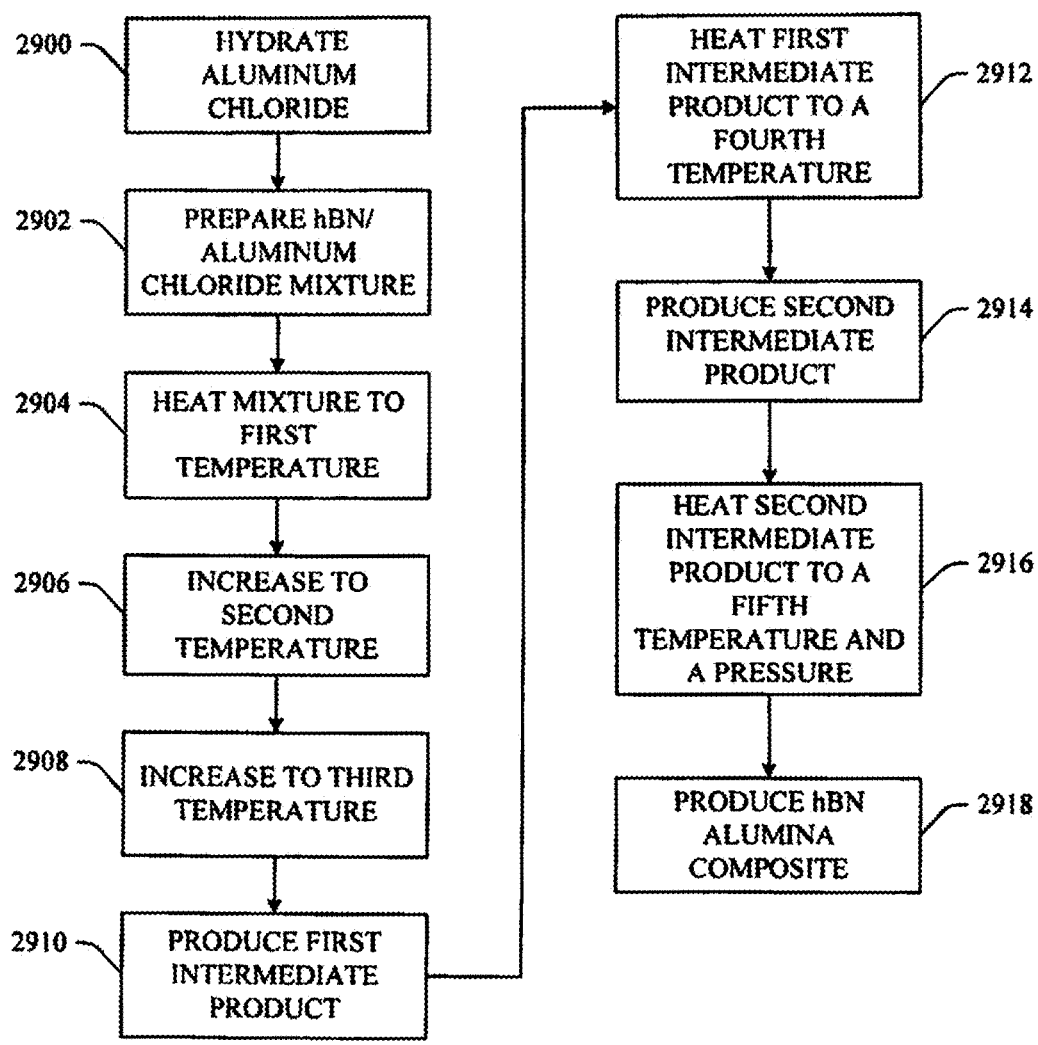
FIG. 29 is a block diagram illustration of a method of creating an hBN/alumina composite in accordance with an aspect of the innovation.

Referring to FIG. 29 and to Reactions (R1), (R2), and (R3) below a method of creating a hBN/alumina composite will now be described in accordance with an aspect of the innovation. At 2900, aluminum chloride is hydrated by exposing it to ambient air for a first predetermined time period. The aluminum chloride hydrates by absorbing moisture from the air. At 2902, a mixture of hBN and hydrated aluminum chloride is prepared per Equation (E1):

$$hBN + AlCl_3 \cdot nH_2O \tag{E1}$$

where $AlCl_3 \cdot nH_2O$ is aluminum chloride containing some water (e.g., 0.1-10%, for example up to approximately 5%). In one example embodiment, the hBN may be nano-sized and/or porous. At 2904, the mixture is heated in an inert environment at a temperature (first temperature) between ambient and below a boiling point of water for a second predetermined time period. At 2906, the heating temperature is increased to and held in a range between the boiling point of water and the sublimation point of anhydrous aluminum chloride (second temperature, e.g., 150° C.–200° C.) for a third predetermined time period. At 2908, the heating temperature is increased and held above the sublimation point of anhydrous aluminum chloride (third temperature, e.g., 150° C.–200° C.) for a fourth predetermined time period thereby at 2910 producing a first product of hBN coated with a compound coating containing aluminum, chlorine and oxygen per Reaction (R1).

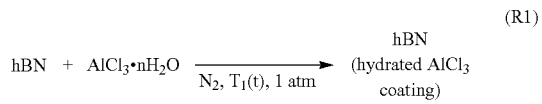

(R1)

where $T_1(t)$ is temperature as a function of time during the above reaction. At 2912, the first product is heated in air at or above an oxidation temperature (fourth temperature, e.g., in a range of above about 350° C. to about 450° C.) of the compound coating for a fifth time period, thereby producing at 2914, a second product of hBN with aluminum oxide per Reaction (R2).

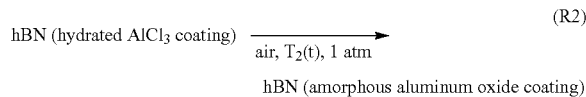

(R2)

where $T_2(t)$ is temperature as a function of time during the above reaction. At 2916, the second product is hot pressed at or above a sintering temperature (fifth temperature, e.g. 1700° C.–2000° C.) and pressure (e.g., 5-15 ksi, for example to approximately 10 ksi) for a sixth time period to, thereby at 2918, produce the final product of hBN-alumina composite per Reaction (R3).

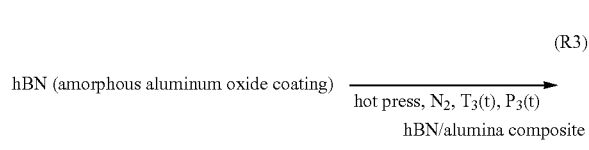

(R3)

where $T_3(t)$ and $P_3(t)$ are temperature and pressure, respectively, as functions of time during the hot-pressing for the aluminum oxide coated hBN powder.

FIGS. 30A-32B illustrate an example embodiment of creating the innovative hBN/alumina compound using a commercially available hBN starting product, such as but not limited to Momentive PT110 platelets. It is to be understood, however, that this is just one formulation of many to achieve the end result. For example, the starting product (i.e., hBN) and the added components can be any quantity (e.g., mg, grams, volume, etc.) and processed at parameters (e.g., different temperatures, pressures, etc.) to achieve the innovative hBN/alumina composite. It is to be further understood, that using different quantities of the starting product and component additives, and different parameters, achieves the innovative hBN/alumina composite, but may be for different applications as disclosed herein.

In one embodiment, Reaction (1), $AlCl_3 \cdot nH_2O$ is aluminum chloride containing 0.3%-5% water or less. It may be obtained by exposing anhydrous aluminum chloride to ambient air for a period of time until its mass increase reached a pre-determined percentage. The hBN platelets are approximately 20-80 μm wide and 5-10 μm thick. The reaction can be divided into three steps in sequence: (1) the migration of water from the original location in $AlCl_3$ to the final location in the reactant mixture, (2) reactions of hBN, water, and $AlCl_3$ at hBN surface, and (3) excess amount of aluminum chloride is evaporated after the water migration and water-induced reactions are near completion. In order for these steps to happen in sequence, $T_1(t)$ was kept between room temperature and 100° C. (a first temperature), then between 100° C. and 190° C. (i.e., $AlCl_3$ sublimation point, a second temperature), and finally above 190° C. (a third temperature), for several hours each. Among numerous experimental runs conducted under these ranges of environmental conditions, coating on hBN was always observed. However, the quantity (mass data) and the appearance (scanning electron microscopy (SEM) data) of the coating depend on the specific conditions (time, temperature) of the run.

Figure 30A:
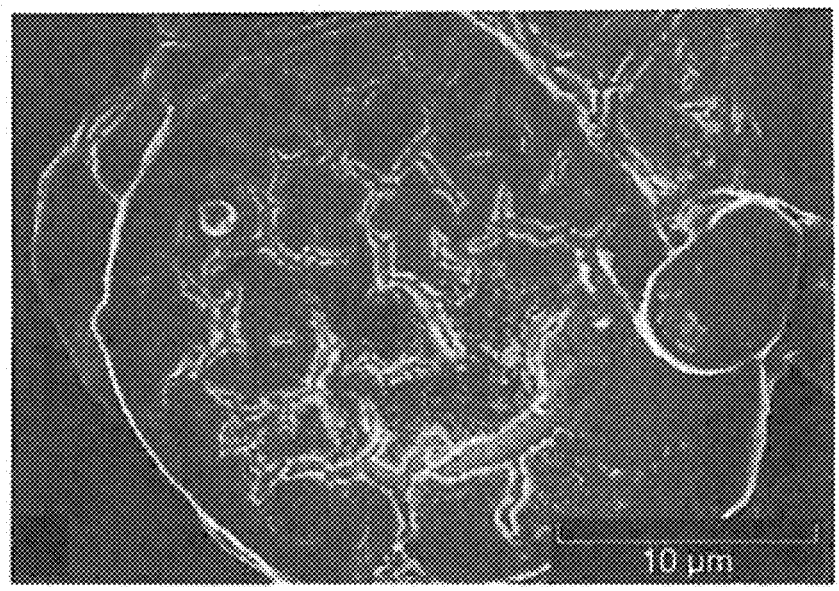
FIGS. 30A and 30B are SEM images at a higher magnification and a lower magnification respectively of hBN platelets in accordance with an aspect of the innovation.
Figure 30B:
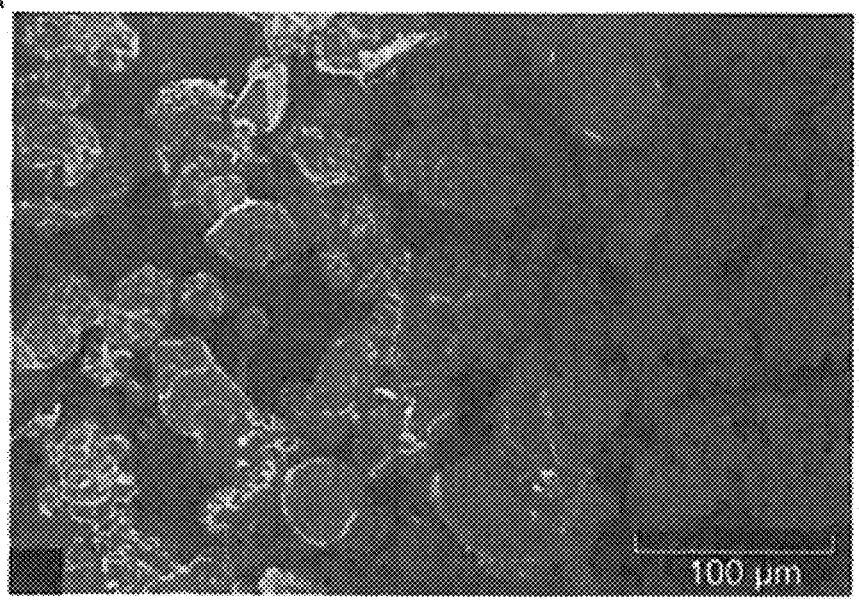

FIGS. 30A and 30B are SEM images at a higher magnification 3000A and a lower magnification 3000B respectively of a product where hBN platelets are heavily coated. Electron dispersion spectroscopy (EDS) data shows the coating contained the elements of aluminum, chlorine and oxygen where chlorine to aluminum atomic ratio is less than 3. This indicates some dissociation of aluminum-chlorine bonds during the reactions, which may also involve the formation of aluminum-oxygen bonds and the loss of chlorine and hydrogen to the nitrogen environment. This product contains approximately 65% hBN and 35% coating by mass.

Figure 31:
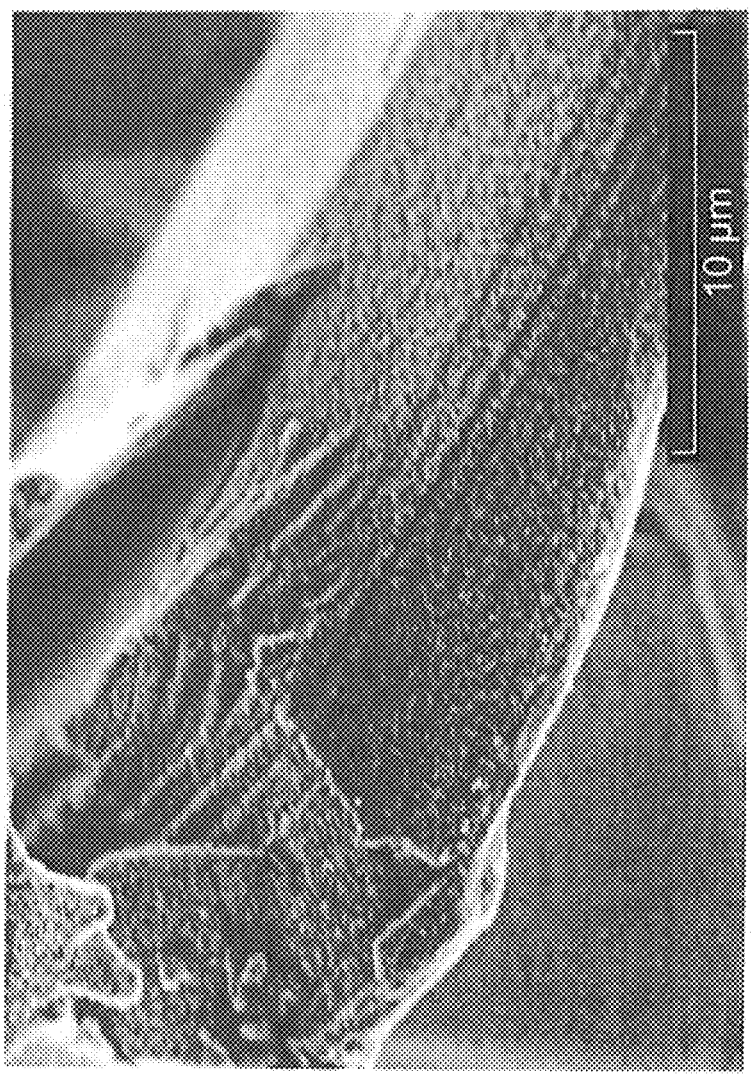
FIG. 31 is a FESEM image of the hBN platelet coated with aluminum oxide in accordance with an aspect of the innovation.

In Reaction (R2), $T_2(t)$ is designed to convert the hydrated aluminum chloride coating on hBN into aluminum oxide. FIG. 31 shows an SEM image of the product of Reaction (R2), which used the coated hBN described in FIGS. 30A and 30B as the reactant. The heating of this reaction was from about room temperature to about 750° C. at 10° C./min followed by a 750° C. heating for 2 hours. EDS data shows the sample contains only B, N, Al and O. The aluminum-chlorine bond dissociation apparently reaches completion as aluminum-oxygen bonds formed and chlorine and hydrogen released to the air environment. Mass data indicate that this product contained 26% aluminum oxide and 74% hBN. The SEM images demonstrate complete coating of aluminum oxide on the surface of the entire hBN platelet.

In Reaction (R3), the powder of hBN that is coated with aluminum oxide was placed in a graphite die, which was placed in 1 atm nitrogen. The coated hBN powder contained 90% hBN and 10% aluminum oxide by mass. $T_3(t)$ is the temperature of the graphite die (and therefore the sample). It began at room temperature and was ramped up to 1950° C. at 5° C./min. It was kept at 1950° C. for one hour before cooling down at 10° C./min until it reached room temperature. $P_3(t)$ is the pressure on the sample by the graphite die. It was kept at 3 ksi until the system was heated to 1200° C., then increased to 10 ksi throughout the rest of the heating to 1950° C. The pressure was not released until cooling to 1300° C. During this process, sample consolidation was first observed when the system was heated to $T_3(t)=1800°$ C.

Figure 32A:
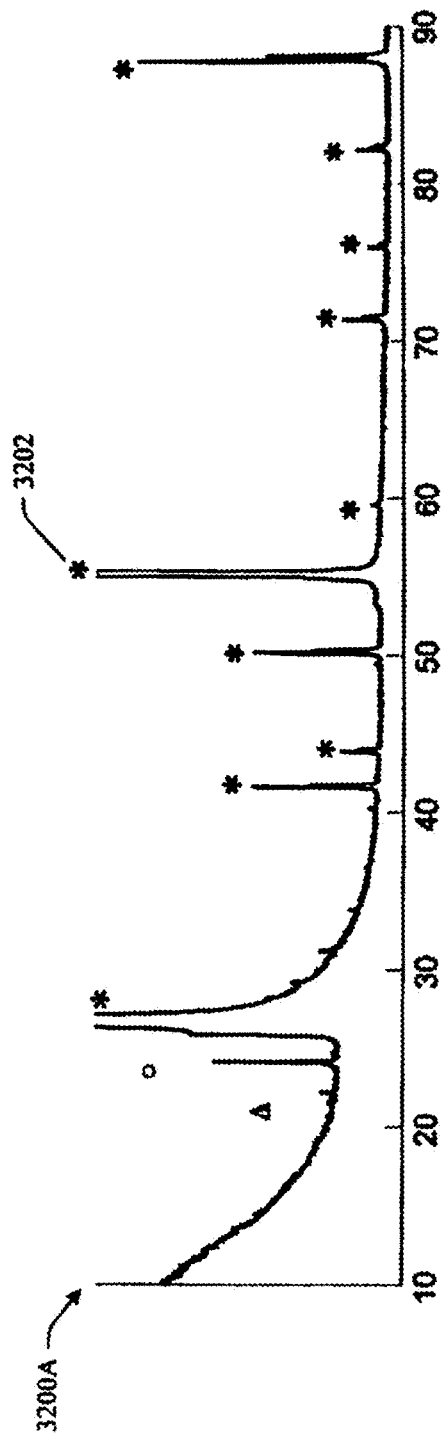
FIGS. 32A and 32B are X-ray diffraction graphs of the hBN platelet coated with aluminum oxide and the hBN/alumina composite respectively in accordance with an aspect of the innovation.
Figure 32B:
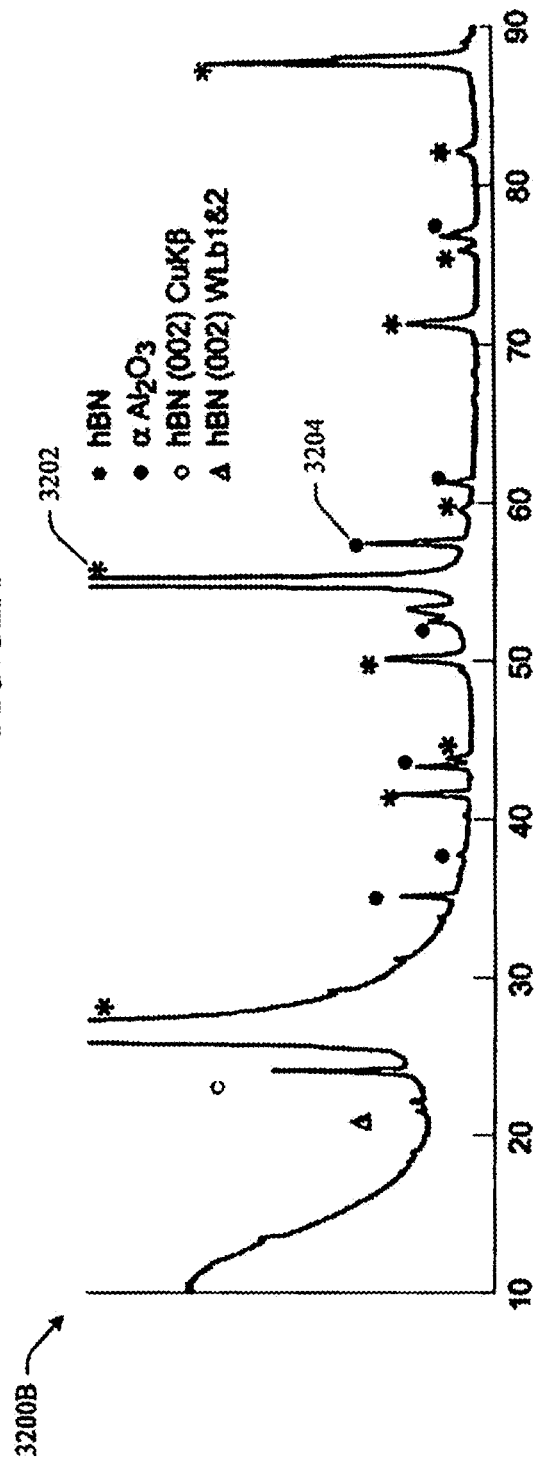

The hot-pressed product obtained was examined and compared to its precursor (hBN coated with aluminum oxide) using X-ray diffraction (XRD). The result is presented in FIGS. 32A and 32B. FIG. 32A is an XRD graph 3200A prior to hot pressing and FIG. 32B is an XRD graph 3200B after hot pressing. In FIG. 32A, the precursor shows only hBN peaks 3202 (indicated by the asterisk), but the hot-pressed product in FIG. 32B shows both hBN peaks 3202 and crystalline alumina peaks 3204 (indicated by the dark circle). Aluminum oxide coating on hBN platelet particles before hot pressing (observed in SEM images similar to FIG. 31) did not give any XRD peaks and was apparently amorphous. During hot pressing, however, coated hBN particles were consolidated into a BN/alumina composite.

Two composites were made from the above example embodiment, Disk A and Disk B. Disk A is approximately 25 mm in diameter and was used to measure through-plane thermal conductivity using a NETZSCH LFA 447 instrument. Disk B is approximately 20 mm in diameter and was sent for an independent thermal conductivity measurement. The in-plane thermal conductivity of the hBN/alumina composite was measured by the radial heat flow method that uses manufacturer's data analysis software containing an anisotropic thermal diffusivity model. The instruments and the test methods conform to ASTM E1461-13, "Standard Test Method for Thermal Diffusivity by the Flash Method."

The dimensions and thermal-conductivity-related properties for hBN/alumina composites prepared according to the innovation are listed in Table 4 below. Disk A was machined from a 25-mm-diameter, 2.4-mm-thick disk to a 25-mm, 0.7-mm-thick disk. Its measured thermal conductivities were 157 W/m·K (in plane) and 14.4 W/m·K (through plane) at room temperature. It is machinable, highly thermally conductive, and electrically insulating. Table 4 also shows that the composite's in-plane thermal conductivity is much higher than its through-plane thermal conductivity, indicating a very strong preferred orientation of hBN in the composite. This is consistent with XRD data, where the (100)-to-(002) peak height ratio for the composite product of Reaction (R3) was 0.00176, and for the alumina-coated hBN pre-hot pressing powder, 0.00270. By comparison, pure hBN with no preferred orientation has a (100)-to-(002) peak height ratio of 0.14 ($I/I_0$ value, Powder Diffraction File Reference code: 04-004-1056). Assuming the measured in-plane thermal conductivity of 157 W/m·K is the result of a perfect 2D orientation for hBN platelets in the composite, and assuming this perfect preferred orientation can be completely changed to a perfect random orientation by a process yet to be developed, then the composite would theoretically have an isotropic thermal conductivity value of $157/\sqrt{2}=111$ W/m·K at room temperature.

TABLE 4

| | As synthesized | | Thickness | | | | | | |
|---|---|---|---|---|---|---|---|---|---|
| | Dia. (mm) | Thickness (mm) | after machining (mm) | Density @ 25° (g/cm³) | Direction | Temp ° C. | Specific heat (J/g · ° C.) | Diffusivity mm²/s | Conductivity W/m · K |
| Disk A | 25 | 2.4 | 0.704 | 2.17 | through plane | 25 | 0.969 | 6.84 | 14.4 |
| | | | | | | 100 | 1.07 | 4.92 | 11.4 |
| | | | | | | 500 | 1.57 | 2.05 | 7.0 |
| | | | | | | 1000 | 1.82 | 1.20 | 4.7 |
| | | | | | in plane | 25 | 0.969 | 74.6 | 157 |
| | | | | | | 100 | 1.07 | 52.7 | 122 |
| | | | | | | 500 | 1.57 | 17.2 | 58.6 |
| | | | | | | 1000 | 1.82 | 5.54 | 21.9 |
| Disk B | 20 | 1.9 | 1.79 | 2.299 | through plane | 30 | 0.809 | 13.3 | 24.8 |

The chemical composition of the composites obtained is estimated to be 90% hBN and 10% alumina by weight. Since densities of hBN and alumina are 2.10 and 3.95 g/cm³, respectively, the rule of mixture gives the density of the composite to be 2.29 g/cm³, as compared to the measured values of 2.17 g/cm³ for the 25-mm disk and 2.30 g/cm³ for the 20-mm disk. The density difference between these two disk samples suggests some porosity in the 25-mm disk. Since pores are heat transfer barriers, the lower density disk (Disk A) would more likely have lower thermal conductivity. This is consistent with the observation in Table 4, which shows that the room-temperature through-plane thermal conductivity was lower for the lower density disk (Disk A).

Figure 33:
FIG. 33 is an SEM image of the hBN platelet as received in accordance with an aspect of the innovation.
Figure 34:
FIG. 34 is an SEM image of the hBN platelet coated with aluminum oxide in accordance with an aspect of the innovation.

Referring to FIGS. 33-34, another example process having specific quantities (e.g., mass, weight, volume, etc.), temperatures, pressure, etc. for the formulation of the innovative hBN/alumina process is illustrated. It is to be understood, however, that this is just one formulation of many to achieve the end result. For example, the starting product (i.e., hBN) and the added components can be any quantity (e.g., mg, grams, volume, etc.) and processed at parameters (e.g., different temperatures, pressures, etc.) to achieve the innovative hBN composite. It is to be further understood, that using different quantities of the starting product and component additives, and different parameters, achieves the innovative hBN composite, but may be for different applications as disclosed herein.

In one embodiment, the first step of synthesizing the innovative hBN composite is the hydration of aluminum chloride. 4.9666 g of anhydrous $AlCl_3$ (99%, Alfa-Aesar product) is put into a watchglass, and is exposed to ambient air in for approximately 3 hours and 10 minutes. Its mass at the end of this exposure was 5.2735 g. The mass increase is believed to be moisture in air picked up by the hygroscopic $AlCl_3$. ($H_2O$ was 6.18% of $AlCl_3$ mass). It will be understood that hydrated aluminum chloride can be obtained in most any way and that the innovation is not limited to this method of hydrating aluminum chloride.

The second step is the preparation of the reactant mixture. 8.810 gm of hBN platelets (see FIG. 33) is put into a 70 ml glass weighing bottle. Then 5.202 g of hydrated $AlCl_3$ (out of the 5.2735 gm mentioned above) is put into the same glass weighing bottle. The two components are thoroughly mixed. The weighing bottle is covered with a glass cap and sealed with PTFE tape between the glass bottle and the glass cap.

The third step is to setup the apparatus for the reactant mixture in 1 atm of nitrogen and a controlled temperature environment. The weighing bottle containing the reactants and with the cap attached are placed into a glass reactor and the reactor, which is covered with a thermal insulator, is placed in a heating mantle. Nitrogen slowly flows through the reactor thereby maintaining the interior of the reactor in a nitrogen environment. The temperature of the interior of the reactor is controlled by adjusting the voltage applied to the heating mantle.

Next, the temperature is controlled as a function of time for the reactions. The interior of the reactor is kept sequentially at room temperature for 18 hours to allow the water to have time to move to the equilibrium position. The temperature is adjusted to 80° C. for 8 hours and 20 minutes to allow the water react before being boiled off. The temperature is then adjusted to 175° C. for 13 hours and 30 minutes to allow the $AlCl_3$ to react before sublimation. The temperature is then adjusted to 225° C. for 9 hours and 20 minutes to allow the $AlCl_3$ sublimate. The sublimation point is 190° C. The power is removed to allow the temperature to fall to room temperature thereby producing the first product.

Next the first product is weighed and put into a hot furnace. After the above reactions, the total mass of the first product weighed 11.858 gm. From this, 11.831 gm was placed in a furnace. The air in furnace was then heated from room temperature to 105° C. at 10° C./min and kept at 105° C. for 3 hours. The air furnace was then slowly heated to 225° C. at 1° C./min and kept at 225° C. for 6 hours. Finally, the air furnace was slowly heated to 450° C. at 1° C./min and kept at 450° C. for 19 hours to allow the surface to become aluminum oxide). Power was removed to allow the air furnace to cool thereby producing the second product (see FIG. 34).

The second product is weighed and kept in storage until final hot press. The second product weighs 10.9742 gm. The hBN mass loss during the entire process is approximately 10%. Thus, the sample should contain 90% of the original 8.810 gm of hBN, which is 7.929 gm. Composition of the second product is, therefore, calculated to be (7.929/10.9742)=72% hBN. The rest (28%) is aluminum oxide.

Finally, according to an embodiment, the second product may be hot pressed at 1800° C. in vacuum for 1 hour to complete the composite fabrication process. In this example, two samples of the above second product, 3.3785 gm (Sample 1) and 3.3667 gm (Sample 2) each, were hot pressed into two 1" disks. Temperature increases from room temperature to 1800° C. at 5° C./min and kept at 1800° C. for 1 hour and then cooled at 5° C./min until room temperature. Pressure was kept at 1.5 ksi when the temperature was below 1200° C. and at 8 ksi when the temperature was above 1200° C., for both heating and cooling period. The final composite was slightly more than 3 mm thick.

Figure 35:
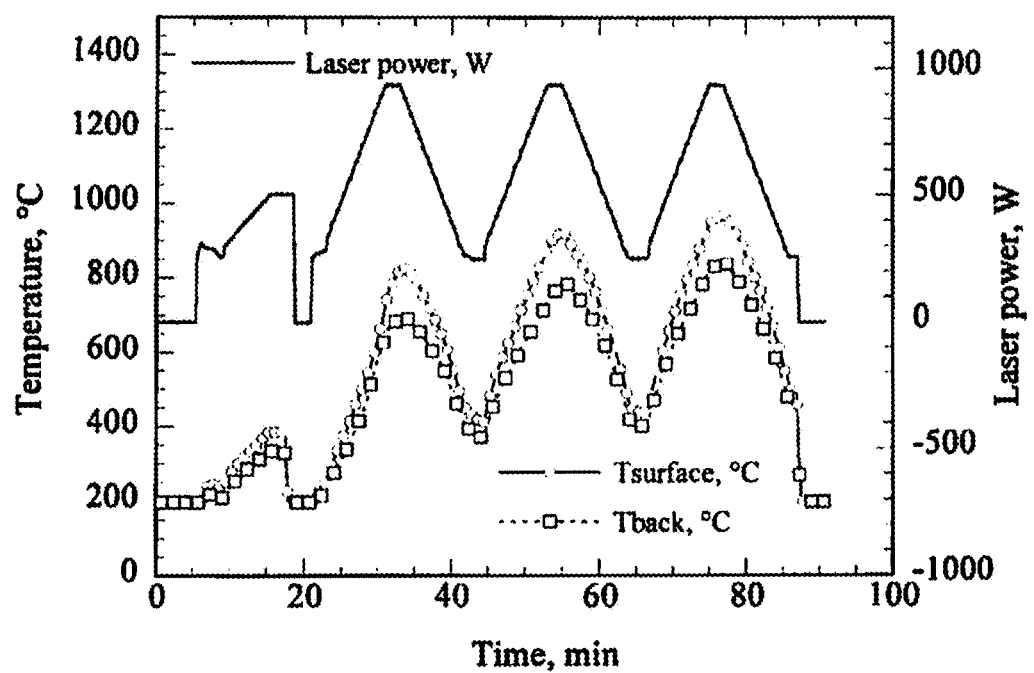
FIG. 35 is a temperature-time graph illustrating a temperature of the front and back surfaces of a sample (Sample 1) undergoing laser thermal gradient cycles in accordance with an aspect of the innovation.
Figure 36:
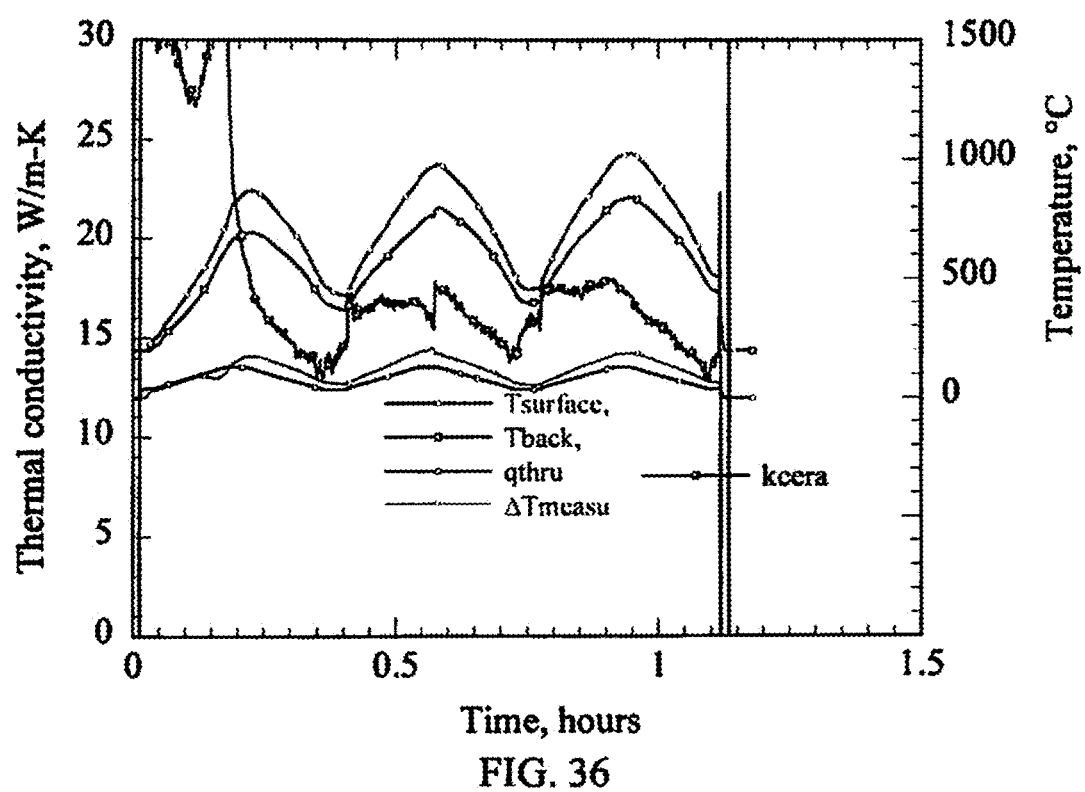
FIG. 36 is a graph illustrating thermal conductivity of Sample 1 over the course of 1.5 hours of the sample in accordance with an aspect of the innovation.
Figure 37:
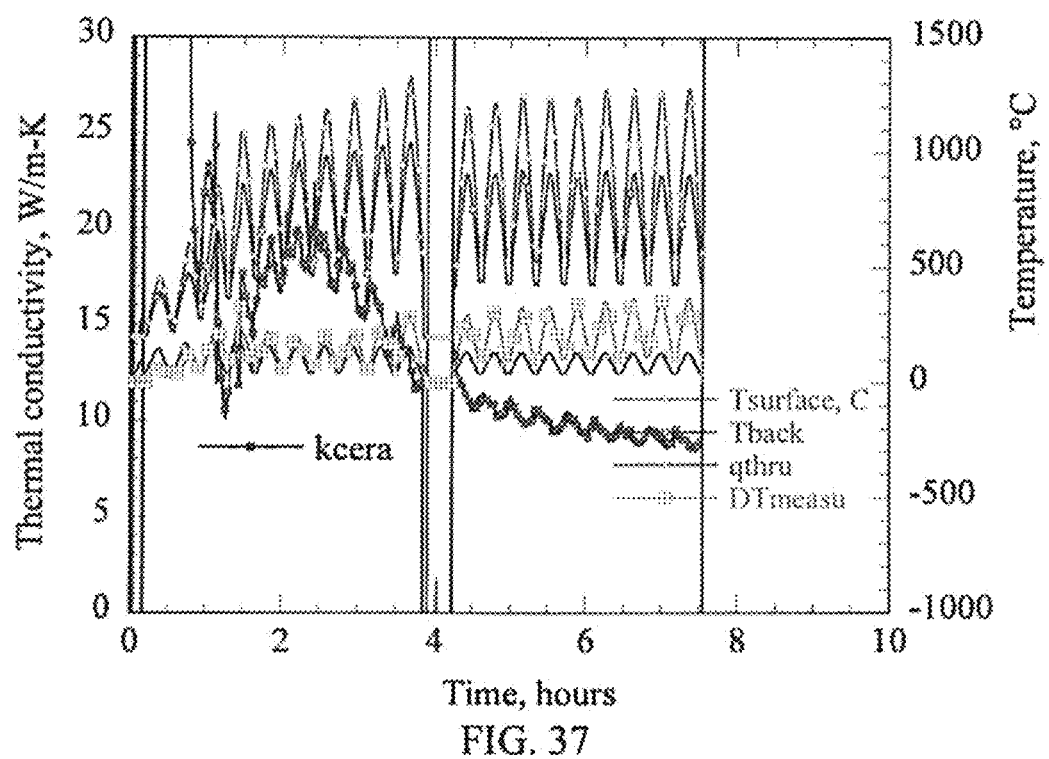
FIG. 37 is a graph illustrating thermal conductivity of Sample 1 over the course of 10 hours of the sample in accordance with an aspect of the innovation.
Figure 38:
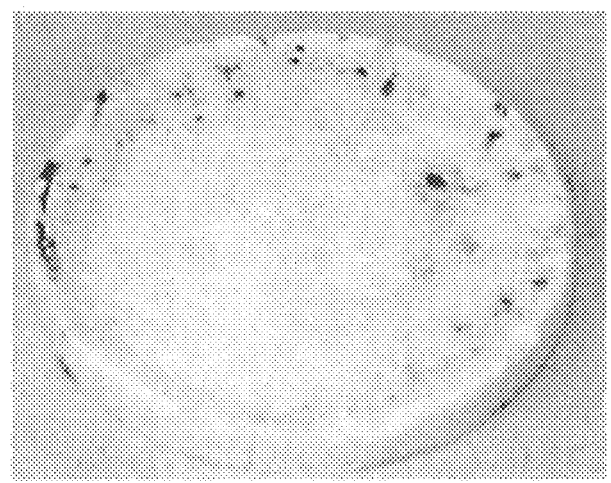
FIG. 38 is an illustration of Sample 1 after testing in accordance with an aspect of the innovation.

FIGS. 35-41 are test results of Sample 1 and Sample 2 created above. Referring to FIG. 35, Sample 1 underwent four laser thermal gradient cycles with 10 minute ramp cycles and 2 minute hold at the peak of each cycle. The maximum heat flux was 140 W/cm². The maximum temperature of the sample was 925° C. achieved in the fourth cycle and the maximum delta T ($T_{surface}-T_{back}$) was 185° C. also achieved in the fourth cycle. As shown in FIG. 36, the thermal conductivity of Sample 1 is approximately 17 W/m-K. Referring to FIG. 37, Sample 1 then underwent 19 laser thermal gradient cycles with 10 minute ramp cycles and a two minute hold at each peak. The maximum heat flux was 145 W/cm². The maximum temperature was 1320° C. and the maximum delta T (Tsurface–Tback) was 380° C. The thermal conductivity varied from approximately 18 to 8.7 W/m-K. After the thermal tests there was no visible cracking in the sample, as illustrated in FIG. 38.

Figure 39:
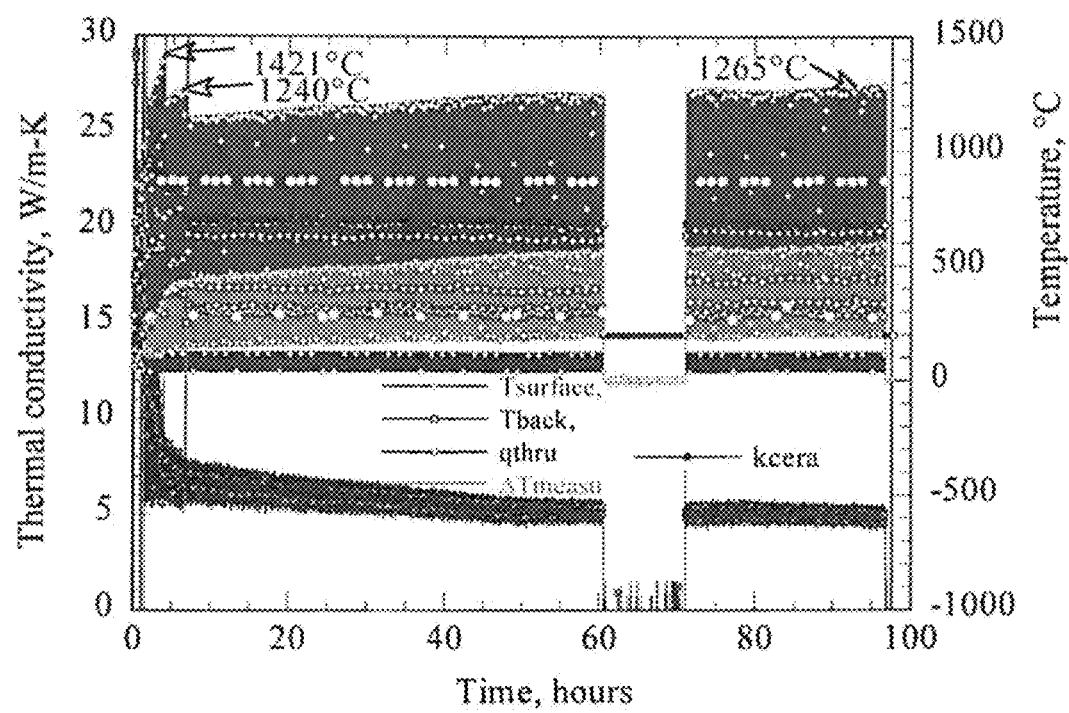
FIG. 39 is a temperature-time graph illustrating a temperature of the front and back surfaces of another sample (Sample 2) undergoing rapid thermal gradient cycles in accordance with an aspect of the innovation.
Figure 40:
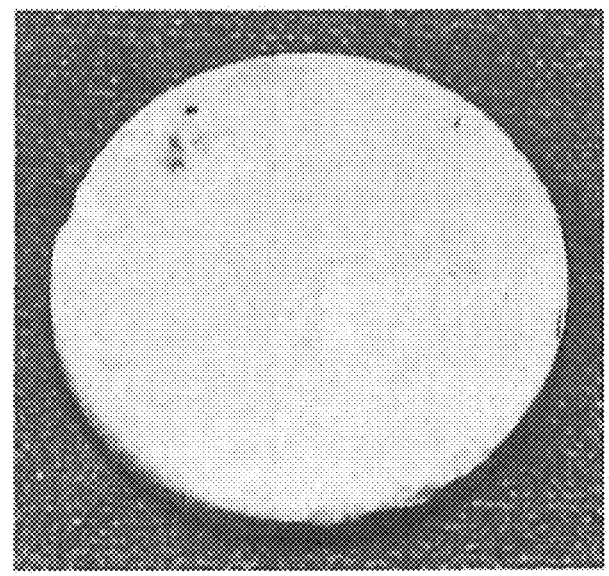
FIG. 40 is an illustration of Sample 2 after testing in accordance with an aspect of the innovation.
Figure 41:
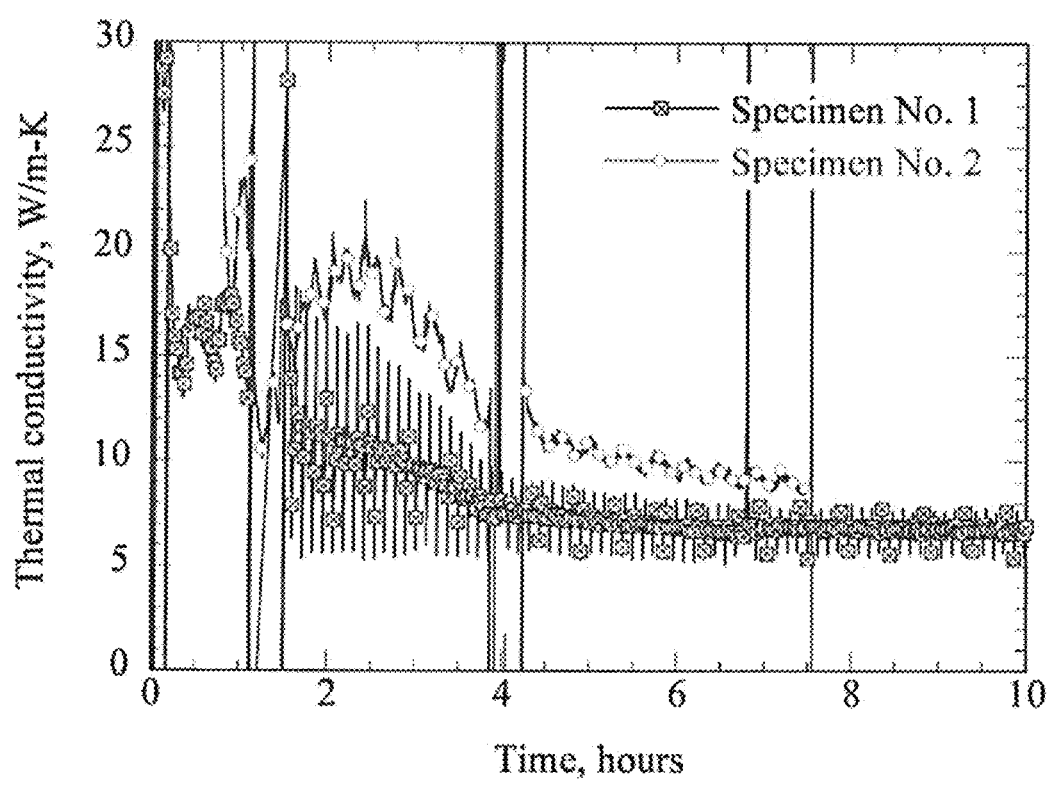
FIG. 41 is a thermal conductivity change comparison between Sample 1 and Sample 2 in accordance with an aspect of the innovation.

Referring to FIG. 39, sample 2 underwent 725 rapid thermal gradient test cycles with a five minute heat and a two minute cool cycle. The maximum surface temperature achieved was 1421° C. and the maximum surface heating rate was 17° C./s. The heat flux was 140 W/cm² and the maximum delta T was 600° C. The thermal conductivity changed from approximately 15 W/m-K to 4.8 W/m-K (at 1265° C.). As shown in FIG. 40 only some minor surface degradation occurred. FIG. 41 is a thermal conductivity change comparison between Sample 1 and Sample 2 that shows good reproducibility between the two samples.

As described above, hBN platelets were coated with aluminum oxide to form a an initial product in powder form which, if desired, may then be hot-pressed to successfully form an hBN/alumina composite. This composite demonstrated high resistance against thermal shock and is thermally stable at a temperature of as high as 1400° C. In an alternate embodiment, thermal shock resistance may be improved by exfoliating the hBN platelet first. Thus, the hBN in the composite could be thinner. In addition, if less water and/or less $AlCl_3$ is used, the alumina coating could be thinner.

In summary, thermal management is becoming an increasingly important topic as device sizes shrink and power and energy densities increase. As disclosed herein, to alleviate this problem, an innovative thermally conductive and electrically insulating composite comprised of hexagonal BN and alumina was made by a new process from hexagonal BN powder and hydrated aluminum chloride. Reactions between these two reactants produces a first product—a hexagonal BN (90 wt %)-aluminum oxide (10 wt %) powder mixture where every hexagonal BN particle is completely coated with amorphous aluminum oxide. The second product—a 1-inch-diameter, 2.4-mm-thick disk of hexagonal BN/alumina composite—was subsequently fabricated at 1950° C. by hot pressing the first product. Consolidation of this composite was accomplished much more easily than for hBN alone. The hexagonal BN/alumina composite exhibits very high thermal conductivities of 157 W/m·K in the in-plane direction and 14.4 W/m·K in the through-plane direction at room temperature.

This new product can potentially provide flexibility in thermal management design by dissipating heat and alleviating overheating of high-power devices such as motors, generators, computer servers, or lithium-ion batteries. In addition, the innovative composite may be used to protect spacecraft during re-entry, when the rapid temperature increase (thermal shock) of the spacecraft is unavoidable. Depending on the specific applications, additional property evaluation such as dielectric strength, mechanical strength and modulus, machinability and conformity into specific shapes are needed as well. Optimization of the fabrication parameters (e.g., reactant compositions, reaction temperature, and pressure) will be investigated further to advance the state of the art in thermal management.

What has been described above includes examples of the innovation. It is, of course, not possible to describe every conceivable combination of components or methodologies for purposes of describing the subject innovation, but one of ordinary skill in the art may recognize that many further combinations and permutations of the innovation are possible. Accordingly, the innovation is intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A method of creating a composite comprising:
   preparing a mixture of hexagonal boron nitride (hBN) and an aluminum chloride;
   heating the mixture in an inert environment; and
   producing a first product comprising hexagonal boron nitride coated with a compound coating containing aluminum, chlorine, and oxygen;
   heating the first product in air to a temperature that is higher than the temperature at which the mixture is heated; and
   producing a second product comprising a hexagonal boron nitride coated with aluminum oxide.

2. The method of claim 1, wherein the aluminum oxide coating has a thickness of about 5 nm to about 100 µm.

3. The method of claim 1, wherein the chloride is an aluminum chloride and prior to preparing the mixture of hexagonal boron nitride (hBN) and the aluminum chloride, the method further comprising hydrating the aluminum chloride by exposing it to ambient air.

4. The method of claim 1 wherein the temperature at which the product is heated in air is at least about 150° C.

5. The method of claim 1 further comprising:
   consolidating and hot pressing the second product; and
   producing an hBN-alumina composite.

6. The method of claim 5, wherein hot pressing takes place at a temperature greater than about 1700° C.

7. The method of claim 5, wherein hot pressing takes place under a pressure in a range of about 5-15 ksi.

8. The method of claim 5, wherein the second product is exfoliated prior to hot pressing.

9. A method of creating a composite comprising:
   preparing a mixture of hexagonal boron nitride (hBN) and hydrated aluminum chloride;
   heating the mixture in an inert environment to produce a first product comprising hexagonal boron nitride coated with a compound coating containing aluminum, chlorine, and oxygen;
   heating the first product in air to a temperature at or above an oxidation temperature of the compound coating to product a second product comprising hexagonal boron nitride coated with aluminum oxide;
   consolidating and hot pressing the second product at a temperature above a sintering temperature of the second product to produce an hBN-alumina composite.

10. The method of claim 9, wherein the hot pressing is done at a pressure in a range of about 5-15 ksi.

11. The method of claim 9, wherein the hydrated aluminum chloride comprises about 0.1-10% by weight water.

12. The method of claim 9, wherein the hot pressing is done at a temperature greater than about 1700° C.

13. The method of claim 9, wherein prior to consolidation and hot pressing, the second product is exfoliated.

14. The method of claim 13, wherein the second product is exfoliated by by rapid heating in air.

* * * * *